(12) United States Patent
Seshimo et al.

(10) Patent No.: US 9,442,371 B2
(45) Date of Patent: Sep. 13, 2016

(54) METHOD OF PRODUCING STRUCTURE CONTAINING PHASE-SEPARATED STRUCTURE, METHOD OF FORMING PATTERN AND METHOD OF FORMING FINE PATTERN

(71) Applicant: Tokyo Ohka Kogyo Co., Ltd., Kawasaki-shi (JP)

(72) Inventors: Takehiro Seshimo, Kawasaki (JP); Takaya Maehashi, Kawasaki (JP); Takahiro Dazai, Kawasaki (JP); Yoshiyuki Utsumi, Kawasaki (JP); Tasuku Matsumiya, Kawasaki (JP); Ken Miyagi, Kawasaki (JP); Daiju Shiono, Kawasaki (JP); Tsuyoshi Kurosawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/603,106

(22) Filed: Jan. 22, 2015

(65) Prior Publication Data
US 2015/0205207 A1   Jul. 23, 2015

(30) Foreign Application Priority Data
Jan. 23, 2014   (JP) ................................. 2014-010688

(51) Int. Cl.
*G03F 7/004* (2006.01)
*G03F 7/00* (2006.01)
(Continued)

(52) U.S. Cl.
CPC ......... *G03F 7/0002* (2013.01); *B81C 1/00031* (2013.01); *B82Y 40/00* (2013.01);
(Continued)

(58) Field of Classification Search
CPC ............ G03F 7/11; G03F 7/075; G03F 7/40; G03F 7/20; G03F 7/0752; G03F 7/168; G03F 7/36; G03F 7/38; G03F 7/0002; C09D 153/00; C09D 183/10; B82Y 40/00; B81C 1/00031; B81C 2201/149; B81C 2201/0198; B81C 1/00531; C08G 18/61; C08G 77/38
USPC ...... 430/270.1, 271.1, 273.1, 322, 330, 331; 427/261, 258
See application file for complete search history.

(56) References Cited

U.S. PATENT DOCUMENTS 7,964,107 B2*  6/2011 Millward ............ B81C 1/00031
                                                          216/17
8,114,573 B2*  2/2012 Sandhu ............... H01L 21/0332
                                                          430/270.1
(Continued)

FOREIGN PATENT DOCUMENTS

JP   A-2007-072374     3/2007
JP   A-2007-329276    12/2007
(Continued)

OTHER PUBLICATIONS

Hinsberg et al., "Self-Assembling Materials for Lithographic Patterning: Overview, Status and Moving Forward," Proceedings of SPIE, vol. 7637, 76730G-1 (2010).

*Primary Examiner* — Amanda C Walke
(74) *Attorney, Agent, or Firm* — Knobbe Martens Olson & Bear LLP

(57) ABSTRACT

A method of producing a structure containing a phase-separated structure, including a step in which a layer including an Si-containing block copolymer having a plurality of blocks bonded is formed between guide patterns on a substrate; a step in which a solution of a top coat material is applied to the layer and the guide patterns so as to form a top coat film; and a step in which the layer including the Si-containing block copolymer and having the top coat film formed thereon is subjected to annealing treatment so as to conduct a phase separation of the layer; in which a solvent of the solution of the top coat material contains no basic substance.

17 Claims, 2 Drawing Sheets

(51) Int. Cl.
   *G03F 7/11*   (2006.01)
   *G03F 7/20*   (2006.01)
   *G03F 7/16*   (2006.01)
   *G03F 7/36*   (2006.01)
   *G03F 7/38*   (2006.01)
   *C09D 153/00* (2006.01)
   *C09D 183/10* (2006.01)
   *B82Y 40/00*  (2011.01)
   *B81C 1/00*   (2006.01)
   *C08G 18/61*  (2006.01)
   *G03F 7/075*  (2006.01)

(52) U.S. Cl.
   CPC ........... *C08G 18/61* (2013.01); *C09D 153/00* (2013.01); *C09D 183/10* (2013.01); *G03F 7/11* (2013.01); *G03F 7/168* (2013.01); *G03F 7/20* (2013.01); *G03F 7/36* (2013.01); *G03F 7/38* (2013.01); *B81C 2201/0149* (2013.01); *G03F 7/0752* (2013.01)

(56) References Cited

U.S. PATENT DOCUMENTS

| | | | | |
|---|---|---|---|---|
| 8,263,323 | B2* | 9/2012 | Yoon | B81C 1/00031 430/324 |
| 8,287,957 | B2* | 10/2012 | Nealey | B81C 1/00031 427/256 |
| 9,169,421 | B2* | 10/2015 | Matsumiya | C09D 153/00 |
| 2005/0272865 | A1* | 12/2005 | Taniguchi | C08F 293/00 525/71 |
| 2007/0142560 | A1* | 6/2007 | Song | A61L 27/16 525/242 |
| 2009/0189317 | A1 | 7/2009 | Sato et al. | |
| 2009/0197204 | A1 | 8/2009 | Shiono et al. | |
| 2009/0263631 | A1 | 10/2009 | Sakamoto et al. | |
| 2009/0317743 | A1 | 12/2009 | Shiono et al. | |
| 2010/0310985 | A1 | 12/2010 | Mori et al. | |
| 2011/0117499 | A1 | 5/2011 | Matsumiya et al. | |
| 2011/0147984 | A1* | 6/2011 | Cheng | B82Y 10/00 264/220 |
| 2013/0022785 | A1* | 1/2013 | Ellison | B82Y 40/00 428/141 |
| 2013/0196019 | A1* | 8/2013 | Willson | G03F 7/0758 425/470 |
| 2013/0344242 | A1* | 12/2013 | Willson | B81C 1/00031 427/240 |
| 2015/0376455 | A1* | 12/2015 | Montarnal | H01L 21/31144 216/49 |

FOREIGN PATENT DOCUMENTS

| | | |
|---|---|---|
| JP | A-2008-036491 | 2/2008 |
| JP | A-2008-246876 | 10/2008 |
| JP | A-2009-025723 | 2/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |

* cited by examiner

METHOD OF PRODUCING STRUCTURE CONTAINING PHASE-SEPARATED STRUCTURE, METHOD OF FORMING PATTERN AND METHOD OF FORMING FINE PATTERN

The present invention relates to a method of producing a structure containing a phase-separated structure, a method of forming a pattern and a method of forming a fine pattern.

The present application claims priority under 35 U.S.C. §119(a)-(d) to Japanese Patent Application No. 2014-010688, filed Jan. 23, 2014, the content of which is incorporated herein by reference.

BACKGROUND ART

Recently, as further miniaturization of large scale integrated circuits (LSI) proceeds, a technology for processing a more delicate structure is demanded. In response to such demand, an attempt has already been started in which a fine pattern is formed using a phase-separated structure formed by self-assembly of a block copolymer having mutually incompatible blocks bonded together (see for example, Patent Document 1).

For using a phase separation structure of a block copolymer, it is necessary to form a self-assembly nano structure through a microphase separation only in desired regions, and arrange the nano structure in a desired direction. To achieve a desired structure having desired position and orientation, graphoepitaxy to achieve desired phase-separated pattern by a guide pattern and chemical epitaxy to achieve desired phase-separated pattern by difference in the chemical state of the substrate are proposed (see, for example, Non-Patent Document 1).

For realizing position control and orientational control, in the formation of a guide pattern, a resist material containing a base component such as a resin is used. The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

When forming a guide pattern used to form a fine pattern formed by self-assembly in a block copolymer, the use of a negative-tone developing process is proposed. The negative-tone development process is a process in which a positive type, chemically amplified resist composition is used in combination with a developing solution containing an organic solvent (hereafter, frequently referred to as "organic developing solution") (hereafter, a process using an organic developing solution is referred to as "solvent developing process" or "solvent developing negative process"). Generally, a positive type, chemically amplified resist composition exhibits increased solubility in an alkali developing solution upon exposure, but comparatively, the solubility in an organic solvent is decreased. Therefore, in a solvent developing negative process, the unexposed portions of the resist film are dissolved and removed by an organic developing solution to form a resist pattern (see, for example, Patent Document 2).

DOCUMENTS OF RELATED ART

Patent Document

[Patent Document 1] Japanese Unexamined Patent Application, First Publication No. 2008-36491

[Patent Document 2] Japanese Unexamined Patent Application, First Publication No. 2009-025723

Non-Patent Documents

[Non-Patent Document 1] Proceedings of SPIE (U.S.), vol. 7637, pp. 76370G-1 (2010)

SUMMARY OF THE INVENTION

In the case of using a guide pattern, when a block copolymer solution or a top coat solution is applied to the guide pattern, the guide pattern is likely to be damaged.

The present invention takes the above circumstances into consideration, with an object of providing a method of forming a structure containing a phase-separated structure, by which a guide pattern is less likely to be damaged.

The first aspect of the present invention is a method of producing a structure containing a phase-separated structure, including a step in which a layer including an Si-containing block copolymer having a plurality of blocks bonded is formed between guide patterns on a substrate; a step in which a solution of a top coat material is applied to the layer and the guide patterns so as to form a top coat film; and a step in which the layer including the Si-containing block copolymer having the top coat film formed thereon is subjected to annealing treatment so as to conduct a phase separation of the layer; wherein a solvent of the solution of the top coat material contains no basic substance.

In the first aspect, it is preferable that the method further includes a step in which a neutralization film is formed on the substrate before the guide pattern is formed. In the first aspect, it is preferable that the neutralization film contains no cross-linking polymer unit.

A second aspect of the present invention is a method of forming a pattern, including: a step in which a phase containing at least one block is selectively removed from a structure containing a phase-separated structure to form a pattern, the structure is produced by a method of the first aspect of the present invention.

A third aspect of the present invention is a method of forming a fine pattern, including: a step in which a substrate is subjected to etching treatment using a pattern as a mask, the pattern is formed by the method of forming a pattern according to the second aspect.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid having a substituent other than a hydroxy group and a carboxy group bonded to the benzene ring with or without a substituent for substituting the hydrogen atom on the α-position. Here, the α-position (carbon atom on the α-position) refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

The term "styrene derivative" includes styrene which has a substituent other than a hydroxyl group or carboxy group bonded to the benzene ring of styrene which may have a hydrogen atom substituted with a substituent at the α-position, provided that the aforementioned hydroxystyrene derivative and vinylbenzoic acid derivative are excluded from the definition of the styrene derivative.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

According to the preset invention, there is provided a method of producing a phase-separated structure, by which a guide pattern is less likely to be damaged.

MODE FOR CARRYING OUT THE INVENTION

Method of Producing Structure Containing Phase-Separated Structure

The first aspect of the present invention is a method of producing a structure containing a phase-separated structure, including a step in which a layer including an Si-containing block copolymer having a plurality of blocks bonded is formed between guide patterns on a substrate; a step in which a solution of a top coat material is applied to the layer and the guide patterns so as to form a top coat film; and a step in which the layer including the Si-containing block copolymer having the top coat film formed thereon is subjected to annealing treatment so as to conduct a phase separation of the layer; wherein a solvent of the solution of the top coat material contains no basic substance.

Figure 1:
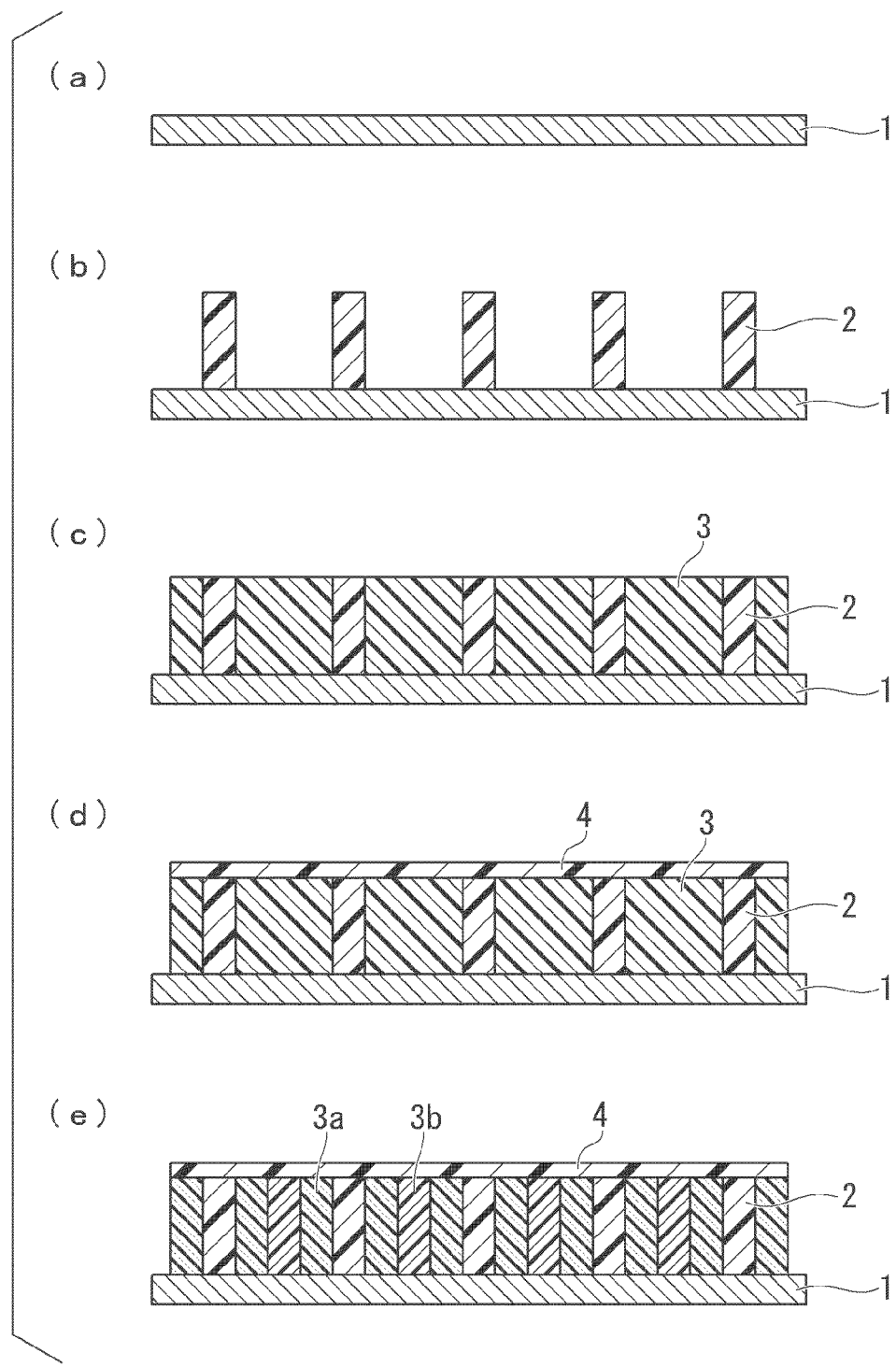
FIG. 1 is a schematic diagram showing an example of one embodiment of the method of producing a structure containing a phase-separated structure according to the present invention.

FIG. 1 shows an example of one embodiment of the method of producing a structure containing a phase-separated structure.

A method of producing a structure containing a phase-separated structure according to this aspect of the present invention will be explained with reference to the drawings. However, the present invention is not limited to these embodiments.

[Step in which a Layer Including an Si-Containing Block Copolymer Having a Plurality of Blocks Bonded is Formed Between Guide Patterns on a Substrate]

The present invention includes a step in which a layer including an Si-containing block copolymer having a plurality of blocks bonded is formed between guide patterns on a substrate.

In the present invention, the guide pattern may be formed by forming a photosensitive resin film on a substrate, exposing the obtained film, and developing. As shown in FIG. 1(b), the guide pattern 2 may be formed on a substrate 1.

<Substrate>

The substrate 1 is set (FIG. 1(a)).

The substrate 1 is not particularly limited, as long as a solution containing a photosensitive resin or a block copolymer can be applied to the surface of the substrate. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate 1 used in the present invention is not particularly limited. The substrate 1 does not necessarily have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate 1, an inorganic and/or organic film may be provided. As the inorganic film, an inorganic anti-reflection film (inorganic BARC) can be used. As the organic film, an organic anti-reflection film (organic BARC) can be used.

Figure 2:
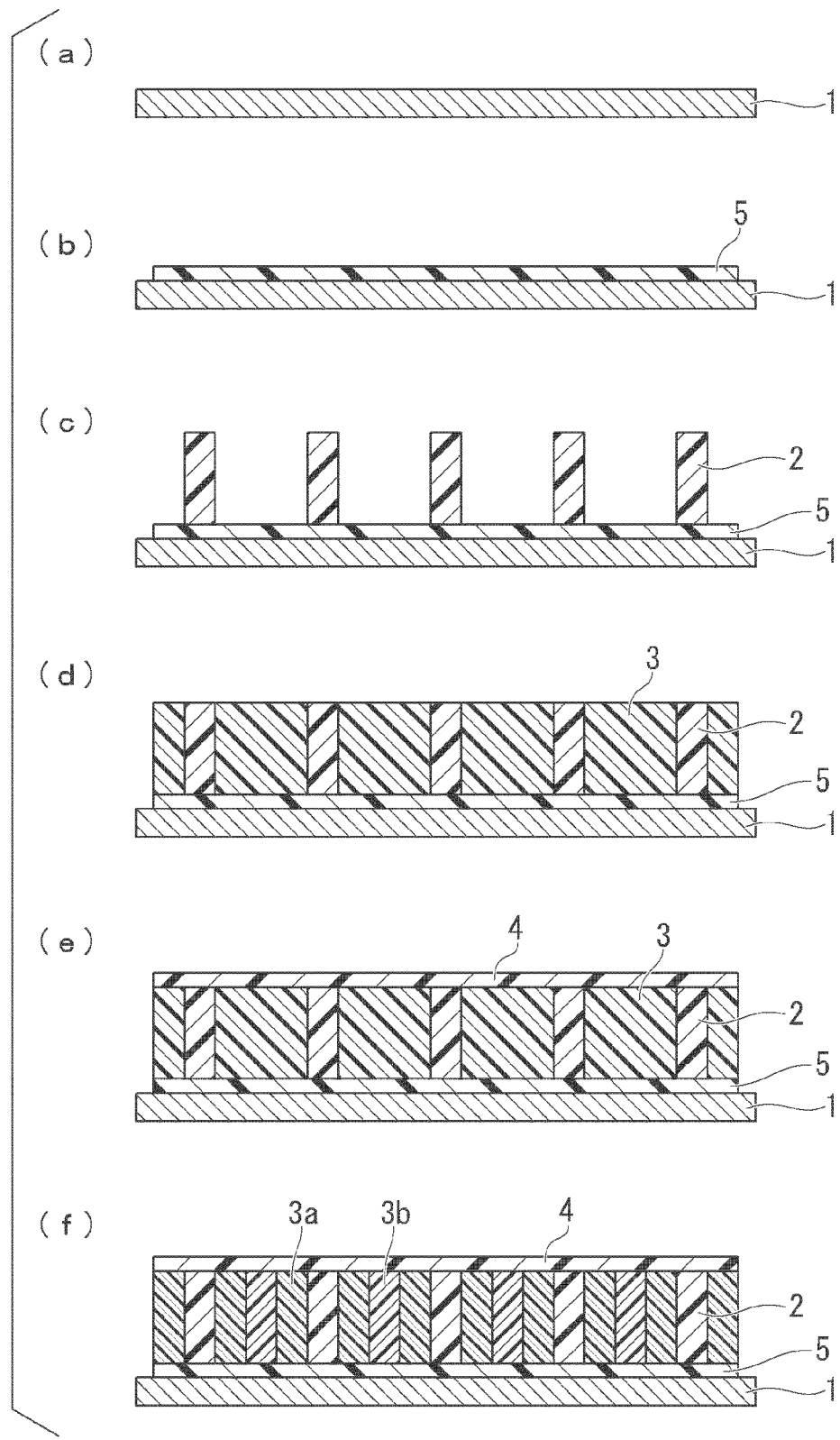
FIG. 2 is a schematic diagram showing an example of one embodiment of the method of forming a pattern according to the present invention.

When a neutralization film 5 (FIG. 2(b)) is formed on the substrate 1, the surface of the substrate may be washed. By washing the surface of the substrate, the later [neutralization film forming step] may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Photosensitive Resin Film>

Firstly, a photosensitive resin composition described later is applied to a substrate 1 using a spinner or the like, and a bake treatment (post applied bake (PAB)) is conducted at a temperature of 80 to 150° C. for 40 to 120 seconds, preferably 60 to 90 seconds, to form a photosensitive resin film.

Following selective exposure of the thus formed photosensitive resin film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the photosensitive resist film was subjected to developing treatment to form a guide pattern 2. The developing treatment of the photosensitive resin film will be described later.

<Step in which a Layer Including an Si-Containing Block Copolymer Having a Plurality of Blocks Bonded is Formed>

The present invention includes a step in which a layer including an Si-containing block copolymer having a plurality of blocks bonded is formed between guide patterns on a substrate.

As shown in FIG. 1(b), after a guide pattern 2 is formed on a substrate 1, a layer 3 including an Si-containing block copolymer having a plurality of blocks bonded may be formed between guide patterns 2.

<Block Copolymer>

Block Copolymer

In the present invention, a block copolymer is a polymeric material containing an Si-containing block, in which plurality of constituent parts (i.e., block) in which only the structural units of the same type have been bonded, are bonded. As the blocks constituting the block copolymer, 2 types of blocks may be used, or 3 or more types of blocks may be used. In the present invention, the plurality of blocks constituting the block copolymer is not particularly limited, as long as they are combinations capable of causing phase separation. However, it is preferable to use a combination of an Si-containing block and a non-Si-containing block, and it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks. As a combination of the blocks such that a phase of block can be easily subjected to selective removal, a block copolymer (in which one or more blocks have been mutually bonded) that has an etching selection ratio of 1 or more can be mentioned.

In the present invention, a "period of a block copolymer" refers to a period of a phase structure observed when a phase-separated structure is formed, and is a sum of the lengths of the phases which are mutually incompatible. The period of a block copolymer corresponds to the length of one molecule of the block copolymer.

The period of a block polymer is determined by intrinsic polymerization properties such as the polymerization degree N and the Flory-Huggins interaction parameter $\chi$. Specifically, the repulsive interaction between different blocks of the block copolymer becomes larger as the "$\chi N$" becomes larger. Therefore, when $\chi N > 10$ (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different block. Therefore, by adjusting the composition and the total molecular weight of the block copolymer to be used, the period of the block copolymer can be easily adjusted.

[Si-Containing Block]

An Si-containing block is not particularly limited as long as the block contains a structural unit containing an Si atom. For example, a block of a structural unit represented by general formula (a00-1) or (a00-2) shown below, a block of a structural unit of a siloxane or a derivative thereof or a block of a structural unit containing a polyhedral oligomeric silsesquioxane (POSS) can be mentioned.

[Chemical Formula 1]

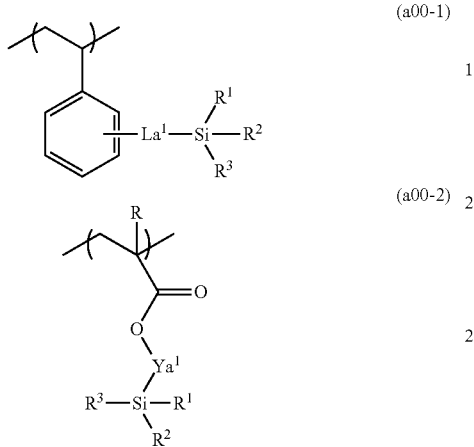

In the formulae (a00-1) and (a00-2), $La^1$ represents a single bond or a divalent linking group which may have a hetero atom; $R^1$, $R^2$ and $R^3$ each independently represents a hydrogen atom or an alkyl group of 1 to 5 carbon atoms; R represents an hydrogen atom, an alkyl group of 1 to 5 carbon atoms or a halogenated alkyl group of 1 to 5 carbon atoms; and $Ya^1$ represents a single bond or a divalent linking group.

In the formula (a00-1), $La^1$ represents a single bond or a divalent linking group with or without a fluorine atom. As examples of the divalent linking group which may have a hetero atom for $La^1$, the same groups as divalent linking groups for $Ya^{21}$ in general formula (a2-1) described later can be mentioned. In $La^1$, as the hetero atom, an oxygen atom is preferred. In the present invention, it is preferable that $La^1$ represents an ester bond [—C(=O)—O—], an ether bond (—O—), a linear or branched alkylene group, a combination of these or a single bond.

In the formulae (a00-1) and (a00-2), $R^1$, $R^2$ and $R^3$ each independently represents a hydrogen atom or an alkyl group of 1 to 5 carbon atoms. Specific examples include a methyl group, an ethyl group, a propyl group, an isopropyl group, an n-butyl group, an isobutyl group, a tert-butyl group, a pentyl group, an isopentyl group, and a neopentyl group. In the present invention, each of $R^1$, $R^2$ and $R^3$ is preferably a methyl group.

In general formula (a00-2), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a00-2), $Ya^1$ represents a single bond or a divalent linking group. As examples of the divalent linking group, the same groups as divalent linking groups for $Ya^{21}$ in formula (a2-1) described later can be given.

Specific examples of the structural unit represented by formula (a00-1) or (a00-2) are shown below.

[Chemical Formula 2]

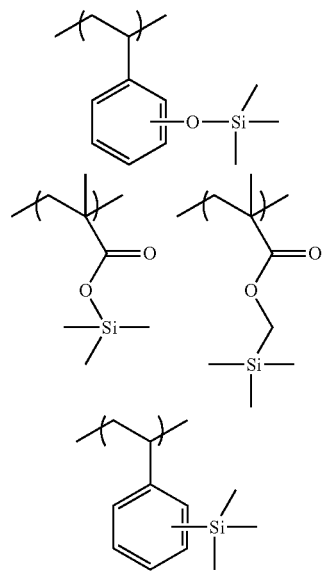

Examples of the block copolymers include a block copolymer in which a block of a structural unit containing an aromatic group has been bonded to a block of a structural unit containing Si; a block copolymer in which a block of a structural unit derived from (α-substituted) acrylate ester has been bonded to a block of a structural unit containing Si; a block copolymer in which a block of a structural unit derived from (α-substituted) acrylic acid has been bonded to a block of a structural unit containing Si; a block copolymer in which a block of a structural unit containing Si has been bonded to a block of a structural unit derived from polyethylene oxide; a block copolymer in which a block of a structural unit containing Si has been bonded to a block of a structural unit derived from polypropylene oxide; a block copolymer in which a block of a structural unit containing Si has been bonded to a block of a structural unit derived from polylactate; a block copolymer in which a block of a structural unit containing an aromatic group has been bonded to a block of a structural unit derived from siloxane or a derivative thereof; a block copolymer in which a block of a structural unit containing a polyhedral oligomeric silsesquioxane structure has been bonded to a block of a structural unit derived from (α-substituted) acrylate ester; a block copolymer in which a block of a structural unit containing a polyhedral oligomeric silsesquioxane structure has been bonded to a block of a structural unit derived from (α-substituted) acrylic acid; and a block copolymer in which a block of a structural unit containing a polyhedral oligomeric silsesquioxane structure has been bonded to a block of a structural unit derived from siloxane or a derivative thereof.

In the present invention, the block copolymer preferably contains a structural unit having an aromatic group and a structural unit having an Si atom.

As the structural unit having an aromatic group, a structural unit having an aromatic group such as a phenyl group or an naphthyl group can be mentioned. In the present invention, a structural unit derived from a styrene or a derivative thereof is preferably used.

Examples of the styrene or the derivative thereof include styrene, α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine.

The (α-substituted) acrylic acid is a generic term that includes either or both of acrylic acid having a hydrogen atom bonded to the α-position and acrylic acid in which a hydrogen atom bonded to the α-position has been substituted with a substituent. As an example of such a substituent, an alkyl group of 1 to 5 carbon atoms can be given.

An example of an (α-substituted) acrylic acid includes acrylic acid and methacrylic acid.

The (α-substituted) acrylate ester is a generic term that includes either or both of acrylate ester having a hydrogen atom bonded to the α-position and acrylate ester in which a hydrogen atom bonded to the α-position has been substituted with a substituent. As an example of such a substituent, an alkyl group of 1 to 5 carbon atoms can be given.

Specific examples of the (α-substituted) acrylate ester include acrylate ester such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethyl acrylate and trimethoxysilylpropyl acrylate; and methacrylate ester such as methyl methacrylate, ethyl methacrylate, propyl methacrylate, n-butyl methacrylate t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethyl methacrylate and trimethoxysilylpropyl methacrylate.

Among these, methyl acrylate, ethyl acrylate, t-butyl acrylate, methyl methacrylate, ethyl methacrylate and t-butyl acrylate are preferable.

Examples of the siloxane and the derivative thereof include dimethylsiloxane, dimethylsiloxane, diphenylsiloxane, and methylphenylsiloxane.

Examples of the alkylene oxide include ethylene oxide, propylene oxide, isopropylene oxide and butylene oxide.

As a structural unit containing a polyhedral oligomeric silsesquioxane (POSS), a structural unit represented by general formula (a0-1) shown below.

[Chemical Formula 3]

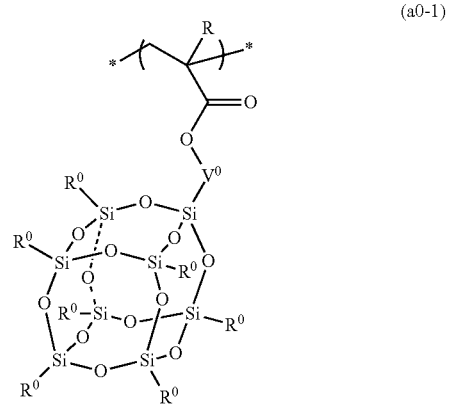

(a0-1)

In the formula, R represents a hydrogen atom, an alkyl group of 1 to 5 carbon atoms or a halogenated alkyl group of 1 to 5 carbon atoms; and $V^0$ represents a divalent hydrocarbon group with or without a substituent; and $R^0$ represents a monovalent hydrocarbon group with or without a substituent, wherein the plurality of $R^0$ may be the same or different from each other.

In general formula (a1-0), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-1), the monovalent hydrocarbon group for $R^0$ preferably has 1 to 20 carbon atoms, more preferably 1 to 10, and still more preferably 1 to 8. Here, the number of carbon atoms within a substituent(s) described later is not included in the number of carbon atoms of the monovalent hydrocarbon group.

The monovalent hydrocarbon group for $R^0$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, and a methyl group, an ethyl group or an isobutyl group is preferable, an ethyl group or an isobutyl group is more preferable, and an ethyl group is particularly preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

When the monovalent hydrocarbon group for $R^o$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group.

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the aforementioned formula (a0-1), the divalent hydrocarbon group for $V^o$ may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for $V^o$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$]—.

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom has been removed from the aforementioned aromatic hydrocarbon ring or aromatic hetero ring and one hydrogen atom thereof has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group).

The alkylene group which is bonded to the aforementioned aryl group or heteroaryl group preferably has 1 to 4 carbon atoms, more preferably 1 or 2 carbon atoms, and particularly preferably 1 carbon atom.

Specific examples of structural units represented by the general formula (a0-1) are shown below. In the formulas shown below, $R^\alpha$ represents a hydrogen atom, a methyl group or a trifluoromethyl group.

[Chemical Formula 4]

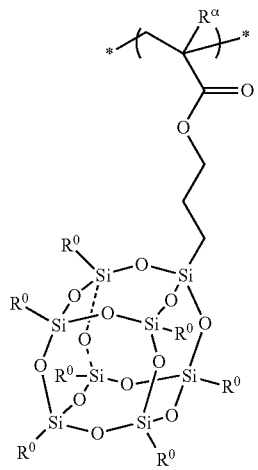

$R^0$ = Ethyl group or isobutyl group

In the present invention, the molar ratio of the structural unit containing an aromatic group and the structural unit containing an Si atom is preferably 60:40 to 90:10, and more preferably 65:35 to 80:20.

When the ratio of the structural unit containing an aromatic group and the structural unit containing an Si atom is within the above-mentioned range, a cylinder phase-separated structure arranged in a perpendicular direction of the surface of the substrate can be obtained.

As such a block copolymer, a block copolymer containing a block of styrene and a Si-containing block, a block copolymer containing a block of a structural unit containing a polyhedral oligomeric silsesquioxane (POSS) and a block of acrylic acid, and a block copolymer containing a block of a structural unit containing a polyhedral oligomeric silsesquioxane (POSS) and a block of methyl acrylate.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The polydispersity (Mw/Mn) of the block copolymer is preferably 1.0 to 3.0, more preferably 1.0 to 1.5, and still more preferably 1.0 to 1.3. Here, Mn is the number average molecular weight.

If desired, other miscible additives can also be added to the composition containing a block copolymer. Examples of such miscible additives include additive resins for improving the performance of the layer composed of the neutralization film, surfactants for improving the applicability, dissolution inhibitors, plasticizers, stabilizers, colorants, halation prevention agents, dyes, sensitizers, base amplifiers and basic compound.

Organic Solvent

The composition containing a block copolymer can be prepared by dissolving the aforementioned block copolymer in an organic solvent. The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent in the component containing a block copolymer, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

There are no particular limitations on the amount used of the organic solvent in the composition containing the block copolymer, which may be adjusted appropriately to produce a concentration that enables application of the solution in accordance with the desired thickness of the formed film. In general, the organic solvent is used in an amount that yields a solid content of the block copolymer that is within a range from 0.2 to 70% by weight, and preferably from 0.2 to 50% by weight.

Hereafter, among the blocks constituting the block copolymer, a block which is not selectively removed is referred to as "block $P_A$ (3a in FIG. 1), and a block to be selectively removed is referred to as "block $P_B$ (3b in FIG. 1). For example, after the phase separation of a layer containing a PS—Si-containing block copolymer, by subjecting the layer to an oxygen plasma treatment or a hydrogen plasma treatment, the phase of Si-containing block is selectively removed. In such a case, PS is the block $P_A$ and Si-containing block is the block $P_B$.

In the present invention, the shape and size of the phase to be selectively removed (i.e., the phase of block $P_B$) is determined by the volume fraction of the respective blocks constituting the block copolymer and the molecular weight of the block copolymer. For example, by making the volume fraction of the block $P_B$ within the block copolymer relatively small, a cylinder structure in which the phase of the block $P_B$ polymer is present within the phase of the block $P_A$ in the form of a cylinder can be formed. On the other hand, by making the volume fraction of the block $P_B$ within the block copolymer about the same as that of the block $P_A$, a lamellar structure in which the phase of the block $P_A$ and the phase of the block $P_B$ are alternately laminated can be formed. Further, by increasing the molecular weight of the block copolymer, the size of each phase can be increased.

[Step in which a Top Coat Material is Applied to the Layer and the Guide Patterns so as to Form a Top Coat Film]

In the present invention, after the [Step in which a layer including an Si-containing block copolymer having a plurality of blocks bonded is formed between guide patterns on a substrate], a step in which a top coat material is applied to the guide pattern and the layer including an Si-containing block copolymer having a plurality of blocks bonded so as to form a top coat film (hereinafter, sometimes referred to as "top coat film forming step").

In the top coat film forming step, as shown in FIG. 1(d), a top coat material is applied to the guide pattern 2 and the layer 3 including an Si-containing block copolymer having a plurality of blocks bonded so as to form a top coat film 4.

In the top coat film forming step, a top coat material that exhibits changed polarity by heating or the like and controls the surface energy of the layer containing a block copolymer is applied to the layer to form a top coat film.

By forming a top coat film 4 using the top coat material on the layer 3 containing a block copolymer, the surface condition of the layer can be controlled, and phase separation can be stably conducted.

In the present invention, the formation of top coat film 4 can be conducted by applying the top coat material to the layer 3 containing a block copolymer using a spinner or the like. After the application, bake treatment may be conducted. The heat temperature is preferably 80 to 280° C., and the heating time is preferably 10 to 600 seconds.

The thickness of the top coat film 4 formed on the layer 3 is preferably 2 to 500 nm, more preferably 5 to 200 nm, and still more preferably 10 to 100 nm. By ensuring that the thickness of the topcoat film 4 is within the aforementioned range, it is possible to block the adverse effect from the external environment satisfactorily, and phase separation is likely to be proceeded.

As the topcoat material, the topcoat material described later can be applied. In the present invention, as described later, a solvent in the top coat material does not contain a basic substance.

[Phase Separation Step]

In the phase separation step, the layer 3 including the Si-containing block copolymer having the top coat film 4 formed thereon is subjected to heat annealing treatment so as to conduct a phase separation of the layer (FIG. 1(e)).

In the heat annealing treatment, the substrate having the layer containing the block copolymer formed thereon is subjected to a heat treatment. The heat treatment is preferably conducted at a temperature at least as high as the glass transition temperature of the block copolymer used and lower than the heat decomposition temperature. In the present embodiment, the heat temperature is preferably 100 to 300° C., and more preferably 120 to 280° C. The eating time is preferably 0.5 to 1440 minutes, and more preferably 1 to 600 minutes. Further, the heat treatment is preferably conducted in a low-reactive gas such as nitrogen.

The layer containing a block copolymer is subjected to a heat annealing treatment, so as to cause a phase separation of the layer containing a block copolymer ($3a$ and $3b$ in FIG. $1(e)$). As a result, a structure having a phase-separated structure formed on the surface of the substrate (preferably a lamellar phase-separated structure or a cylinder phase-separated structure arranged in a perpendicular direction of the surface of the substrate) can be provided.

[Neutralization Film Forming Step]

In the present invention, it is preferable that, before the [Step in which a layer including an Si-containing block copolymer having a plurality of blocks bonded is formed between guide patterns on a substrate], a [neutralization film forming step] in which a neutralization film 5 containing a surface treatment agent is formed on a substrate (i.e., a substrate is subjected to neutralization treatment) is employed (FIG. $2(b)$).

A neutralization treatment is a treatment in which the surface of the substrate is modified so as to have affinity for any blocks constituting the block copolymer. By the neutralization treatment, it becomes possible to prevent only phases of specific blocks to come into contact with the surface of the substrate by phase separation. In view this point, in order to form a phase-separated structure (preferably a lamellar phase-separated structure or a cylinder phase-separated structure arranged in a perpendicular direction of the surface of the substrate) on the surface of a substrate by a phase separation, it is preferable that a neutralization film depending on the type of the block copolymer used is formed on the surface of the substrate, before a layer containing the block copolymer is formed.

Specifically, a thin film (neutralization film 5) which has affinity for any blocks constituting the block copolymer and contains a surface treatment agent is formed on the surface of a substrate 1. The neutralization film 5 may be formed by applying a surface treatment agent on a substrate.

Before a neutralization film 5 is formed on a substrate 1, the surface of the substrate 1 may be washed. By washing the surface of the substrate 1, the formation of a neutralization film 5 may be satisfactorily performed.

As the washing method, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying.

The neutralization film 5 may be formed using a resin composition as a surface treatment agent.

The resin composition can be appropriately selected from conventional resin compositions used for forming a thin film, depending on the type of blocks constituting the block copolymer.

The resin composition used as the surface treatment agent may be a heat-polymerizable resin composition, or a photosensitive resin composition such as a positive resist composition or a negative resist composition. Furthermore, a compound may be used as a surface treatment agent, and a non-polymerized film formed by applying the compound may be used as a neutralization film. For example, a siloxane organic monomolecular film formed from phenethyltrichlorosilane, octadecyltrichlorosilane or hexamethyldisilazane as a surface treatment agent may be preferably used as a neutralization film.

As such a surface treatment agent, a resin composition that contains the same structural units as those of blocks constituting a block copolymer, a resin composition that contains a structural unit having high affinity for the structural unit of block constituting a block copolymer, and a resin composition that has approximate average polarity of the all blocks constituting a block copolymer can be mentioned.

When a block copolymer containing a block of styrene as well as a block of the structural unit (a00-1) or (a00-2) is used, a resin component that contains a resin having a methyl methacrylate as a structural unit, or a compound or composition that has portion having high affinity for styrene structure and portion having high affinity for the structural unit (a00-1) or (a00-2) is preferably used as a surface treatment agent.

As the portion having high affinity for methyl methacrylate, a monomer having a functional group with high polarity such as a monomer having a trimethoxysilyl group, a trichlorosilyl group, a carboxy group, a hydroxy group, a cyano group or a hydroxyalkyl group in which part of the hydrogen atoms of the alkyl group has been substituted with a hydroxy group can be mentioned.

In the present invention, it is preferable that the neutralization film contains no cross-linking polymer unit.

The method of producing a structure containing a phase-separated structure contains a step in which a guide pattern is formed using a photosensitive resin film. When a step in which a neutralization film is formed is employed before the step in which a guide pattern is formed, the neutralization film is preferably a thin film in order to form a guide pattern easily, and to prevent pattern collapse of the guide pattern.

The inventors have found that, when the neutralization film does not contains a cross-linking polymer unit, the thickness of the neutralization film can be reduced.

The cross-linking polymer unit is not particularly limited, as long as the unit has a cross-linking property, and examples thereof include a unit derived from a monomer having an epoxy group, an oxethane group, an ethylenic unsubstituted group or a radical polymerizable group.

In the present invention, it is preferable that the neutralization film does not contain a cross-linking polymer unit but contains a structural unit (II) having a substrate interaction group.

{Substrate Interaction Group}

When the undercoat agent includes a structural unit (II) containing a substrate interaction group, the undercoat agent interacts with the substrate, thereby forming a strong film (a layer composed of the undercoat agent) on the substrate, and as a result, the layer containing the block copolymer can undergo favorable phase separation on the layer composed of the undercoat agent.

In the present invention, the "substrate interaction group" describes a group that can interact chemically or physically with the substrate, and this group can be selected appropriately in accordance with the type of substrate being used. Examples of the types of interaction between the substrate and the substrate interaction group include covalent bonding interactions, ionic bonding interactions, hydrogen bonding interactions, electrostatic interactions, hydrophobic interactions, and van der Waals force interactions.

Specific examples of such substrate interaction groups include a carboxy group, a hydroxy group, a cyano group, an azide group, an amino group, a trialkoxysilyl group, a dialkoxysilyl group, and a mono-alkoxysilyl group and the like. Among these, a carboxy group, a hydroxy group, a cyano group, an amino group or a trialkoxysilyl group is preferable. As the alkoxy group in the trialkoxysilyl group, a methoxy group or an ethoxy group is preferable, and a methoxy group is particularly preferable.

In the present invention, as the substrate interaction group, a lactone-containing cyclic group and a group represented by any one of formulae (ba0-3-1'-r1) and (ba0-3-1'-r2) described later can be mentioned.

The "lactone-containing cyclic group" is the same groups as those described later in the explanation of the structural unit (a2).

Specific examples of substrate interaction groups represented by the general formula (ba0-3-1'-r1) or (ba0-3-1'-r2) are shown below.

[Chemical Formula 5]

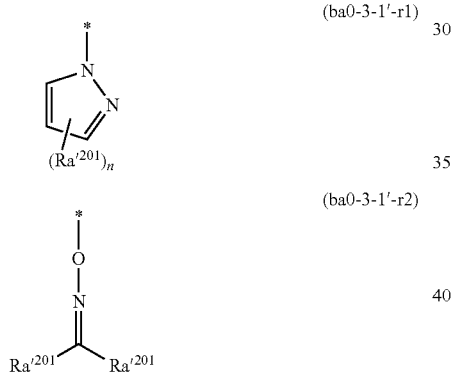

In the formulae, $Ra'^{201}$ represents a hydrogen atom or an alkyl group of 1 to 10 carbon atoms; and n represents an integer of 1 to 3; in the formula (ba0-3-1'-r2), $Ra'^{201}$ is the same as defined above, and when $Ra'^{201}$ is each independently an alkyl group, these groups may be mutually bonded to form a ring; and "*" represents a valence bond.

In the formula (ba0-3-1'-r1) or (ba0-3-1'-r2), $Ra'^{201}$ represents a hydrogen atom or an alkyl group of 1 to 10 carbon atoms; and n represents an integer of 1 to 3. Examples of the alkyl group of 1 to 10 carbon atoms for $Ra'^{201}$ include a methyl group, an ethyl group, an n-propyl group, an i-propyl group, a 2-methylpropyl group, a 1-methylpropyl group and a t-butyl group.

In the formula (ba0-3-1'-r2), $Ra'^{201}$ is the same as defined above, and when $Ra'^{201}$ is each independently an alkyl group, these groups may be mutually bonded to form a ring. Specific examples of the ring structure to be formed include a cyclopentyl group and a cyclohexyl group.

As the structural unit (II), those represented by formulae (ba0-3-1) to (ba0-3-4) shown below are preferable.

[Chemical Formula 6]

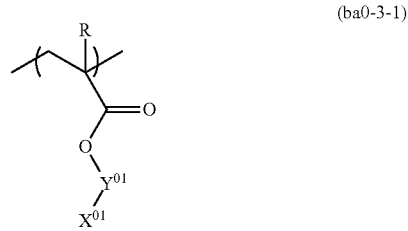

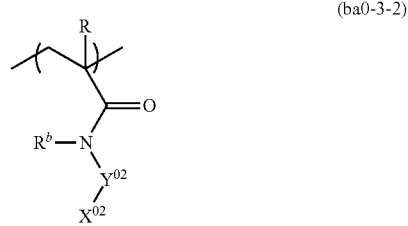

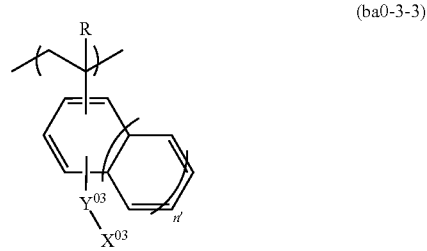

In the formulae, R is the same as defined above; $R^b$ represents a hydrogen atom or an alkyl group of 1 to 5 carbon atoms; $Y^{01}$ represents a divalent linking group; $Y^{02}$ represents a divalent linking group: $Y^{03}$ represents a single bond or a divalent linking group; and $X^{01}$ to $X^{04}$ represents a substrate interaction group as defined above.

In the formula, the divalent linking group for $Y^{01}$ is not particularly limited, and preferable examples thereof include: a divalent hydrocarbon group which does not contain an aromatic ring and may have a substituent; and a divalent linking group which does not contain an aromatic ring and contains a hetero atom. As examples of the divalent linking group for $Y^{01}$, the same groups as divalent linking groups for $Ya^{21}$ in formula (a2-1) described later can be given.

In the formulae, $X^{01}$ preferably represents a carboxy group, a hydroxy group, a cyano group, an amino group, a trialkoxysilyl group, an azide group, a lactone-containing cyclic group, groups represented by formulae (ba0-3-1'-r1) to (ba0-3-1'-r2) described later and an ether-containing cyclic group. The alkoxy group in the trialkoxysilyl group is the same as defined above. As the trialkoxysilyl group, a trimethoxysilyl group is preferable.

Specific examples of the structural unit (II) are shown below. In the formula, R is the same as defined above, and $R^1$ is the same definition as R.

[Chemical Formula 7]

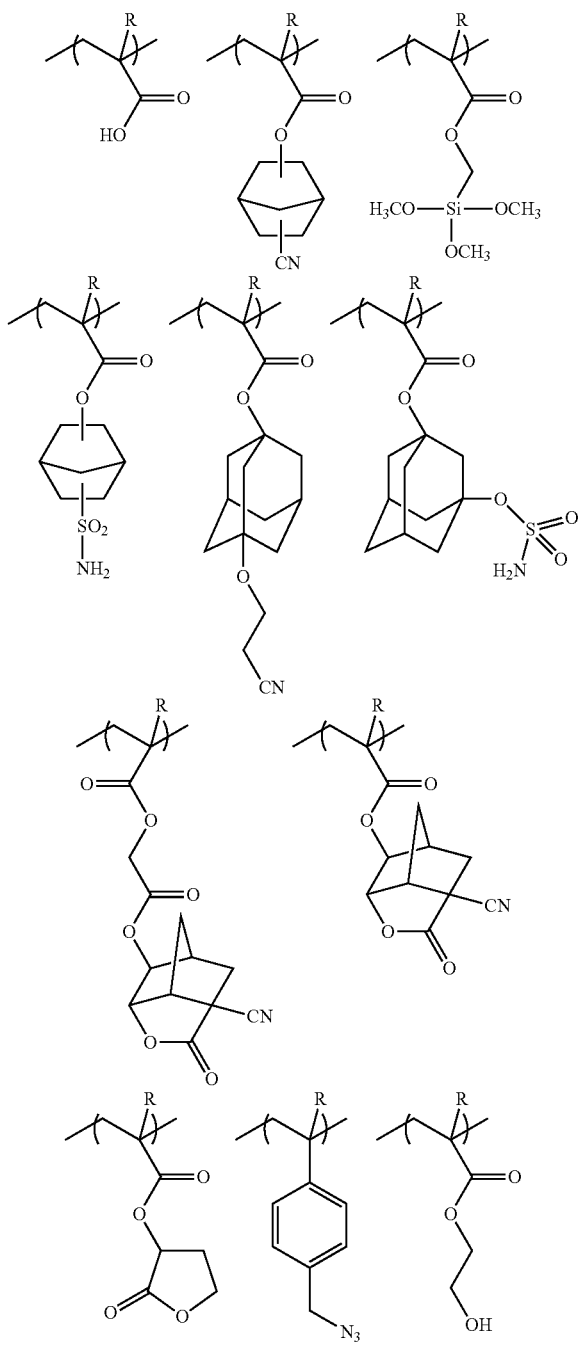

As the structural unit (II), one type of structural unit may be used, or two or more types may be used in combination.

The amount of the structural unit (II) within the resin component in the undercoat agent based on the combined total of all structural units constituting the resin component is not particularly limited, but is preferably 20 mol % or less, more preferably 1 to 10 mol %, and particularly more preferably 1 to 5 mol %. By ensuring the above-mentioned range, the adhesiveness to a substrate is improved.

<<Top Coat Material>>

A top coat material that is preferably used in a method of producing a structure containing a phase-separated structure of the present invention will be described.

In the present invention, the top coat material is a top coat material (hereafter, sometimes referred to as "top coat material (1)") that includes a polymeric compound containing a structural unit (Tc1) that exhibits changed polarity by heating or the like and a surface energy control agent that controls a surface energy of the layer containing a block copolymer.

The top coat material of the present invention may be a top coat material (hereafter, sometimes referred to as "top coat material (2)") includes a polymeric compound containing a structural unit (Tc1) that exhibits changed polarity by heating or the like and a structural unit (Tc2) that controls a surface energy of the layer containing a block copolymer.

<Top Coat Material (1)>

The top coat material (1) is a top coat material that includes a polymeric compound containing a structural unit (Tc1) that exhibits changed polarity by heating or the like and a surface energy control agent that controls a surface energy of the layer containing a block copolymer.

(Polymeric Compound)

A polymeric compound used in the top coat material (1) contains a structural unit (Tc1) that exhibits changed polarity by heating or the like.

By including the structural unit (Tc1), the surface energy of the layer containing the block copolymer can be maintained in an appropriate level during the phase separation.

The "structural unit that exhibits changed polarity by heating or the like" refers to a repeating unit that changes the structure thereof by heating or the like and changes the state of the polar group thereof. Examples of the structural unit (Tc1) include a repeating unit in which the state of the polar group is changed when the ring-opening structure is converted to a ring structure through dehydration condensation by heating.

Examples of the polar group include —COO$^-$, —SO$_3^-$, —NH$_4^+$; a carboxy group, a hydroxy group, an amino group and a sulfo group (—SO$_3$H).

As an example of the structural unit (Tc1), a structural unit represented by chemical formula shown below can be given.

The structural unit represented by chemical formula (Tc1-1) is a structural unit that exhibits increased polarity in the presence of water or a basic component. The structural unit represented by chemical formula (Tc1-2) or (Tc1-3) is a structural unit that exhibits decreased polarity by heating.

[Chemical Formula 8]

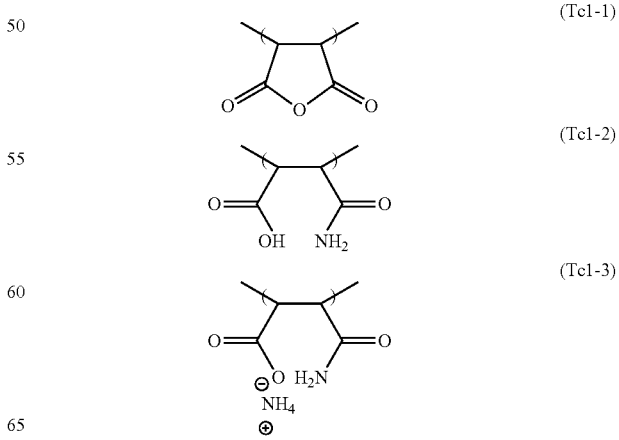

As the structural unit (Tc1) contained in the polymeric compound, 1 type of structural unit may be used, or 2 or more types may be used.

The type of the structural unit (Tc1) selected from the group consisting of a structural unit that exhibits increased polarity by water or a basic component and a structural unit that exhibits decreased polarity by heating can be appropriately determined, taking into consideration the type of the block copolymer or the level of the surface energy of the layer of containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

The polymeric compound used in the top coat material (1) may contain a structural unit other than the structural unit (Tc1).

Examples of the structural unit other than the structural unit (Tc1) include a structural unit (Tc2) that controls the surface energy of the layer containing the block copolymer, a structural unit (Tc3) that controls the glass transition temperature (Tg).

Structural Unit (Tc2)

Examples of the structural unit (Tc2) include the same structural units as those for the structural unit (Tc2) that will be explained in <Top coat material (2)> described later.

As the structural unit (T2) contained in the polymeric compound, 1 type of structural unit may be used, or 2 or more types may be used.

As the structural unit (Tc2), it is preferable to include at least one structural unit selected from the group consisting of a structural unit represented by general formula (Tc2-1) described later, a structural unit represented by general formula (Tc2-2) described later and a structural unit represented by general formula (Tc2-3) described later, and it is more preferable to include at least one structural unit selected from the group consisting of a structural unit represented by general formula (Tc2-1) described later and a structural unit represented by general formula (Tc2-2) described later.

When the polymeric compound includes the structural unit (Tc2), the amount of the structural unit (Tc2) within the polymeric compound, based on the combined total of all the structural units that constitute the polymeric compound, is preferably within a range from 10 to 90 mol %, more preferably from 20 to 70 mol %, and still more preferably from 20 to 60 mol %.

When the amount of the structural unit (Tc2) is within the aforementioned range, the layer containing the block copolymer having a desirable surface energy may be given.

In the top coat material (1), as the polymeric compound containing the structural unit (Tc1), one type of polymeric compound may be used alone, or two or more types of polymeric compounds may be used in combination.

The polymeric compound used in the top coat material (1) is a polymer containing at least the structural unit (Tc1), and preferably a copolymer having the structural unit (Tc2), as well as the structural unit (Tc1).

Among these copolymers, it is preferable to include a copolymer containing a repeating structure of a structural unit represented by the aforementioned general formula (Tc1-1), a structural unit represented by chemical formula (Tc2-1) described later and structural unit represented by general formula (Tc2-2) described later.

Specific examples of preferable polymer compound used for the top coat material (1) include the same polymeric compounds as those explained in <Top coat material (2)> described later.

The weight average molecular weight (Mw) (the polystyrene equivalent value determined by gel permeation chromatography) of the polymeric compound used for the top coat material (1) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (1), the amount of the polymeric compound can be appropriately adjusted depending on the thickness of the topcoat film to be formed, and the like. In the topcoat material (1), the concentration of the polymeric compound is preferably 0.1 to 15% by weight, and more preferably 0.2 to 7% by weight.

(Surface Energy Control Agent)

A top coat material (1) contains a surface energy control agent that controls a surface energy of the layer containing a block copolymer explained in <<method of producing structure containing phase-separated structure>>, as well as the polymeric compound containing the structural unit (Tc1).

By including the surface energy control agent, the surface energy of the layer containing the block copolymer can be controlled in an appropriate level during the phase separation.

Examples of the surface energy control agent include a component (i.e., cross-linking agent) that form an intermolecular chemical bond of the polymeric compounds or an intramolecular chemical bond of the polymeric compound in the top coat material by heating.

Specific examples of the surface energy control agent include cross-linking agents such as diamines, triamines and the like. Among these, diamines or triamines is preferably used, and diamines is particularly preferably used.

Preferred examples of the surface energy control agents are shown below.

[Chemical Formula 9]

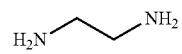 (Sc-1)

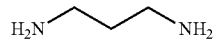 (Sc-2)

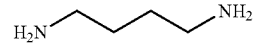 (Sc-3)

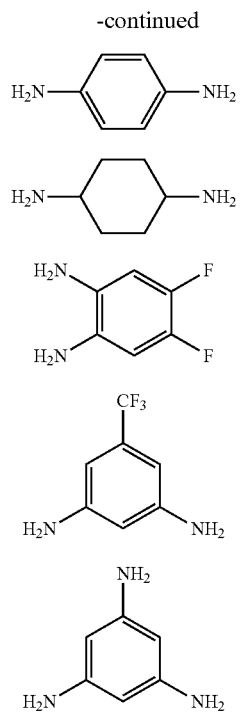

(Sc-4)
(Sc-5)
(Sc-6)
(Sc-7)
(Sc-8)

In the top coat material (1), as the surface energy control agent, one type of surface energy control agent may be used alone, or two or more types of surface energy control agents may be used in combination.

In the top coat material (1), the amount of the surface energy control agent relative to 100 parts by weight of the polymeric compound is preferably 2 to 500 parts by weight, and more preferably 5 to 300 parts by weight.

When the amount of the surface energy control agent is at least as large as the lower limit of the above-mentioned range, the surface energy of the layer containing the block copolymer can be easily controlled. On the other hand, when the amount of the surface energy control agent is no more than the upper limit of the above-mentioned range, the film formability becomes excellent.

If desired, other miscible additives can also be added to the top coat material (1), as well as the polymeric compound and the surface energy control agent.

Solvent

The top coat material (1) can be produced by dissolving the polymeric compound and the surface energy control agent in a solvent.

The solvent may be any solvent which can dissolve the respective components to give a uniform solution, and in the present invention, the solvent does not include a basic substance.

In the present invention, the solvent of top coat material does not include a basic substance. Therefore, it is presumed that, when the top coat solution is applied to a guide pattern, the guide pattern is less likely to be damaged.

In the present invention, examples of the basic substance which is not contained in the solvent include: metal hydroxides such as sodium hydroxide, potassium hydroxide, lithium hydroxide, and calcium hydroxide; metal alkoxides such as sodium methoxide, sodium ethoxide, and sodium t-butoxide; carboxylic acid salts such as sodium acetate, sodium propionate, sodium lactate, sodium 2-ethylhexanoate and sodium benzoate; phenol salts such as sodium phenoxide; carbonates such as sodium carbonate, potassium carbonate and sodium hydrogen carbonate; and amines such as ammonia, triethylamine, and pyridine.

In the present invention, examples of the solvents include water, methanol, a mixed solvent of water and methanol, and a mixed solvent of water and isopropyl alcohol.

In the present invention, as the solvent for top coat material, a mixed solvent of water and methanol is preferable, and a mixed solvent of methanol and water having a ratio of "methanol:water=3:1" is more preferable.

(Optional Components)

If desired, other miscible additives can also be added to the top coat material (1), as well as the polymeric compound and the surface energy control agent.

<Top Coat Material (2)>

A top coat material (2) includes a polymeric compound containing a structural unit (Tc1) that exhibits changed polarity by heating or the like and a structural unit (Tc2) that controls a surface energy of the layer containing a block copolymer.

(Polymeric Compound)

A polymeric compound used in the top coat material (2) contains a structural unit (Tc1) that exhibits changed polarity by heating or the like and a structural unit (Tc2) that controls a surface energy of the layer containing a block copolymer.

Structural Unit (Tc1)

Examples of the structural unit (Tc1) include the same structural units as those described above for the structural unit (Tc1) explained in the aforementioned <Top coat material (1)>.

As the structural unit (Tc1) contained in the polymeric compound, 1 type of structural unit may be used, or 2 or more types may be used.

The type of the structural unit (Tc1) selected from the group consisting of a structural unit that exhibits increased polarity by water or a basic component and a structural unit that exhibits decreased polarity by heating can be appropriately determined, taking into consideration the type of the block copolymer or the level of the surface energy of the layer of containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

Structural Unit (Tc2)

A structural unit (Tc2) is a structural unit that controls a surface energy of the layer containing a block copolymer.

By including the structural unit (Tc2), the surface energy of the layer containing the block copolymer can be controlled in an appropriate level during the phase separation.

As the structural unit (Tc2), any structural units can be used, as long as it controls polarity of the polymeric compound containing the structural unit (Tc1). It is preferable to include at least one structural unit selected from the group consisting of a structural unit represented by general formula (Tc2-1) shown below, a structural unit represented by general formula (Tc2-2) shown below and a structural unit represented by general formula (Tc2-3) shown below.

[Chemical Formula 10]

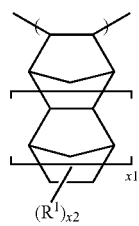
(Tc2-1)

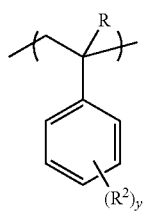
(Tc2-2)

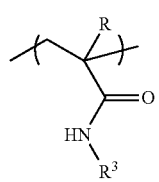
(Tc2-3)

In the formulae, x1 represents 0 or 1; $R^1$ represents a fluorine atom or a hydrocarbon group with or without a fluorine atom or an oxygen atom; x2 represents an integer of 0 to 4; R represents a hydrogen atom, an alkyl group of 1 to 5 carbon atoms or a halogenated alkyl group of 1 to 5 carbon atoms; and the plurality of R may be the same or different from each other; $R^2$ represents a fluorine atom or a hydrocarbon group with or without a fluorine atom or an oxygen atom; y represents an integer of 0 to 3; $R^3$ represents a hydrocarbon group with or without a substituent, wherein the substituent of $R^3$ is a fluorine atom or a hydrocarbon group with or without a fluorine atom or an oxygen atom.

In general formula (Tc2-1) above, x represents 0 or 1.

x2 represents an integer of 0 to 4, is preferably an integer of 0 to 2, is more preferably either 0 or 1, and is most preferably 1.

In the formula (Tc2-1), $R^1$ represents a fluorine atom or a hydrocarbon group with or without a fluorine atom or an oxygen atom; The hydrocarbon group for $R^1$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an n-butyl group and an n-pentyl group. Among these, a methyl group, an ethyl group or an n-propyl group is preferable, and a methyl group or an ethyl group is more preferable.

The branched alkyl group preferably has 3 to 10 carbon atoms, more preferably 3 to 8, and most preferably 3 to 6.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group and the cyclic aliphatic hydrocarbon group may contain a fluorine atom or an oxygen atom. In other words, the hydrogen atom in the aliphatic hydrocarbon group may be substituted with a fluorine atom. The methylene group (—$CH_2$—) in the aliphatic hydrocarbon group may be substituted with an oxygen atom (—O—) or a carbonyl group (—C(=O)—).

When the monovalent hydrocarbon group for $R^1$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group.

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may contain a fluorine atom or an oxygen atom. In other words, the hydrogen atom in the aromatic hydrocarbon group may be substituted with a fluorine atom. The methylene group (—CH₂—) in the aromatic hydrocarbon group may be substituted with an oxygen atom (—O—) or a carbonyl group (—C(=O)—).

In the aforementioned general formulae (Tc2-2) and (Tc2-3), R represents a hydrogen atom, an alkyl group of 1 to 5 carbon atoms or a halogenated alkyl group of 1 to 5 carbon atoms. Here, the plurality of the R group may be the same or different from each other.

As the alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (Tc2-2), $R^2$ is the same as defined for $R^1$ in general formula (Tc2-1).

y represents an integer of 0 to 3, is preferably an integer of 0 to 2, is more preferably either 1 or 2, and is most preferably 1.

In general formula (Tc2-3), $R^3$ represents a hydrocarbon group with or without a substituent.

The hydrocarbon group for $R^3$ is the same hydrocarbon group as those described above for $R^1$ in general formula (Tc2-1).

Examples of the substituent for $R^3$ include a fluorine atom or a hydrocarbon group with or without a fluorine atom or an oxygen atom, and are the same groups as those described above for $R^1$ in the aforementioned formula (Tc2-1).

Specific examples of structural units represented by the general formula (Tc2-1) are shown below.

In the formula, $R^{11}$ represents a hydrogen atom or a hydrocarbon group with or without a fluorine atom.

The hydrocarbon group for $R^{11}$ is the same hydrocarbon group as those described above for $R^1$ in general formula (Tc2-1). In the chemical formula, the wavy line refers to both "wedge bond" and "dashed line bond".

[Chemical Formula 11]

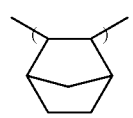
(Tc2-1-1)

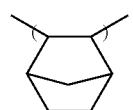
(Tc2-1-2)

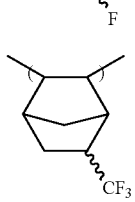
(Tc2-1-3)

-continued

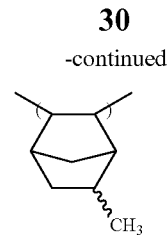
(Tc2-1-4)

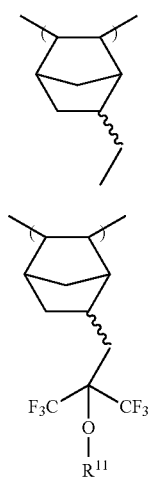
(Tc2-1-5)

(Tc2-1-6)

(Tc2-1-7)

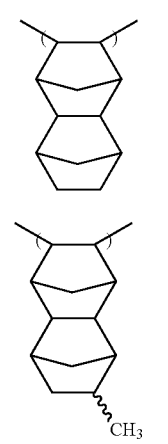
(Tc2-1-8)

(Tc2-1-9)

Specific examples of structural units represented by the general formula (Tc2-2) are shown below. In the formulas shown below, $R^a$ represents a hydrogen atom, a methyl group or a trifluoromethyl group.

In the formula, $R^{12}$ represents a hydrogen atom or a hydrocarbon group with or without a fluorine atom.

The hydrocarbon group for $R^{12}$ is the same hydrocarbon group as those described above for $R^1$ in general formula (Tc2-1).

[Chemical Formula 12]

(Tc2-2-1) 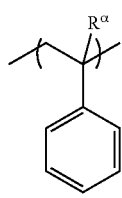

(Tc2-2-2) 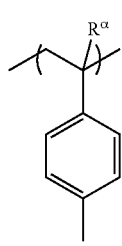

(Tc2-2-3) 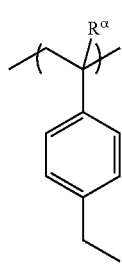

(Tc2-2-4) 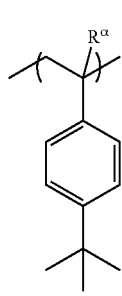

(Tc2-2-5) 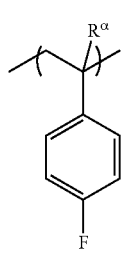

(Tc2-2-6) 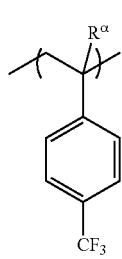

(Tc2-2-7) 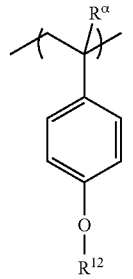

(Tc2-2-8) 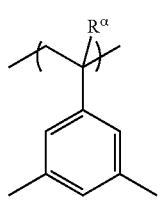

(Tc2-2-9) 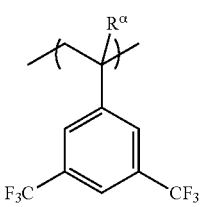

(Tc2-2-10) 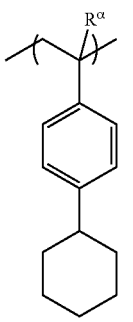

Specific examples of structural units represented by the general formula (Tc2-3) are shown below. In the formulas shown below, R represents a hydrogen atom, a methyl group or a trifluoromethyl group.

In the formula, $R^{13}$ represents a hydrogen atom or a hydrocarbon group with or without a fluorine atom.

The hydrocarbon group for $R^{13}$ is the same hydrocarbon group as those described above for $R^1$ in general formula (Tc2-1).

[Chemical Formula 13]

(Tc2-3-1) 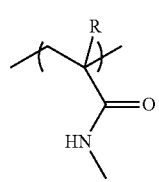

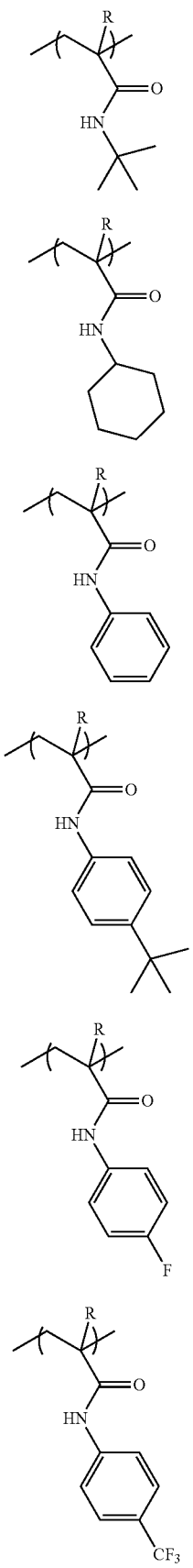

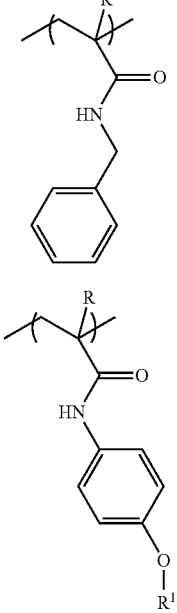

As the structural unit (Tc2) contained in the polymeric compound, 1 type of structural unit may be used, or 2 or more types may be used.

As the structural unit (Tc2), it is preferable to include at least one structural unit selected from the group consisting of a structural unit represented by the aforementioned general formula (Tc2-1), a structural unit represented by the aforementioned general formula (Tc2-2) and a structural unit represented by the aforementioned general formula (Tc2-3).

As the structural unit (Tc2), it is more preferable to include at least one structural unit selected from the group consisting of a structural unit represented by the aforementioned general formula (Tc2-1) and a structural unit represented by the aforementioned general formula (Tc2-2).

In the polymeric compound, the amount of the structural unit (Tc2) based on the combined total of all structural units constituting the polymeric compound is preferably 10 to 90 mol %, more preferably 20 to 70 mol %, and still more preferably 20 to 60 mol %.

When the amount of the structural unit (Tc2) is within the aforementioned range, the surface energy of the layer containing the block copolymer can be easily controlled.

The polymeric compound used in the top coat material (2) may contain a structural unit other than the structural unit (Tc1) or (Tc2).

Examples of the structural unit other than the structural unit (Tc1) or (Tc2) include a structural unit (Tc3) that controls the glass transition temperature (Tg).

In the top coat material (2), as the polymeric compound containing the structural units (Tc1) and (Tc2), one type of polymeric compound may be used alone, or two or more types of polymeric compounds may be used in combination.

The polymeric compound used in the top coat material (2) is a polymer containing at least the structural unit (Tc1) and the structural unit (Tc2).

More specifically, preferable examples of the copolymer include a copolymer containing a repeating structure of a structural unit represented by general formula (Tc1-2) and a structural unit represented by general formula (Tc2-1); a copolymer containing a repeating structure of a structural unit represented by general formula (Tc1-2) and a structural unit represented by general formula (Tc2-2); a copolymer containing a repeating structure of a structural unit represented by general formula (Tc1-2) and a structural unit represented by general formula (Tc2-3); a copolymer containing a repeating structure of a structural unit represented by general formula (Tc1-2), a structural unit represented by general formula (Tc2-1) and a structural unit represented by general formula (Tc2-2); a copolymer containing a repeating structure of a structural unit represented by general formula (Tc1-2), a structural unit represented by general formula (Tc2-1) and a structural unit represented by general formula (Tc2-3); a copolymer containing a repeating structure of a structural unit represented by general formula (Tc1-2), a structural unit represented by general formula (Tc2-2) and a structural unit represented by general formula (Tc2-3); and a copolymer containing a repeating structure of a structural unit represented by general formula (Tc1-1), a structural unit represented by general formula (Tc2-1) and a structural unit represented by general formula (Tc2-2). Among these copolymers, it is preferable to include a copolymer containing a repeating structure of a structural unit represented by general formula (Tc1-1), a structural unit represented by general formula (Tc2-1) and structural unit represented by general formula (Tc2-2).

Specific examples of polymeric compounds used in the top coat material (2) are shown below.

In the formulae, $R^1$, $R^2$, $R^3$ and y are respectively the same as defined for $R^1$, $R^2$, $R^3$ and y in the formulae (Tc2-1) to (Tc2-3).

in the formulae, $R^{1a}$ and $R^{1b}$ are the same as defined for $R^1$ in the formula (Tc2-1).

$R^{2a}$ and $R^{2b}$ are the same as defined for $R^2$ in the formula (Tc2-2).

$y_1$ and $y_2$ are the same as defined for y in the formula (Tc2-2).

$R^{3a}$ and $R^{3b}$ are the same as defined for $R^3$ in the formula (Tc2-3).

$R^\alpha$ is the same as defined above.

[Chemical Formula 14]

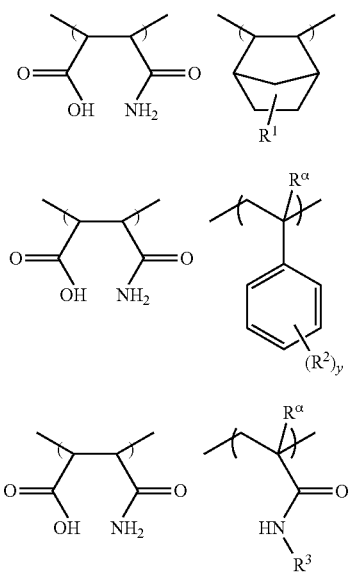

[Chemical Formula 15]

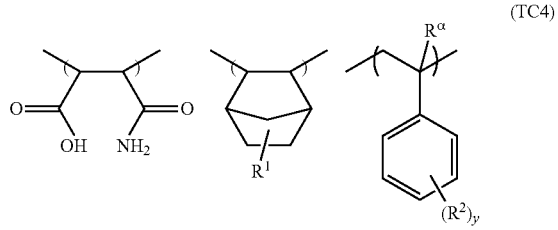

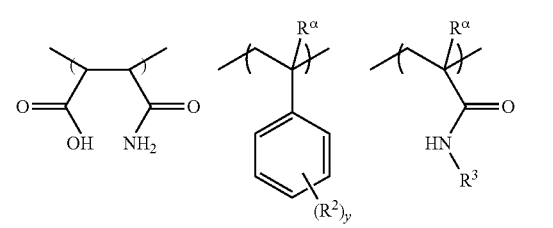

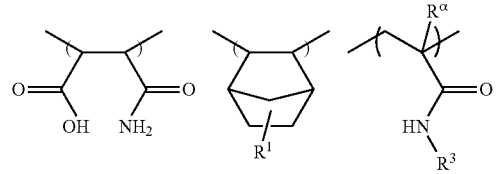

[Chemical Formula 16]

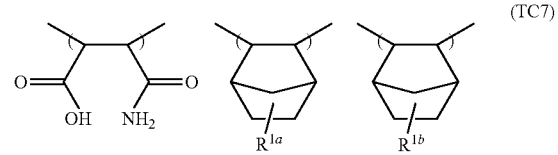

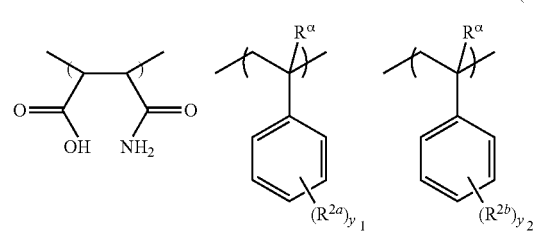

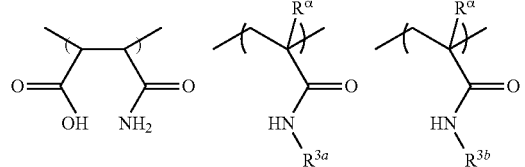

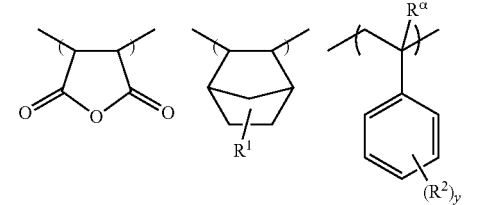

[Chemical Formula 17]

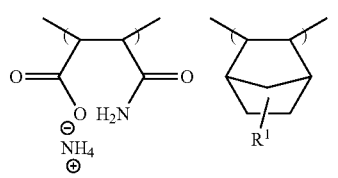 (TC11)

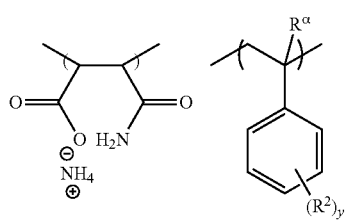 (TC12)

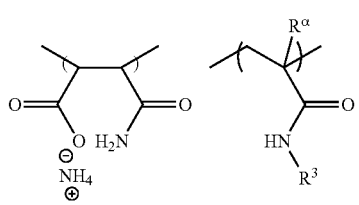 (TC13)

[Chemical Formula 18]

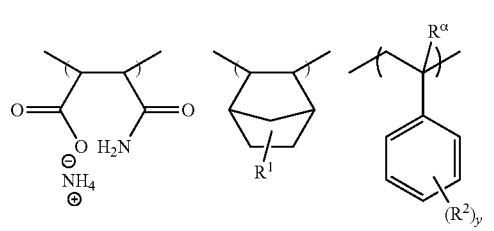 (TC14)

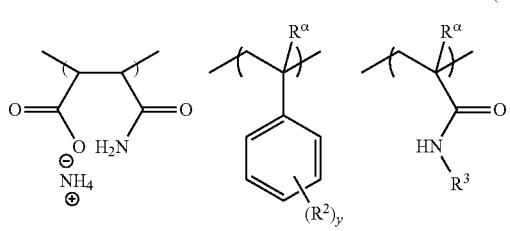 (TC15)

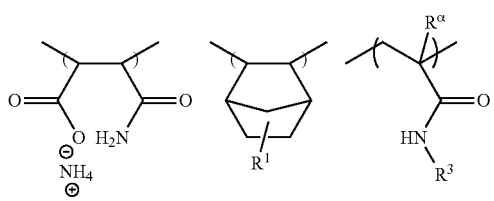 (TC16)

[Chemical Formula 19]

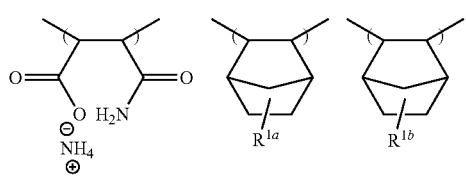 (TC17)

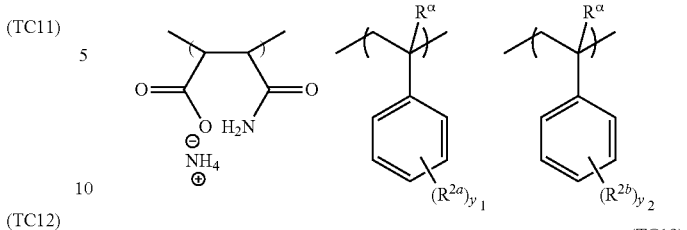 (TC18)

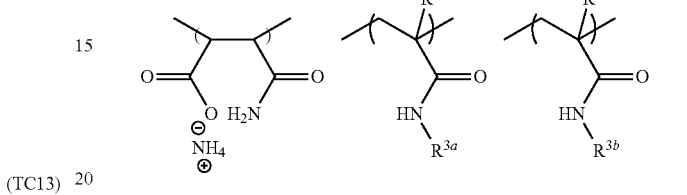 (TC19)

The weight average molecular weight (Mw) (the polystyrene equivalent value determined by gel permeation chromatography) of the polymeric compound used for the top coat material (2) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (2), the amount of the polymeric compound can be appropriately adjusted depending on the thickness of the topcoat film to be formed, and the like. In the topcoat material (2), the concentration of the polymeric compound is preferably 0.1 to 15% by weight, and more preferably 0.2 to 7% by weight.

(Optional Components)

If desired, other miscible additives such as the surface energy control agent can also be added to the top coat material (2), as well as the polymeric compound.

Solvent

The top coat material (2) can be produced by dissolving the polymeric compound in a solvent.

As a solvent, any solvents can be used, as long as it dissolves the respective components so as to give a uniform solution. Examples the solvents include water, aqueous ammonia (preferably 10 to 50% by weight), methanol, a mixed solvent of methanol and aqueous ammonia, a mixed solvent of water and methanol, a mixed solvent of aqueous ammonia and ethanol.

In the present invention, in order to form a guide pattern, a method of forming a resist pattern using a resist composition and a method of forming a pattern by nanoinprinting can be applied.

When a guide pattern is formed by a method of forming a resist pattern using a resist composition, it is preferable that the method contains: a step in which a resist composition containing a base component (A) that exhibits changed solubility in a developing solution by the action of acid, and an acid generator component (B) that generates acid upon exposure is applied to a substrate to form a resist film; a step in which the resist film is exposed; and a step in which the resist film was developed using a developing solution to form a resist pattern.

In the present invention, by the above steps, a structure containing a phase-separated structure arranged along the direction of the resist pattern can be obtained. That is, it is presumed that, according to the present invention, orientation of the phase-separated structure can be controlled.

In the present invention, a method in which orientation of phase-separated pattern can be controlled using a physical guide such as a resist composition (i.e., graphoepitaxy) may be applied.

<Resist Composition>

The resist composition of the present invention preferably includes a base component (A) (hereafter, referred to as "component (A)") which exhibits changed solubility in a developing solution under action of acid, and an acid-generator component (B) (hereafter, referred to as "component (B)") which generates acid upon exposure.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment. However, a solvent developing process is preferred.

The resist composition of the present invention has a function of generating acid upon exposure, and in the resist composition, the component (A) may generate acid upon exposure, or an additive component other than the component (A) may generate acid upon exposure.

More specifically, the resist composition of the present invention may be a resist composition (1) containing an acid generator component (B) which generates acid upon exposure (hereafter, referred to as "component (B)");

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

The resist composition of the present invention is particularly preferably the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A), a resin, a low molecular weight compound, or a combination thereof may be used.

The component (A) may be a component that exhibits increased solubility in a developing solution under action of acid or a component that exhibits decreased solubility in a developing solution under action of acid.

In the present invention, the component (A) may be a component that generates acid upon exposure.

In the present invention, the base component (A) preferably include a polymeric compound (A1) (hereinafter, sometimes referred to as "component (A1)") containing: a structural unit having an acid decomposable group that exhibits increased polarity by the action of acid (hereinafter, sometimes referred to as "structural unit (a1)"); a structural unit derived from acrylate ester containing a —SO$_2$— containing cyclic group (hereinafter, sometimes referred to as "structural unit (a2)"); a structural unit containing a polar group-containing aliphatic hydrocarbon group (hereinafter, sometimes referred to as "structural unit (a3)"); a structural unit containing an acid-non-dissociable, aliphatic cyclic group (hereinafter, sometimes referred to as "structural unit (a4)"); a structural unit containing a lactone-containing cyclic group or a carbonate-containing cyclic group (hereinafter, sometimes referred to as "structural unit (a5)"); or a structural unit containing an ether-containing cyclic group (hereinafter, sometimes referred to as "structural unit (a13)").

(Structural Unit (A1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group ($-SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" include:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in a developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, sometimes referred to as "acetal-type acid dissociable group").

[Chemical Formula 20]

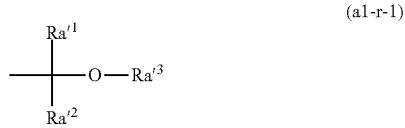

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$ to form a ring.

In the formula (a1-r-1), as the alkyl group for $Ra'^1$ and $Ra'^2$, the same alkyl groups as those described above for the alkyl groups as the substituent which may be bonded to the carbon atom on the α-position of the aforementioned α-substituted alkylester can be used, although a methyl group or ethyl group is preferable, and a methyl group is particularly desirable.

As the hydrocarbon group for $Ra'^3$, an alkyl group of 1 to 20 carbon atoms is preferable, an alkyl group of 1 to 10 carbon atoms is more preferable, and a linear or branched alkyl group is still more preferable. Specific examples thereof include a methyl group, an ethyl group, a propyl group, an isopropyl group, an n-butyl group, an isobutyl group, a tert-butyl group, a pentyl group, an isopentyl group, a neopentyl group, 1,1-dimethylethyl group, 1,1-diethylpropyl group, 2,2-dimethylpropyl group and 2,2-dimethylbutyl group.

When $Ra'^3$ is a cyclic hydrocarbon group, the hydrocarbon group may be either an aliphatic group or an aromatic group, and may be either a polycyclic group or a monocyclic group. As the monocyclic alicyclic hydrocarbon group, a group in which one hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which one hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 21]

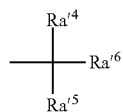

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 22]

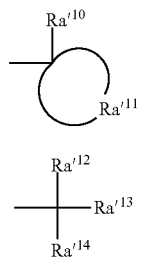

(a1-r2-1)

(a1-r2-2)

In the formula, $Ra'^{10}$ represents an alkyl group of 1 to 10 carbon atoms; $Ra'^{11}$ is a group which forms an aliphatic cyclic group together with a carbon atom having $Ra'^{10}$ bonded thererto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the formula (a1-r2-1) are shown below. The "*" in the formula represents a valence bond.

[Chemical Formula 23]

(r-pr-m1)

(r-pr-m2)

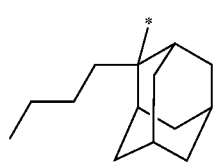

(r-pr-m3)

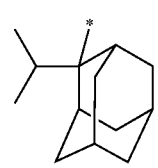

(r-pr-m4)

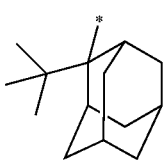

(r-pr-m5)

(r-pr-m6)

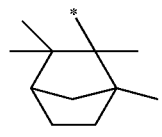

(r-pr-m7)

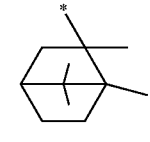

(r-pr-m8)

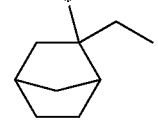

(r-pr-m9)

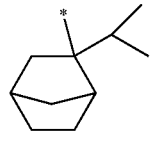

(r-pr-m10)

-continued
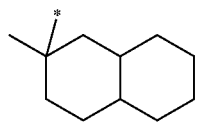 (r-pr-m11)
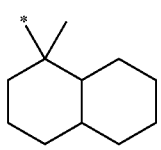 (r-pr-m12)
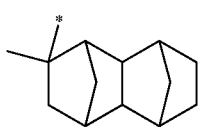 (r-pr-m13)
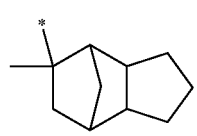 (r-pr-m14)
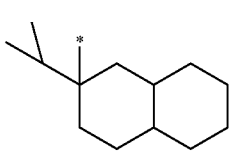 (r-pr-m15)
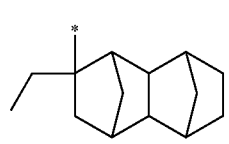 (r-pr-m16)
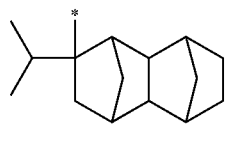 (r-pr-m17)
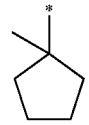 (r-pr-s1)
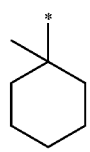 (r-pr-s2)
 (r-pr-s3)
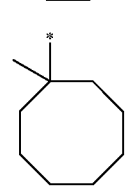 (r-pr-s4)
-continued
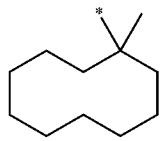 (r-pr-s5)
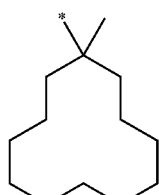 (r-pr-s6)
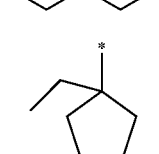 (r-pr-s7)
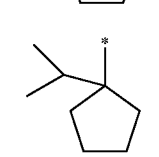 (r-pr-s8)
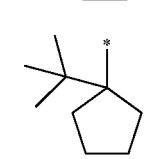 (r-pr-s9)
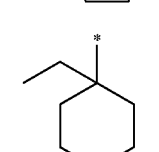 (r-pr-s10)
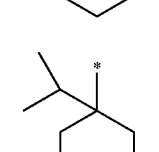 (r-pr-s11)
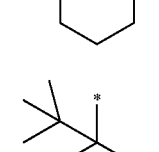 (r-pr-s12)
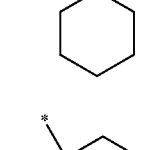 (r-pr-s13)
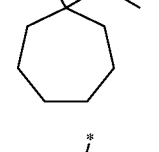 (r-pr-s14)
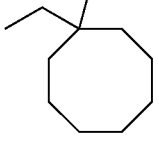

-continued
(r-pr-s15)
(r-pr-s16)
(r-pr-s17)
(r-pr-s18)
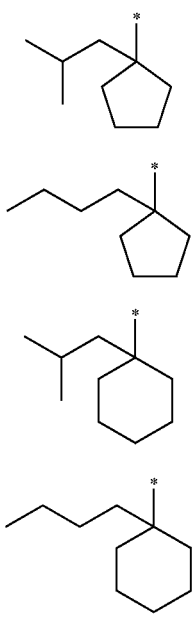
Specific examples of the formula (a1-r2-2) are shown below.
[Chemical Formula 24]
(r-pr-cm1)
(r-pr-cm2)
(r-pr-cm3)
(r-pr-cm4)
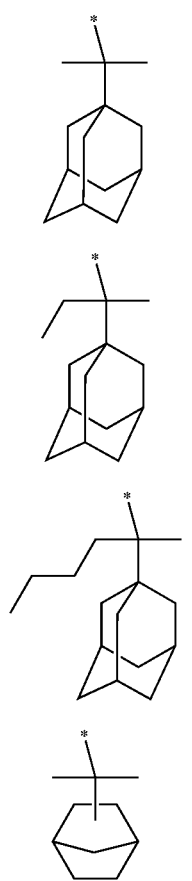
-continued
(r-pr-cm5)
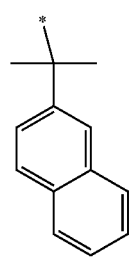
(r-pr-cm6)
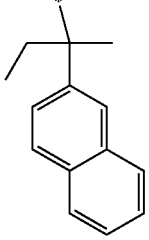
(r-pr-cm7)
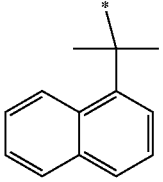
(r-pr-cm8)
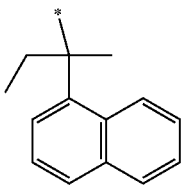
(r-pr-cs1)
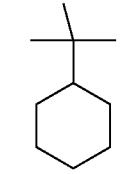
(r-pr-cs2)
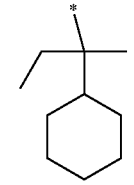
(r-pr-cs3)
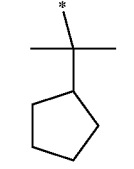

-continued (r-pr-cs4)
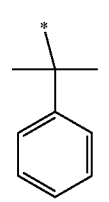

(r-pr-cs5)
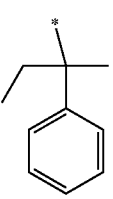

(r-pr-c1)

(r-pr-c2)

(r-pr-c3)
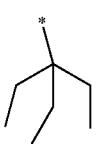

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 25]

(a1-r-3)
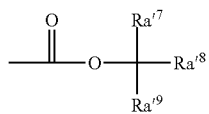

In the formula, $Ra'^7$ to $Ra'^9$ each represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinyl- benzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), a structural unit represented by general formula (a1-1) or (a1-2) shown below is preferable.

[Chemical Formula 26]

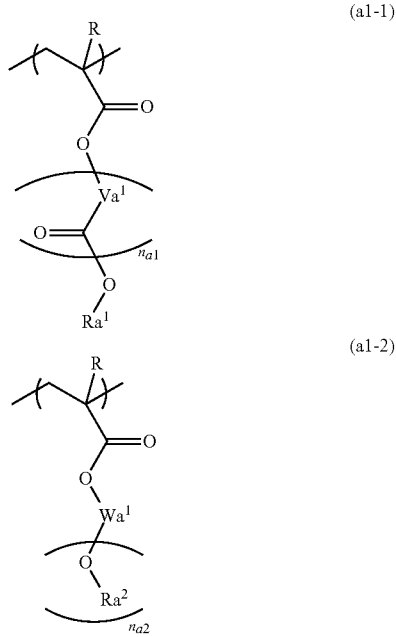

(a1-1)

(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, urethane bond or amide bond; $n_{a1}$ each independently represents an integer of 0 to 2; $Ra^1$ represents an acid dissociable group represented by the aforementioned formula (a1-r-1) or (a1-r-2);

$Wa^1$ represents a hydrocarbon group having a valency of $n_{a2}+1$; $n_{a1}$ represents 1 to 3; and $Ra^2$ represents an acid dissociable group represented by the aforementioned formula (a1-r-1) or (a1-r-3).

In general formula (a1-1), as the alkyl group of 1 to 5 carbon atoms, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group $[-CH_2-]$, an ethylene group $[-(CH_2)_2-]$, a trimethylene group $[-(CH_2)_3-]$, a tetramethylene group $[-(CH_2)_4-]$ and a pentamethylene group $[-(CH_2)_5-]$.

As the branched aliphatic hydrocarbon group, a branched alkylene group is preferable, and specific examples include alkylalkylene groups, e.g., alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$, and $-C(CH_2CH_3)_2-CH_2-$; alkyltrimethylene groups such as $-CH(CH_3)CH_2CH_2-$, and $-CH_2CH(CH_3)CH_2-$; and alkyltetramethylene groups such as $-CH(CH_3)CH_2CH_2CH_2-$, and $-CH_2CH(CH_3)CH_2CH_2-$. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

As the structural unit represented by the aforementioned formula (a1-2), a structural unit represented by general formula (a1-2-01) shown below is desirable.

[Chemical Formula 27]

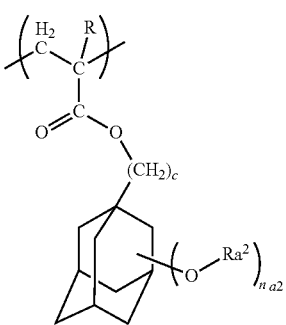

(a1-2-01)

In the formula (a1-2-01), $Ra^2$ represents an acid dissociable group represented by the aforementioned formulae (a1-r-1) or (a1-r-3); $n_{a2}$ is an integer of 1 to 3, preferably 1 or 2, and more preferably 1; c is an integer of 0 to 3, preferably 0 or 1, and more preferably 1; and R is the same as defined above.

Specific examples of the structural units (a1-1) and (a1-2) are shown below. In the formulas shown below, $R^α$ represents a hydrogen atom, a methyl group or a trifluoromethyl group.

[Chemical Formula 28]

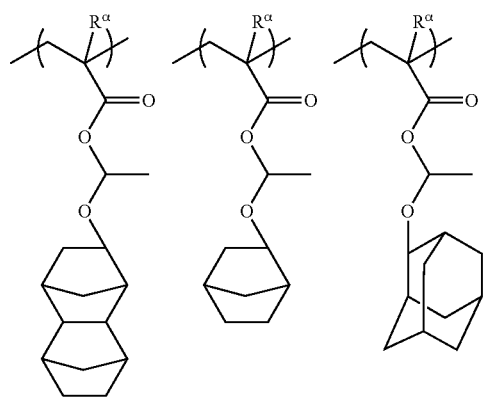

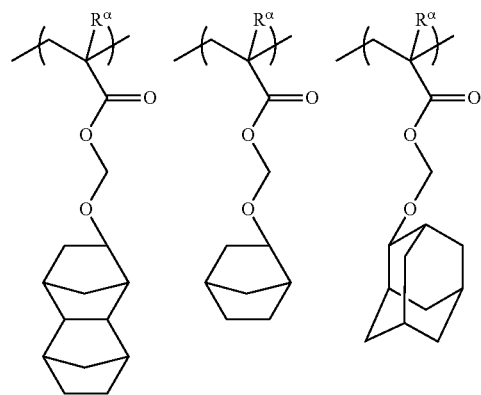

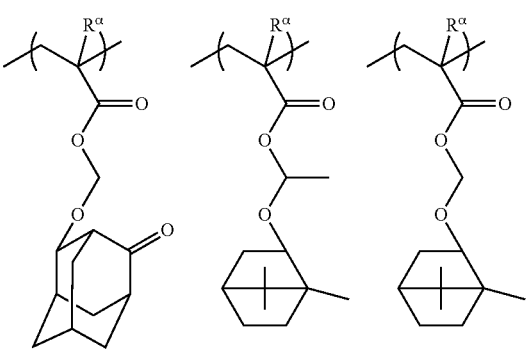

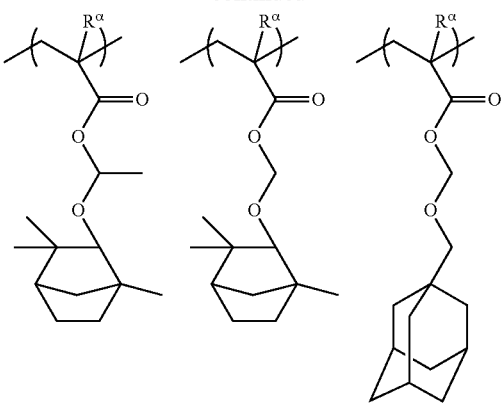

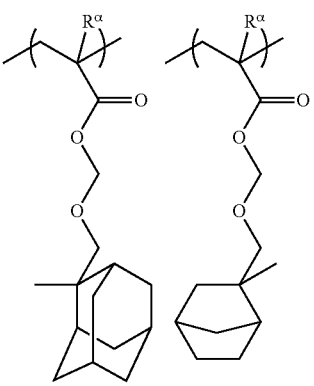

[Chemical Formula 29]

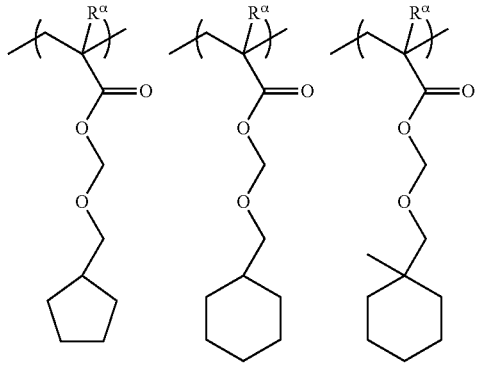

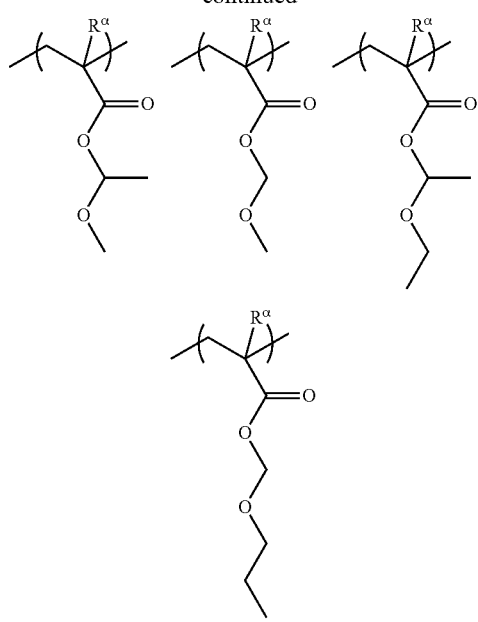
[Chemical Formula 30]
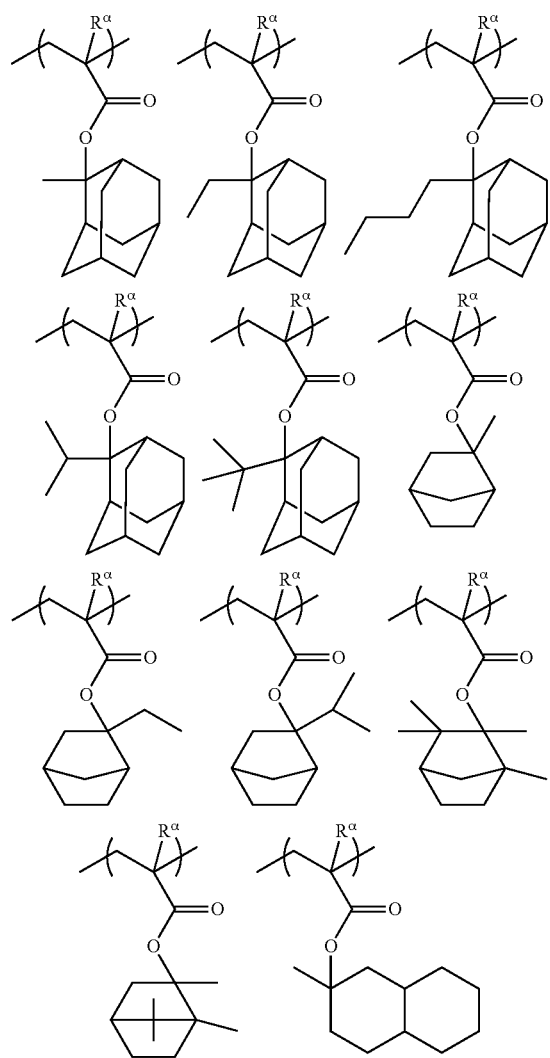
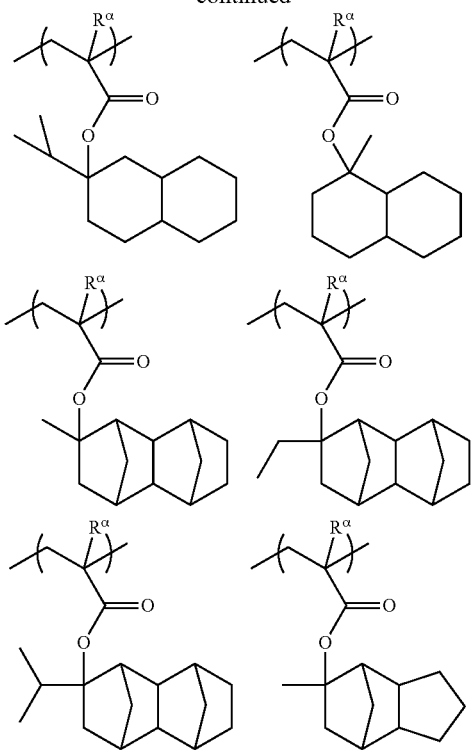
[Chemical Formula 31]
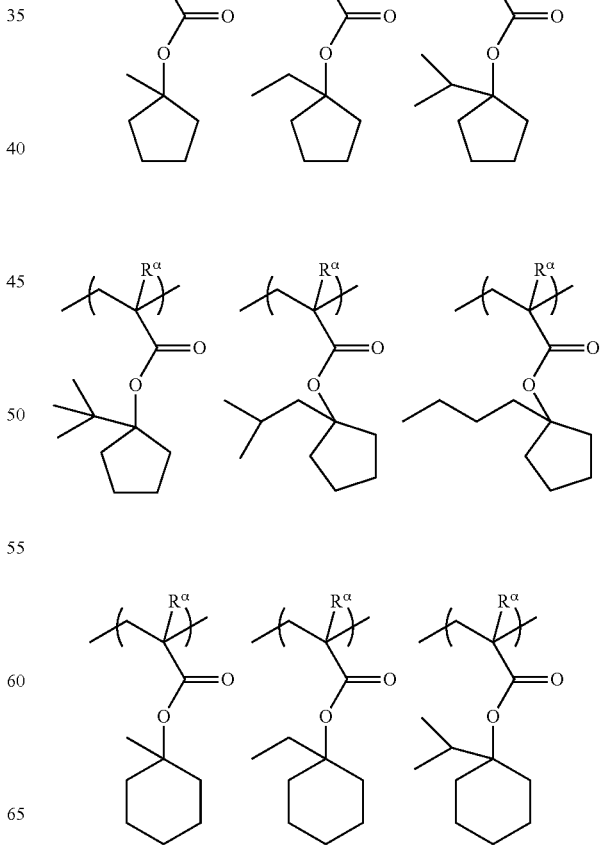

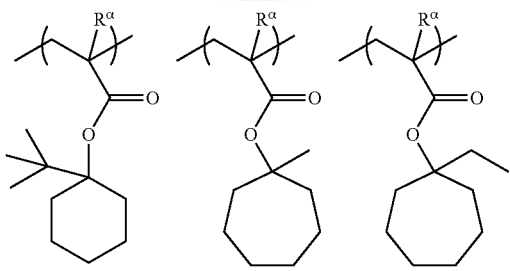

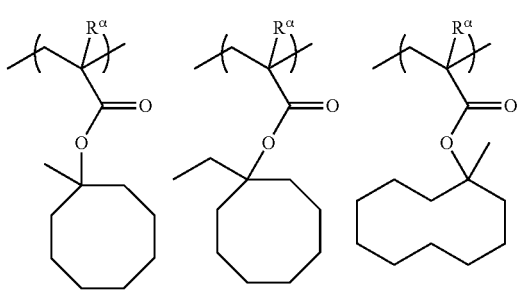

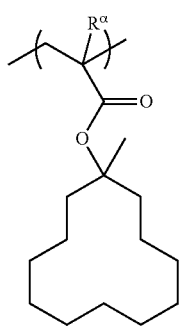

[Chemical Formula 32]

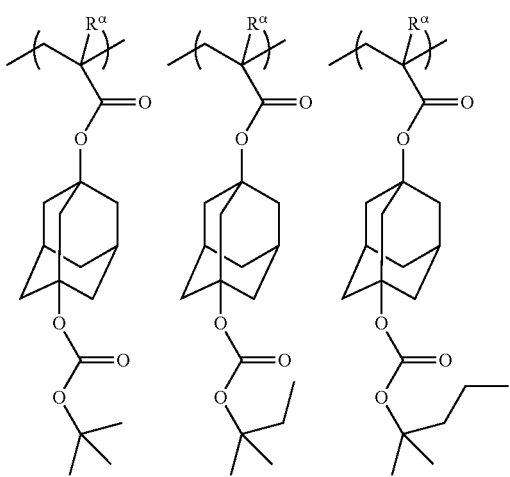

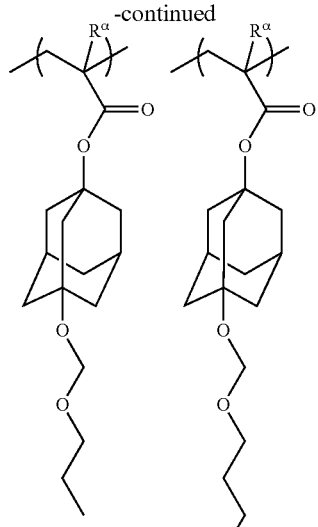

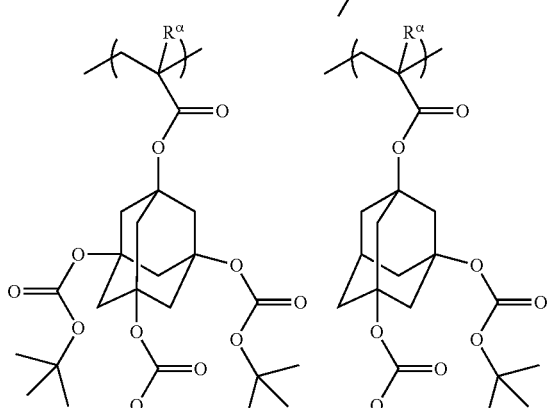

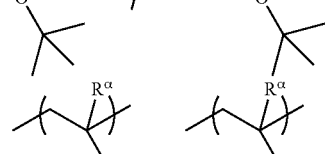

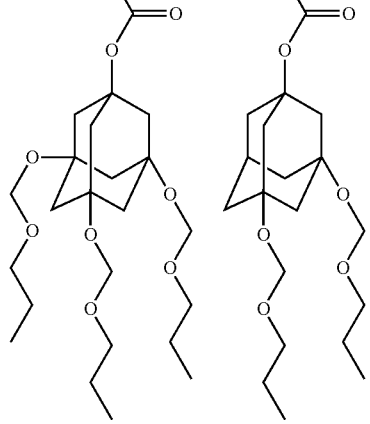

In the component (A1), the amount of the structural unit (a1) based on the combined total of all structural units constituting the component (A1) is preferably 20 to 80 mol %, more preferably 20 to 75 mol %, and still more preferably 25 to 70 mol %. When the amount of the structural unit (a1) is at least as large as the lower limit of the above-mentioned range, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The structural unit (a2) is a structural unit containing an —SO$_2$— containing cyclic group.

When the component (A1) is used for forming a resist film, the —SO$_2$— containing cyclic group within the structural unit (a2) is effective in improving the adhesion between the resist film and the substrate.

In the present invention, the component (A1) preferably contains the structural unit (a2).

The aforementioned structural unit (a1) which contains a —SO$_2$— containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 33]

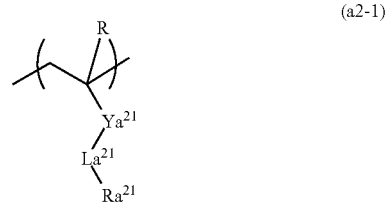

(a2-1)

In the formula, R represents a hydrogen atom, an alkyl group of 1 to 5 carbon atoms or a halogenated alkyl group of 1 to 5 carbon atoms; Ya$^{21}$ represents a single bond or a divalent linking group; La$^{21}$ represents —O—, —COO—, —CON(R')—, —OCO—, —CONHCO— or —CONHCS—; and R' represents a hydrogen atom or a methyl group, provided that when La$^{21}$ represents —O—, Ya$^{21}$ does not represents —CO—; and Ra$^{21}$ represents an —SO$_2$- containing cyclic group].

The divalent linking group for Ya$^{21}$ is not particularly limited, and preferable examples thereof include a divalent hydrocarbon group with or without a substituent and a divalent linking group containing a hetero atom.

(Divalent Hydrocarbon Group with or without a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given. Specific examples thereof include the same group as exemplified above for Va$^1$ in the aforementioned formula (a1-1).

The linear or branched aliphatic hydrocarbon group may or may not have a substituent. Examples of the substituent include a fluorine atom, a fluorinated alkyl group of 1 to 5 carbon atoms, and a carbonyl group.

As examples of the aliphatic hydrocarbon group containing a ring in the structure thereof, a cyclic aliphatic hydrocarbon group with or without a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for Va$^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$— or —S(=O)$_2$—O—.

Specific examples of the aromatic hydrocarbon group as a divalent hydrocarbon group include the same group as exemplified above for Va$^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, and a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$— [in the formulas, each of $Y^{21}$ and $Y^{22}$ independently represents a divalent hydrocarbon group with or without a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —$Y^{21}$—O—$Y^{22}$—, —$Y^{21}$—O—, —$Y^{21}$—C(O)—O—, —C(=O)—O—$Y^{21}$, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent hydrocarbon group with or without a substituent. Examples of the divalent hydrocarbon group include the same groups as those described above as the "divalent hydrocarbon group with or without a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m'}$—$Y^{22}$— is a group represented by general formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^{21}$ preferably represents an ester bond [—C(=O)—O—], an ether bond (—O—), a linear or branched alkylene group, a combination of these, or a single bond.

In the formula (a2-1), $Ra^{21}$ represents an —SO$_2$— containing cyclic group.

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$-containing cyclic group may be either a monocyclic group or a polycyclic group.

As the —SO$_2$— containing cyclic group as a cyclic hydrocarbon group for $Ra^{21}$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable. More specific examples of the —SO$_2$— containing cyclic group include groups represented by general formulas (a5-r-1) to (a5-r-4) shown below.

[Chemical Formula 34]

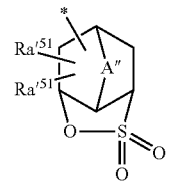

(a5-r-1)

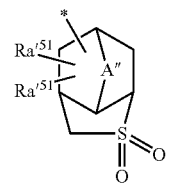

(a5-r-2)

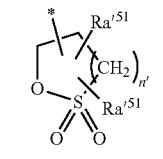

(a5-r-3)

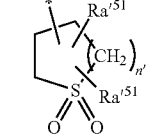

(a5-r-4)

In the formulas, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulas (a5-r-1) to (a5-r-4), A" is the same as defined for A" in general formulas (a2-r-1) to (a2-r-7). Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulas (a2-r-1) to (a2-r-7).

Specific examples of the groups represented by the aforementioned general formulas (a5-r-1) to (a5-r-4) are shown below. In the formulas shown below, "Ac" represents an acetyl group.
[Chemical Formula 35]
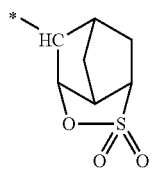
(r-sl-1-1)
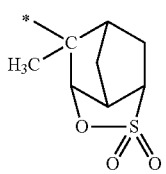
(r-sl-1-2)
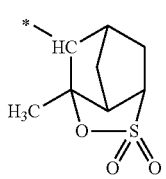
(r-sl-1-3)
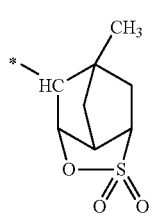
(r-sl-1-4)
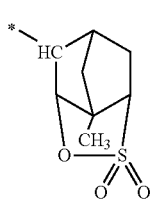
(r-sl-1-5)
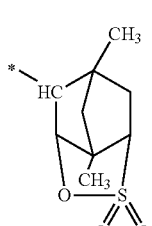
(r-sl-1-6)
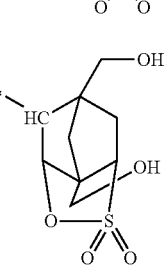
(r-sl-1-7)
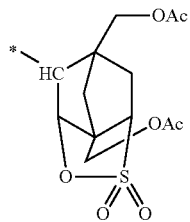
(r-sl-1-8)
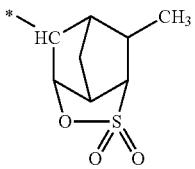
(r-sl-1-9)
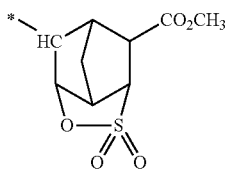
(r-sl-1-10)
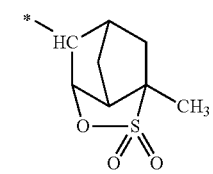
(r-sl-1-11)
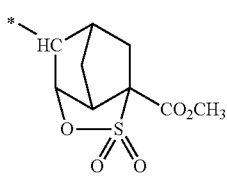
(r-sl-1-12)
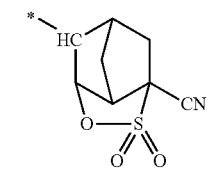
(r-sl-1-13)
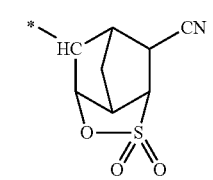
(r-sl-1-14)
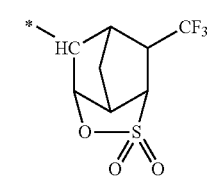
(r-sl-1-15)

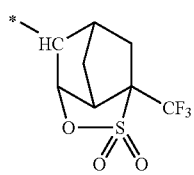 (r-sl-1-16)
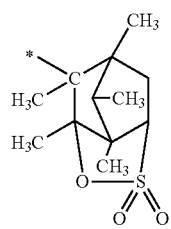 (r-sl-1-17)
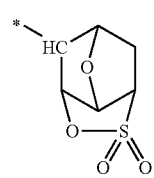 (r-sl-1-18)
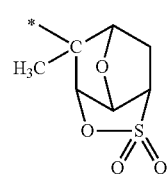 (r-sl-1-19)
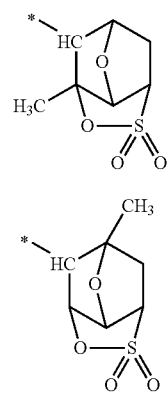 (r-sl-1-20)
(r-sl-1-21)
[Chemical Formula 36]
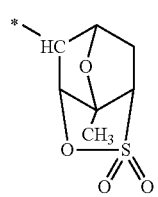 (r-sl-1-22)
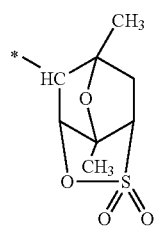 (r-sl-1-23)
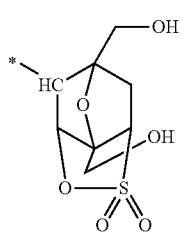 (r-sl-1-24)
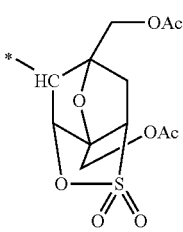 (r-sl-1-25)
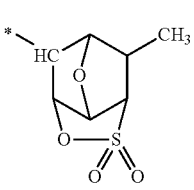 (r-sl-1-26)
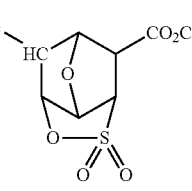 (r-sl-1-27)
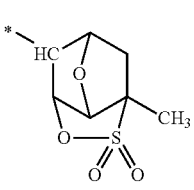 (r-sl-1-28)
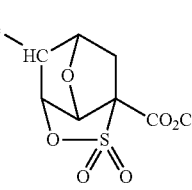 (r-sl-1-29)
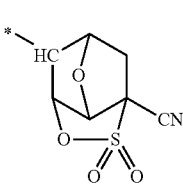 (r-sl-1-30)
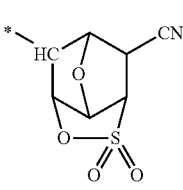 (r-sl-1-31)

-continued (r-sl-1-32)
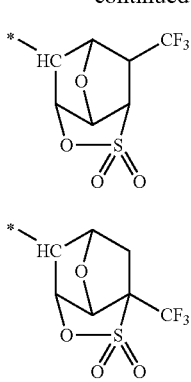

(r-sl-1-33)

[Chemical Formula 37]

(r-sl-2-1)
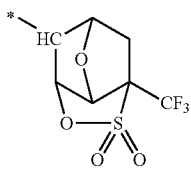

(r-sl-2-2)

(r-sl-3-1)
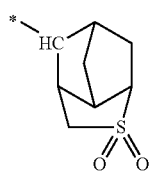

(r-sl-4-1)
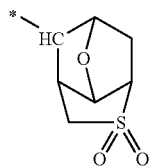

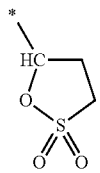

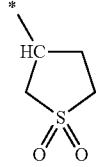

As the —$SO_2$— containing cyclic group, a group represented by the aforementioned general formula (a5-r-1) is preferable, at least one member selected from the group consisting of groups represented by the aforementioned chemical formulas (r-sl-1-1), (r-sl-1-18), (r-sl-3-1) and (r-sl-4-1) is more preferable, and a group represented by chemical formula (r-sl-1-1) is most preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A) is enhanced, thereby contributing to improvement in resolution.

Examples of the polar group include a hydroxyl group, a cyano group, a carboxyl group, or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that includes an aliphatic polycyclic group that contains a hydroxyl group, a cyano group, a carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane or a group in which two or more hydrogen atoms have been removed from tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

[Chemical Formula 38]

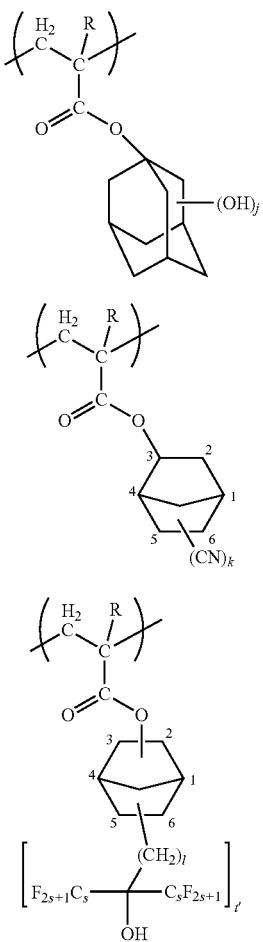

(a3-1)

(a3-2)

(a3-3)

In the formulae, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbonyl group or 3-norbonyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed are improved. Further, the hydrophobicity of the component (A1) is further improved. Increase in the hydrophobicity contributes to improvement in terms of resolution, shape of the resist pattern and the like, particularly in an organic solvent developing process.

In the structural unit (a4), an "acid non-dissociable, aliphatic cyclic group" refers to a cyclic group which is not dissociated by the action of the acid generated from the component (B) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 39]

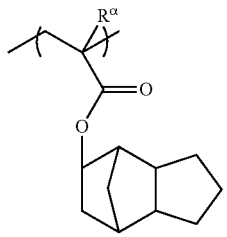

(a4-1)

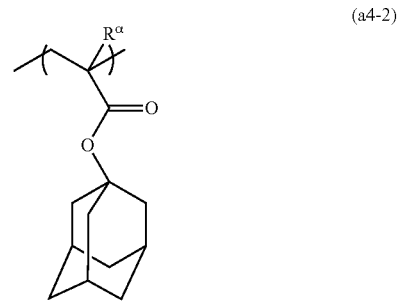

(a4-2)

-continued

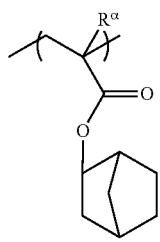
(a4-3)

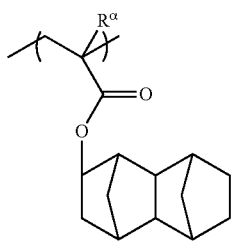
(a4-4)

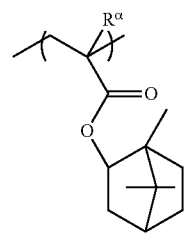
(a4-5)

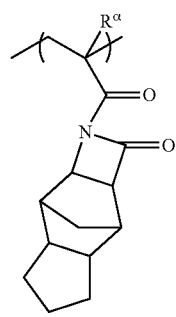
(a4-6)

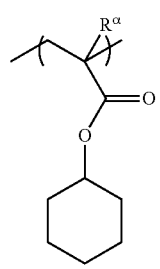
(a4-7)

In the formulas shown above, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

The structural unit (a5) is a structural unit which contains a lactone-containing cyclic group or a carbonate-containing cyclic group.

When the component (A1) is used for forming a resist film, the lactone-containing cyclic group or the carbonate-containing cyclic group within the structural unit (a5) is effective in improving the adhesion between the resist film and the substrate.

The aforementioned structural unit (a1) which contains a lactone-containing cyclic group or a carbonate-containing cyclic group falls under the definition of the structural unit (a5); however, such a structural unit is regarded as a structural unit (a1), and does not fall under the definition of the structural unit (a5).

The structural unit (a5) is preferably a structural unit represented by the general formula (a2-1) in which $Ra^{21}$ represents a lactone-containing cyclic group or a carbonate-containing cyclic group.

The term "lactone-containing cyclic group" refers to a cyclic group including a ring containing a —O—C(=O)— structure (lactone ring) in the ring skeleton thereof. The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for $R^1$ is not particularly limited, and an arbitrary structural unit may be used. Specific examples include groups represented by general formulas (a2-r-1) to (a2-r-7) shown below. Hereafter, "*" represents a valence bond.

[Chemical Formula 40]

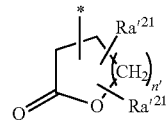
(a2-r-1)

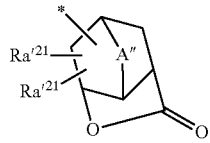
(a2-r-2)

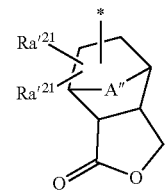
(a2-r-3)

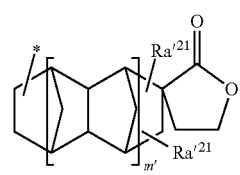
(a2-r-4)

(a2-r-5)
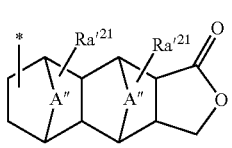

(a2-r-6)
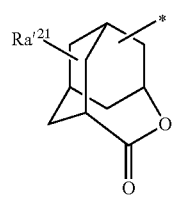

(a2-r-7)
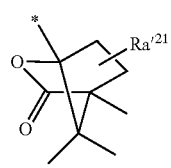

In the formulas, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" each independently represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulas (a2-r-1) to (a2-r-7), A" represents an oxygen atom, a sulfonyl group or an alkylene group of 1 to 5 carbon atoms which may contain an oxygen atom (—O—) or a sulfur atom (—S—). As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group. Each $Ra'^{21}$ independently represents an alkyl group, an alkoxy group, a halogen atom, a halogenated alkyl group, —COOR", —OC(=O)R", a hydroxyalkyl group or a cyano group.

The alkyl group for $Ra'^{21}$ is preferably an alkyl group of 1 to 5 carbon atoms.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl groups for $Ra'^{21}$ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulas (a2-r-1) to (a2-r-7) are shown below.

[Chemical Formula 41]

(r-lc-1-1)
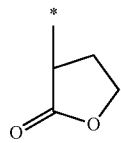

(r-lc-1-2)
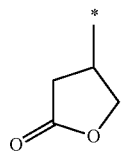

(r-lc-1-3)
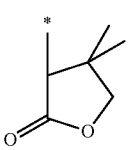

(r-lc-1-4)
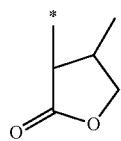

(r-lc-1-5)
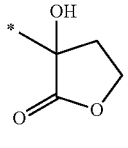

(r-lc-1-6)
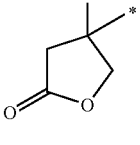

(r-lc-1-7)
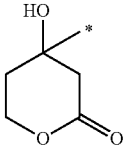

(r-lc-2-1)
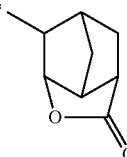

(r-lc-2-2)
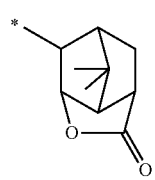
(r-lc-2-3)
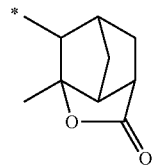
(r-lc-2-4)
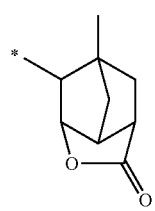
(r-lc-2-5)
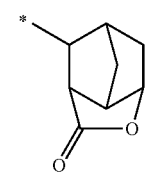
(r-lc-2-6)
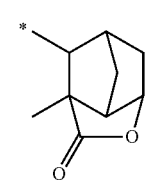
(r-lc-2-7)
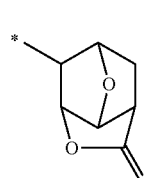
(r-lc-2-8)
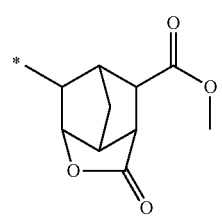
(r-lc-2-9)
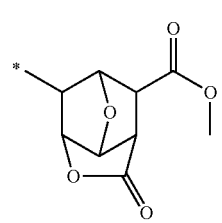
(r-lc-2-10)
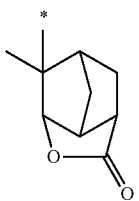
(r-lc-2-11)
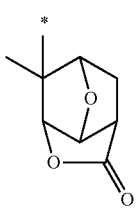
(r-lc-2-12)
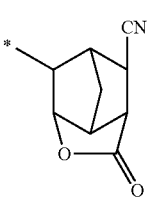
(r-lc-2-13)
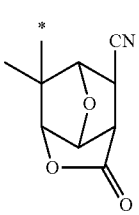
(r-lc-3-1)
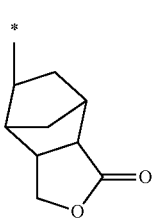
(r-lc-3-2)
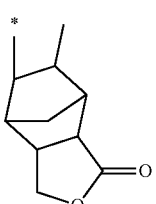
(r-lc-3-3)
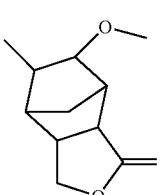

77
-continued
(r-lc-3-4)
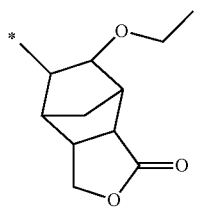
(r-lc-3-5)
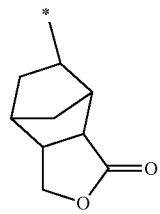
(r-lc-4-1)
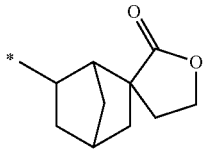
(r-lc-4-2)
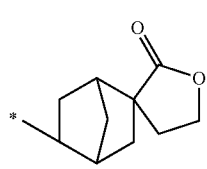
(r-lc-4-3)
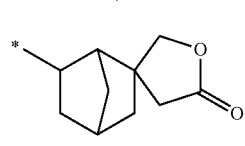
(r-lc-4-4)
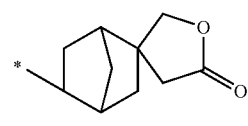
(r-lc-4-5)
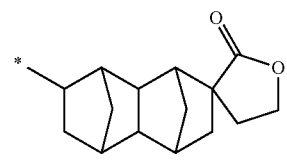
(r-lc-4-6)
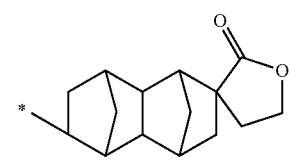
(r-lc-4-7)
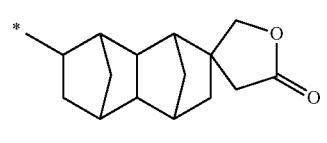
78
-continued
(r-lc-4-9)
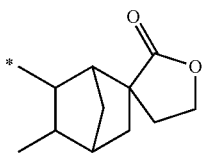
(r-lc-5-1)
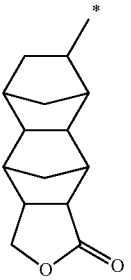
(r-lc-5-2)
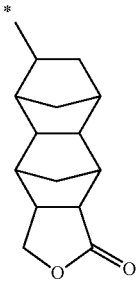
(r-lc-5-3)
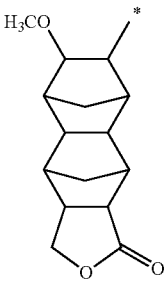
(r-lc-5-4)
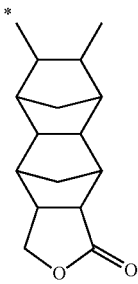
(r-lc-6-1)
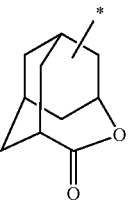

-continued (r-lc-7-1)

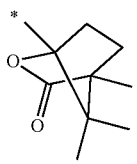

The term "carbonate-containing cyclic group" refers to a cyclic group including a ring containing a —O—C(=O)—O— structure (carbonate ring) in the ring skeleton thereof. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group for $R^1$ as a cyclic hydrocarbon group is not particularly limited, and an arbitrary structural unit may be used. Specific examples include groups represented by general formulas (ax3-r-1) to (ax3-r-3) shown below.

[Chemical Formula 42]

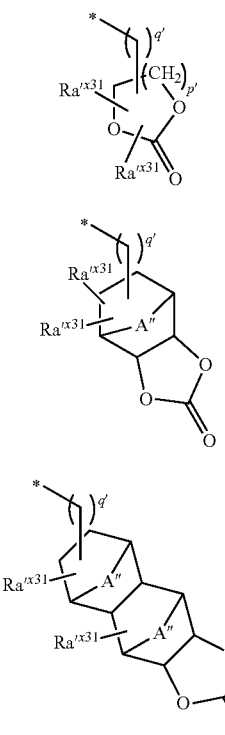

(ax3-r-1)

(ax3-r-2)

(ax3-r-3)

In the formulas, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" each independently represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulas (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxy alkyl group for $Ra'^{31}$ include the same groups as those exemplified for $Ra'^{21}$ in the formulas (a2-r-1) to (a2-r-7).

Specific examples of the groups represented by the aforementioned general formulas (ax3-r-1) to (ax3-r-3) are shown below.

[Chemical Formula 43]

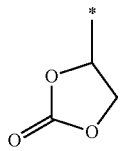

(r-cr-1-1)

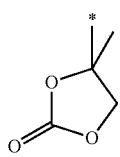

(r-cr-1-2)

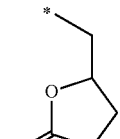

(r-cr-1-3)

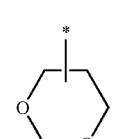

(r-cr-1-4)

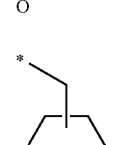

(r-cr-1-5)

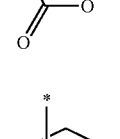

(r-cr-1-6)

-continued (r-cr-1-6)
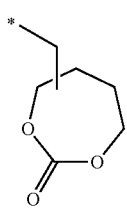

(r-cr-2-1)
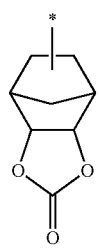

(r-cr-2-2)
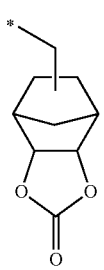

(r-cr-2-3)
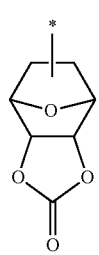

(r-cr-2-4)
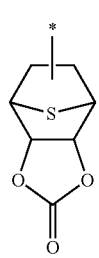

(r-cr-3-1)
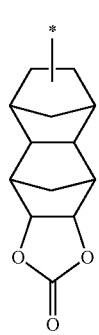

-continued (r-cr-3-2)
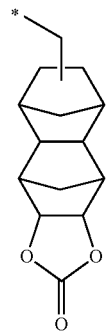

(r-cr-3-3)
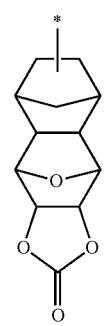

(r-cr-3-4)
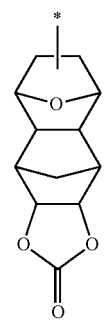

(r-cr-3-5)
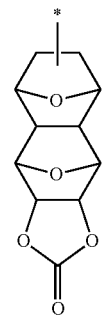

Among these, groups represented by the general formulae (a2-r-1) and (a2-r-2) are preferable, and a group represented by the general formulae (r-lc-1-1) is more preferable.

As the structural unit (a5) contained in the component (A1), 1 type of structural unit may be used, or 2 or more types may be used.

When the component (A1) contains the structural unit (a5), the amount of the structural unit (a5) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a5) is at least as large as the lower limit of the above-mentioned range, the effect of using the structural unit (a5) can be satisfactorily achieved. On the other hand, when the amount of the structural unit (a5) is no more than the upper limit of the above-mentioned range, a good balance can be achieved with the other structural units, and various lithography properties such as DOF and CDU and pattern shape can be improved.

(Structural Unit (a13)):

The structural unit (a13) is a structural unit containing an ether-containing cyclic group. As an example of the structural unit (a13), a structural unit represented by any one of general formulae (a13-1) to (a13-3) shown below can be given.

[Chemical Formula 44]

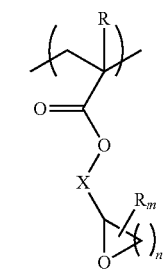
(a13-1)

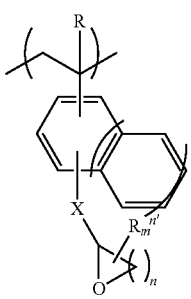
(a13-2)

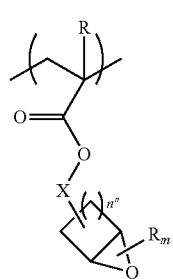
(a13-3)

In the formulae, R represents the same as defined above; X represents a single bond or an alkylene group of 1 to 3 carbon atoms; n represents 1 to 5; $R_m$ represents a hydrogen atom or an alkyl group of 1 to 5 carbon atoms; n' represents 0 to 2; and n" represents 0 to 2.

Preferable examples of the structural unit represented by general formulae (a13-1) to (a13-3) are shown below.

[Chemical Formula 45]

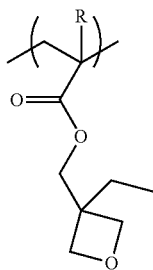
(a13-1-1)

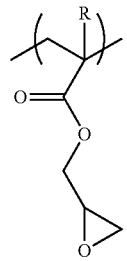
(a13-1-2)

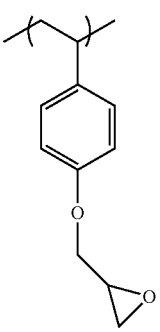
(a13-2-1)

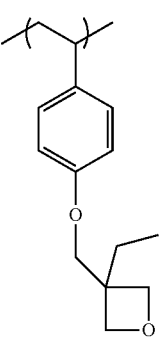
(a13-2-2)

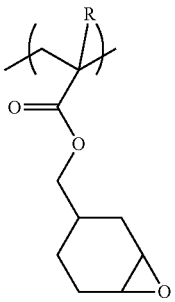
(a13-3-1)

In the formulas, R is the same as defined above.

As the structural unit (a13) contained in the component (A1), 1 type of structural unit may be used, or 2 or more types may be used.

When the component (A1) contains the structural unit (a13), the amount of the structural unit (a13) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a13) is at least as large as the lower limit of the above-mentioned range, the effect of using the structural unit (a13) can be satisfactorily achieved. On the other hand, when the amount of the structural unit (a13) is no more than the upper limit of the above-mentioned range, a good balance can be achieved with the other structural units, and various lithography properties such as DOF and CDU and pattern shape can be improved.

As the component (A1), a copolymer having any one of the structural units (a1), (a2), (a3), (a4), (a5) and (a13) is preferable; a copolymer having the structural units (a1) and (a2), a copolymer having the structural units (a1), (a2) and (a5), and a copolymer having the structural units (a1), (a2), (a3) and (a13) are more preferable.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A1), one type may be used alone, or two or more types may be used in combination.

In the base component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the resist composition of the present invention, as the component (A), one type may be used, or two or more types may be used in combination.

In the resist composition of the present invention, the amount of the component (A) can be appropriately adjusted depending on the thickness of the resist film to be formed, and the like.

<Acid Generator Component; Component (B)>

The resist composition of the present invention may further include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, onium salt acid generators are preferably used.

Examples of the onium salt acid generators include a compound represented by general formula (b-1) shown below (hereafter, sometimes referred to as "component (b-1)"), a compound represented by general formula (b-2) shown below (hereafter, sometimes referred to as "component (b-2)") and a compound represented by general formula (b-3) shown below (hereafter, sometimes referred to as "component (b-3)").

[Chemical Formula 46]

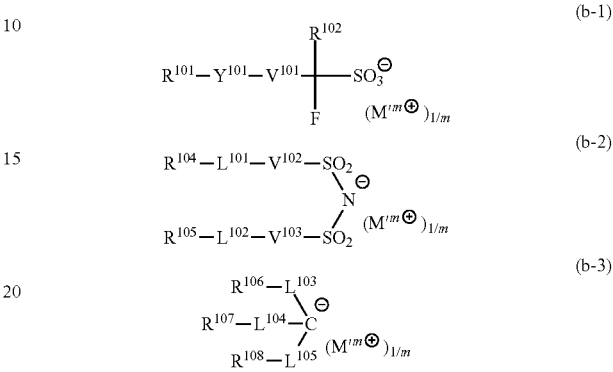

In the formulas, $R^{101}$ and $R^{104}$ to $R^{108}$ each independently represents a cyclic group with or without a substituent, a chain-like alkyl group with or without a substituent or a chain-like alkenyl group with or without a substituent, provided that, $R^{104}$ and $R^{105}$ may be mutually bonded to form a ring; provided that, two of $R^{106}$ to $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ to $L^{102}$ each independently represents a single bond or an oxygen atom; $L^{103}$ to $L^{105}$ each independently represents a single bond, —CO— or —SO$_2$—; $M'^{m+}$ represents an organic cation having a valency of m; and m represents an integer of 1 or more.

{Anion Moiety}

Anion Moiety of Component (b-1)

In the formula (b-1), $R^{101}$ represents a cyclic group with or without a substituent, a chain-like alkyl group with or without a substituent or a chain-like alkenyl group with or without a substituent.

(Cyclic Group with or without a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for Va$^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for Va$^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —SO₂— containing cyclic groups represented by the aforementioned formulas (a5-r-1) to (a5-r-4) and heterocycles shown below.

[Chemical Formula 47]

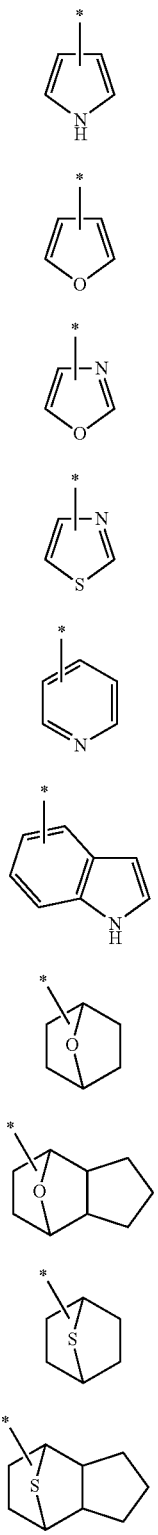
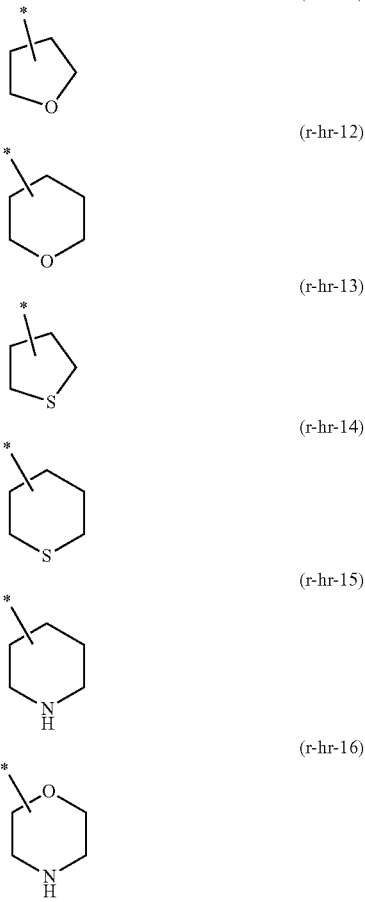

As the substituent for substituting the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent include a fluorine atom, a chlorine atom, a bromine atom and an iodine atom, and a fluorine atom is preferable.

Example of the halogenated alkyl group as a substituent includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

(Chain-Like Alkyl Group with or without a Substituent)

The chain-like alkyl group for $R^{101}$ may be either linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group with or without a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and particularly preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for substituting the chain-like alkyl group or alkenyl group for $R^{101}$, an alkoxy group, a halogen atom, a halogenated alkyl group, a hydroxyl group, a carbonyl group, a nitro group, an amino group, the same cyclic group as described above for $R^{101}$ or the like can be used.

Among these, as $R^{101}$, a cyclic group with or without a substituent is preferable, and a cyclic hydrocarbon group with or without a substituent is more preferable. Specific examples include a group in which one or more hydrogen atoms have been removed from a phenyl group, a naphthyl group or a polycycloalkane, lactone-containing cyclic groups represented by the aforementioned formulae (a2-r-1) to (a2-r-7) and —$SO_2$— containing cyclic groups represented by the aforementioned formulae (a5-r-1) to (a5-r-4) and the like.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linkage groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—) and a carbonate group (—O—C(=O)—O—); and a combination of any of the aforementioned non-hydrocarbon, oxygen atom-containing linking groups with an alkylene group. Furthermore, the combinations may have a sulfonyl group (—$SO_2$—) bonded thereto. As the combination, the linking groups represented by formulae (y-al-1) to (y-al-7) shown below can be mentioned.

[Chemical Formula 48]

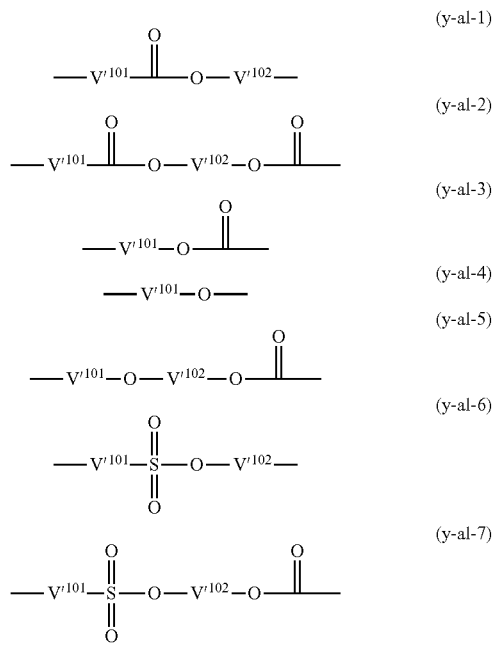

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

As the alkylene group for $V'^{101}$ and $v'^{102}$, a linear alkylene group or a branched alkylene group can be used, and a linear alkylene group is preferable.

Specific examples of the alkylene group for $V'^{101}$ and $V'^{102}$ include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group)[—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group described above for $Ra'^3$ in the aforementioned formula (a1-r-1), and a cyclohexylene group, 1,5-adamantylene group or 2,6-adamantylene group is more preferable.

$Y^{101}$ is preferably a divalent linking group containing an ether bond or an ester bond, and linking groups represented by the aforementioned formulas (y-al-1) to (y-al-5) are preferable.

In the formula (b-1), $V^{101}$ represents a single bond, an alkylene group or a fluorinated alkylene group. The alkylene group or fluorinated alkylene group for $V^{101}$ preferably has 1 to 4 carbon atoms. As the fluorinated alkylene group for $V^{101}$, a group in which part or all of the hydrogen atoms within the aforementioned alkylene group for $V^{101}$ has been substituted with fluorine atoms can be used. Among these, $V^{101}$ is preferably a single bond or a fluorinated alkylene group of 1 to 4 carbon atoms.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and is more preferably a fluorine atom.

As specific examples of anion moieties in the compound (b-1), when $Y^{101}$ is a single bond, fluorinated alkylsulfonate anions such as a trifluoromethanesulfonate anion or a perfluorobutanesulfonate anion can be mentioned; and when $Y^{101}$ is a divalent linking group containing an oxygen atom, anions represented by formulae (an-1) to (an-3) shown below can be mentioned.

[Chemical Formula 49]

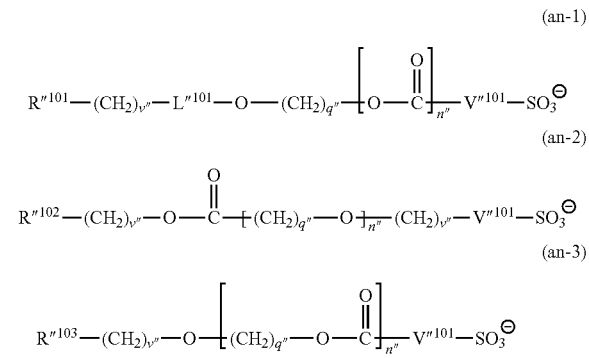

In the formulae, $R'''^{101}$ represents an aliphatic cyclic group with or without a substituent, a group represented by any one of the aforementioned formulae (r-hr-1) to (r-hr-6) or a chain-like alkyl group with or without a substituent; $R'''^{102}$ represents an aliphatic cyclic group with or without a substituent, a lactone-containing cyclic group represented by any one of the formulae (a2-r-1) to (a2-r-7) or an —$SO_2$— containing cyclic group represented by any one of the formulae (a5-r-1) to (a5-r-4); $R'''^{103}$ represents an aromatic cyclic group with or without a substituent, an aliphatic cyclic group with or without a substituent or a chain-like alkenyl group with or without a substituent; $V'''^{101}$ represents a fluorinated alkylene group; $L'''^{101}$ represents —C(=O)— or —$SO_2$—; v" each independently represents an integer of 0 to 3; q" each independently represents an integer of 1 to 20; n" represents 0 or 1.

As the aliphatic cyclic group for $R'''^{101}$, $R'''^{102}$ and $R'''^{103}$ with or without a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ with or without a substituent, the same groups as the aromatic hydrocarbon group exemplified as a cyclic hydrocarbon group for $R^{101}$ described above are preferable. As the substituent, the same groups as those described above for substituting the aromatic hydrocarbon group for $R^{101}$ can be mentioned.

As the chain-like alkyl group for $R'''^{101}$ with or without a substituent, the same groups exemplified as the chain-like alkyl group for $R^{101}$ are preferable. As the chain-like alkenyl group for $R'''^{103}$ with or without a substituent, the same groups exemplified above as the chain-like alkenyl group for $R^{101}$ are preferable. $V'''^{101}$ is preferably a fluorinated alkylene group of 1 to 3 carbon atoms, and particularly preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group with or without a substituent, a chain-like alkyl group with or without a substituent or a chain-like alkenyl group with or without a substituent, and is the same groups as those defined above for $R^{101}$ in the aforementioned formula (b-1), provided that, $R^{104}$ and $R^{105}$ may be mutually bonded to form a ring.

As $R^{104}$ and $R^{105}$, a chain-like alkyl group with or without a substituent is preferable, and a linear or branched alkyl group or a linear or branched fluorinated alkyl group is more preferable.

The chain-like alkyl group preferably has 1 to 10 carbon atoms, preferably 1 to 7, and more preferably 1 to 3. The smaller the number of carbon atoms of the chain-like alkyl group for $R^{104}$ and $R^{105}$ within the above-mentioned range of the number of carbon atoms, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same groups as those defined above for $V^{101}$ in the aforementioned formula (b-1).

In the formula (b-2), $L^{101}$ and $L^{102}$ each independently represents a single bond or an oxygen atom.

Anion Moiety of Component (b-3)

In formula (b-3), $R^{106}$ and $R^{108}$ each independently represents a cyclic group with or without a substituent, a chain-like alkyl group with or without a substituent or a chain-like alkenyl group with or without a substituent, and is the same groups as those defined above for $R^{101}$ in the aforementioned formula (b-1), $L^{103}$ to $L^{105}$ each independently represents a single bond, —CO— or —$SO_2$—.

{Cation Moiety}

In the formulas (b-1), (b-2) and (b-3), $M'^{m+}$ represents an organic cation having a valency of m, provided that the cation moiety in the compound represented by (b1-1) is excluded. Among these, a sulfonium cation or an iodonium cation is preferable, and cation moieties represented by general formulae (ca-1) to (ca-4) shown below are particularly preferable.

[Chemical Formula 50]

-continued (ca-2)

$$R^{204}-\overset{\oplus}{I}-R^{205}$$

(ca-3)

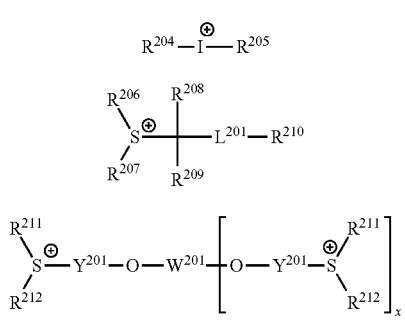

(ca-4)

$$\begin{bmatrix} R^{211} \\ \diagdown \\ S^{\oplus}-Y^{201}-O-W^{201} \\ / \\ R^{212} \end{bmatrix} \begin{bmatrix} O-Y^{201}-S^{\oplus} \\ \diagdown \\ R^{212} \end{bmatrix}_x$$

In the formulas, each of $R^{201}$ to $R^{207}$, $R^{211}$ and $R^{212}$ independently represents an aryl group with or without a substituent, an alkyl group with or without a substituent or an alkenyl group with or without a substituent; $R^{201}$ to $R^{203}$, $R^{206}$, $R^{207}$, $R^{211}$ and $R^{212}$ may be mutually bonded to form a ring with the sulfur atom; $R^{208}$ and $R^{209}$ each represents a hydrogen atom or an alkyl group of 1 to 5 carbon atoms; $R^{210}$ represents an aryl group with or without a substituent, an alkyl group with or without a substituent, an alkenyl group with or without a substituent or an —$SO_2$— containing cyclic group with or without a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

As the alkyl group for $R^{201}$ to $R^{207}$, $R^{211}$ and $R^{212}$, a chain-like or cyclic alkyl group of 1 to 30 carbon atoms is preferable.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$, $R^{210}$ and $R^{212}$ may have include an alkyl group, a halogen atom, a halogenated alkyl group, a carbonyl group, a cyano group, an amino group, an aryl group, an arylthio group and groups represented by formulas (ca-r-1) to (ca-r-7) shown below.

As the aryl group within the arylthio group as a substituent, the same aryl groups as those described above for $R^{101}$ can be mentioned, and specific examples of the arylthio group include a phenylthio group or a biphenylthio group.

[Chemical Formula 51]

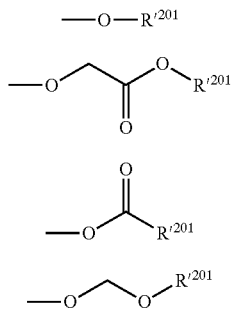

[ca-r-1]

[ca-r-2]

[ca-r-3]

[ca-r-4]

[ca-r-5]

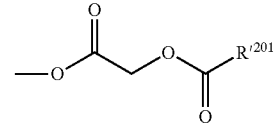

[ca-r-6]

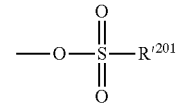

[ca-r-7]

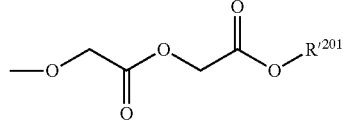

In the formulae, $R'^{201}$ each independently represents a hydrogen atom, a cyclic group with or without a substituent, a chain-like alkyl group with or without a substituent or a chain-like alkenyl group with or without a substituent.

As the cyclic group with or without a substituent, the chain-like alkyl group with or without a substituent and the chain-like alkenyl group with or without a substituent for $R'^{201}$, the same groups as those described above for $R^{101}$ in the aforementioned formula (b-1) can be mentioned. As the cyclic group with or without a substituent and chain-like alkyl group with or without a substituent, the same groups as those described above for the acid dissociable group represented by the aforementioned formula (a1-r-2) can be also mentioned.

When $R^{201}$ and $R^{203}$, $R^{206}$ and $R^{207}$, and $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— (wherein $R_N$ represents an alkyl group of 1 to 5 carbon atoms). As the ring to be formed, the ring containing the sulfur atom in the skeleton thereof is preferably a 3 to 10-membered ring, and particularly preferably a 5 to 7-membered ring. Examples of the formed ring include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring and a tetrahydrothiopyranium ring.

$R^{208}$ and $R^{209}$ each independently represents a hydrogen atom or an alkyl group of 1 to 5 carbon atoms, is preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group with or without a substituent, an alkyl group with or without a substituent, an alkenyl group with or without a substituent or an —$SO_2$-containing cyclic group with or without a substituent.

As the aryl group for $R^{210}$, an unsubstituted aryl group of 6 to 20 carbon atoms can be mentioned, and a phenyl group or a naphthyl group is preferable.

As the alkyl group for $R^{210}$, a chain-like or cyclic alkyl group of 1 to 30 carbon atoms is preferable.

The alkenyl group for $R^{210}$ preferably has 2 to 10 carbon atoms.

As the —$SO_2$— containing cyclic group for $R^{210}$ with or without a substituent, the same groups as the "—$SO_2$— containing cyclic group" for $Ra^{21}$ in the general formula (a2-1) can be mentioned, and the group represented by the aforementioned general formula (a5-r-1) is preferable.

$Y^{201}$ each independently represents an arylene group, an alkylene group or an alkenylene group.

As the arylene group for $Y^{201}$, a group in which one hydrogen atom has been removed from an aryl group exemplified as an aromatic hydrocarbon group for $R^{101}$ in the aforementioned formula (b-1) can be mentioned.

As the alkylene group and the alkenylene group for $Y^{201}$, the same aliphatic hydrocarbon group as those described above for the divalent hydrocarbon group for $Va^1$ in the aforementioned general formula (a1-1) can be mentioned.

In the formula (ca-4), x represents 1 or 2.

$W^{201}$ represents a linking group having a valency of (x+1), that is, a divalent or trivalent linking group.

As the divalent linking group for $W^{201}$, a divalent hydrocarbon groups with or without a substituent is preferable, and as examples thereof, the same hydrocarbon group as those described above for $Ya^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. As the arylene group, a phenylene group and a naphthylene group can be mentioned. Of these, a phenylene group is particularly desirable.

As the trivalent linking group for $W^{201}$, a group in which one hydrogen atom has been removed from the aforementioned divalent linking group for $W^{201}$, and a group in which the divalent linking group has been bonded to an another divalent linking group can be mentioned. The trivalent linking group for $W^{201}$ is preferably an arylene group having two carbonyl groups bonded thereto.

Specific examples of preferable cations represented by formula (ca-1) include cations represented by formulas (ca-1-1) to (ca-1-63) shown below.

[Chemical Formula 52]

(ca-1-1)

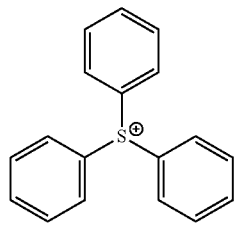

(ca-1-2)

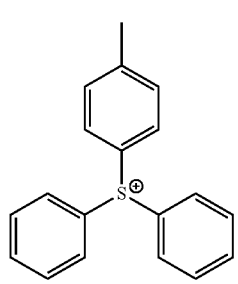

(ca-1-3)

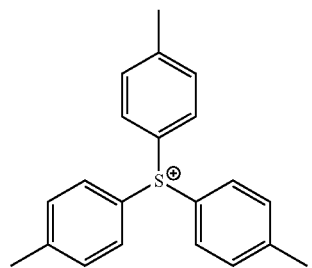

(ca-1-4)

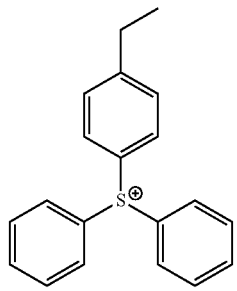

(ca-1-5)

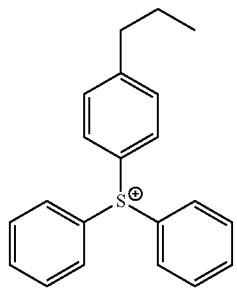

(ca-1-6)

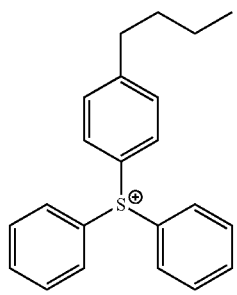

(ca-1-7)

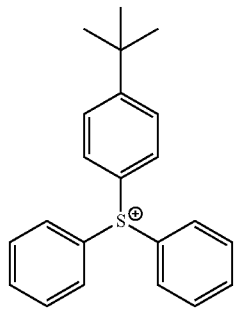

(ca-1-8)
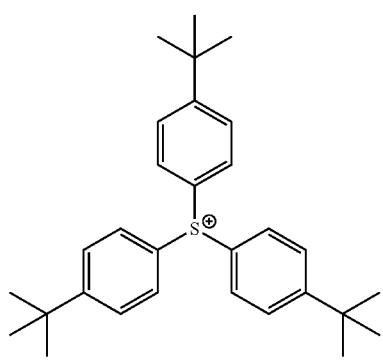
(ca-1-9)
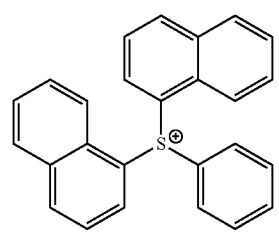
(ca-1-10)
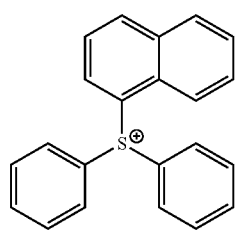
(ca-1-11)
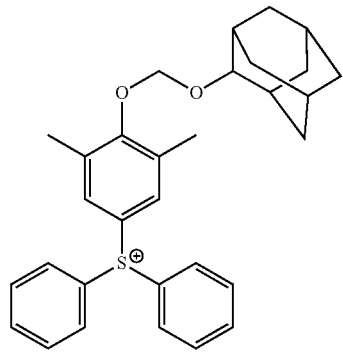
(ca-1-12)
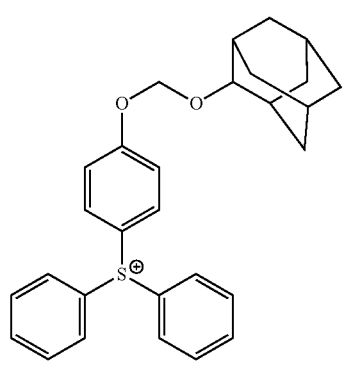
(ca-1-13)
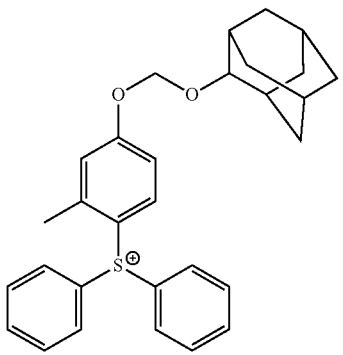
(ca-1-14)
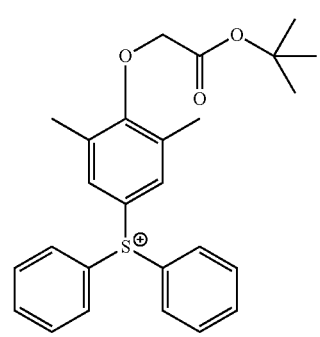
(ca-1-15)
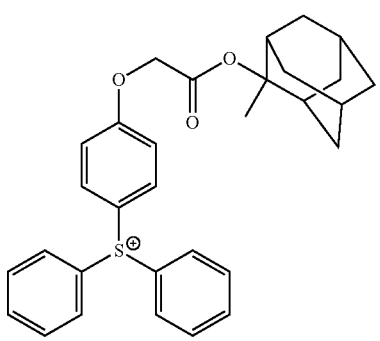
(ca-1-16)
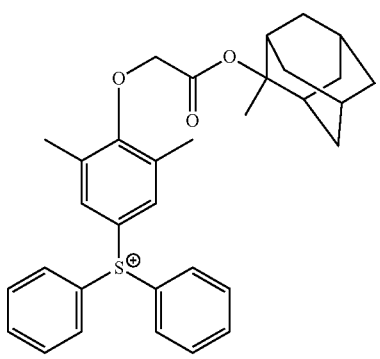

[Chemical Formula 53]
(ca-1-17)
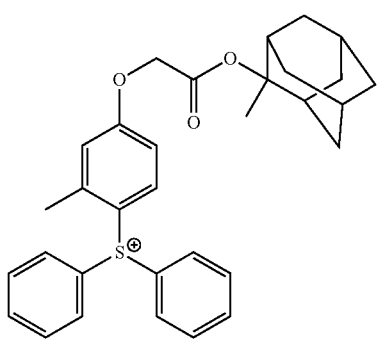
(ca-1-18)
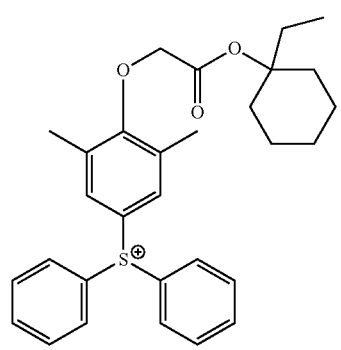
(ca-1-19)
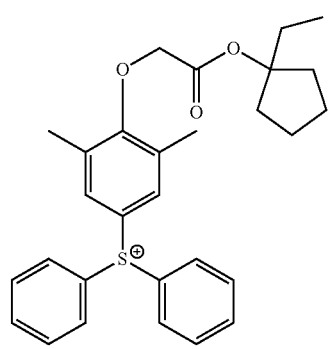
(ca-1-20)
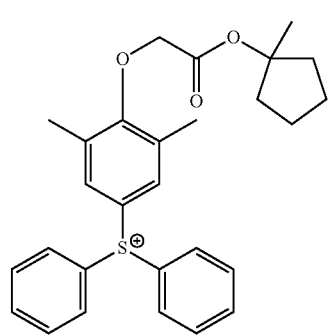
(ca-1-21)
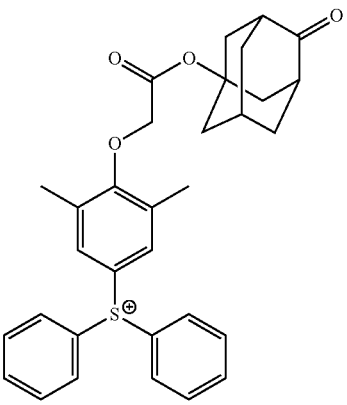
(ca-1-22)
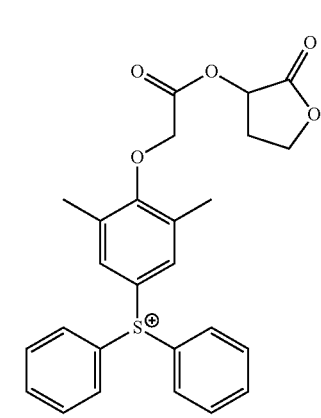
(ca-1-23)
(ca-1-24)

(ca-1-25)
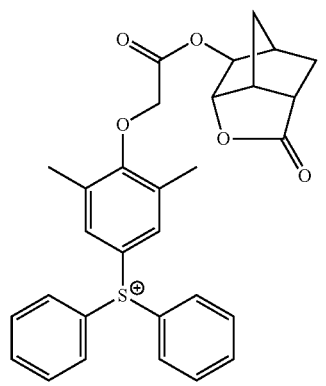
(ca-1-26)
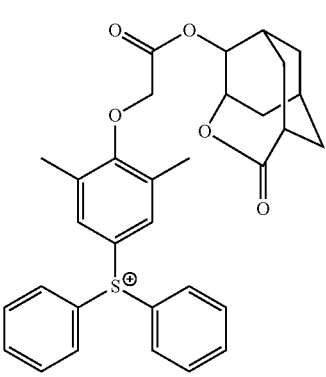
(ca-1-27)
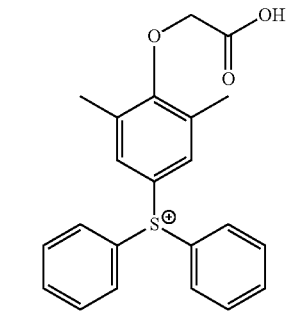
(ca-1-28)
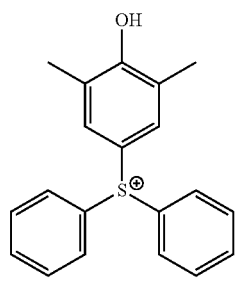
(ca-1-29)
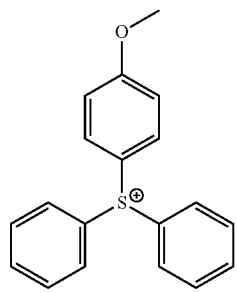
(ca-1-30)
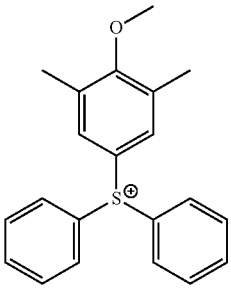
(ca-1-31)
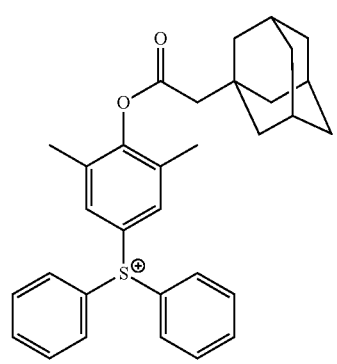
(ca-1-32)
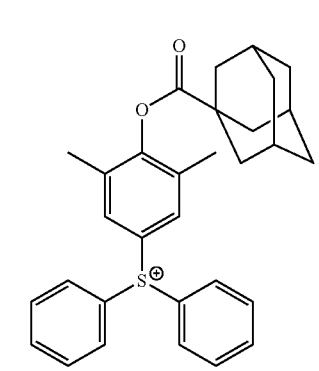
(ca-1-33)
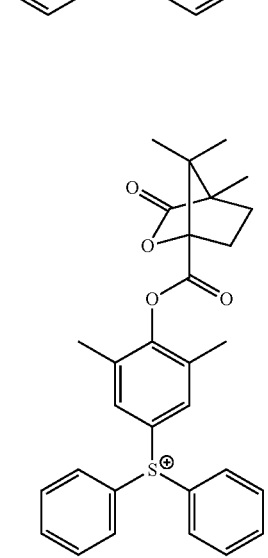

[Chemical Formula 54]
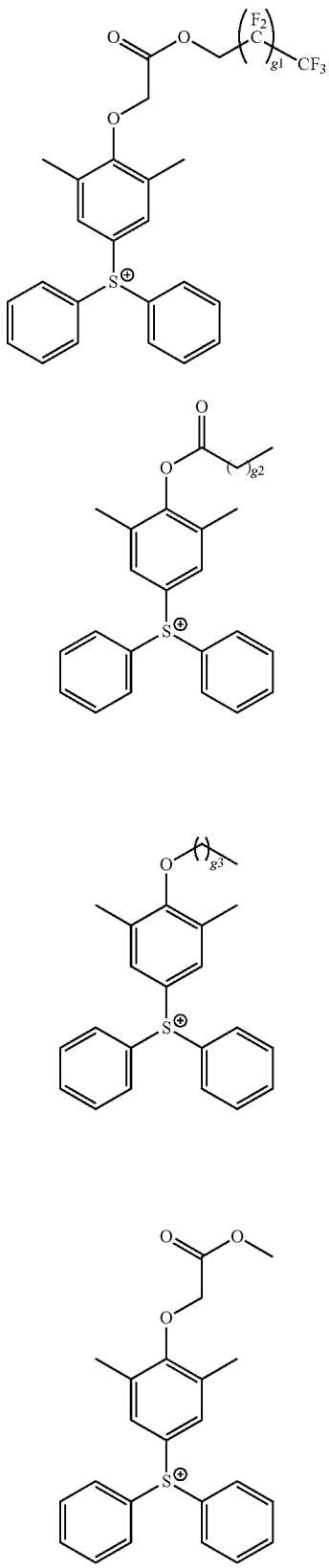
(ca-1-34)
(ca-1-35)
(ca-1-36)
(ca-1-37)
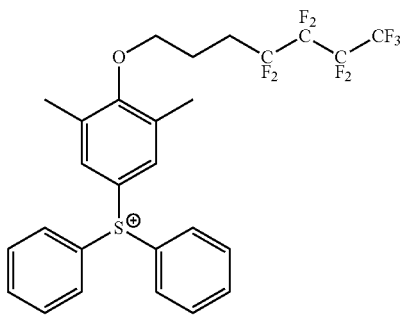
(ca-1-38)
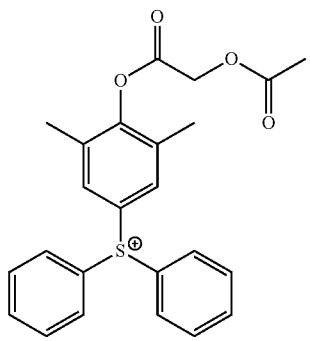
(ca-1-39)
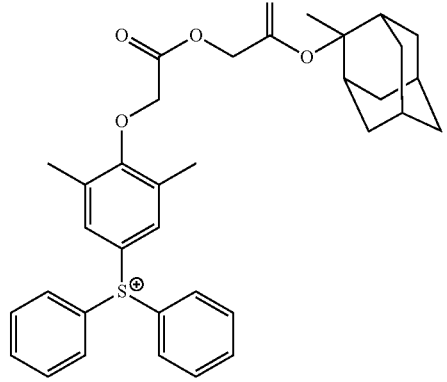
(ca-1-40)
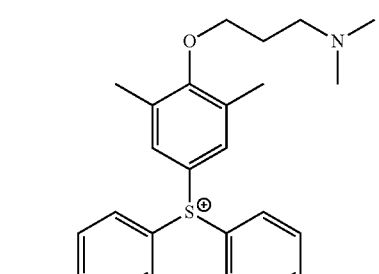
(ca-1-41)
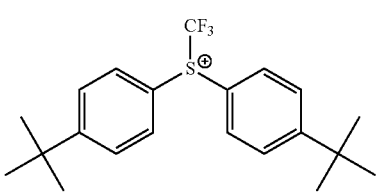
(ca-1-42)

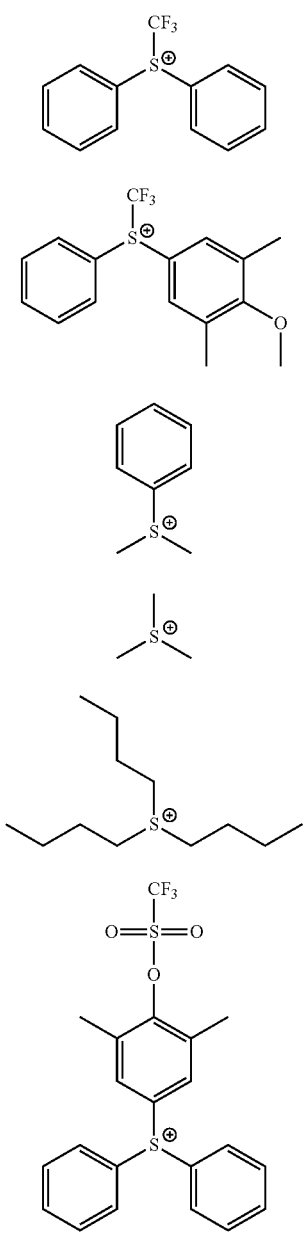
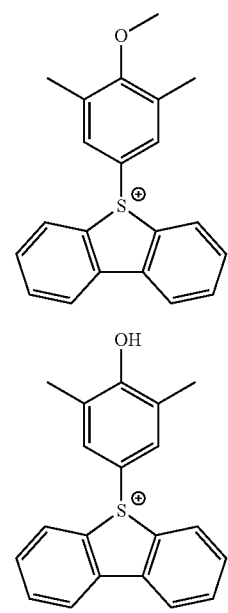
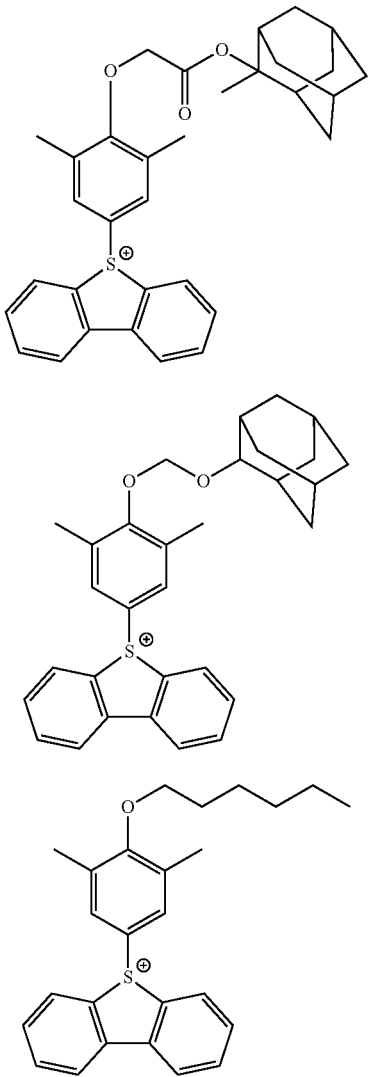
In the formulas, g1, g2 and g3 represent recurring numbers, wherein g1 is an integer of 1 to 5, g2 is an integer of 0 to 20, and g3 is an integer of 0 to 20.
[Chemical Formula 55]
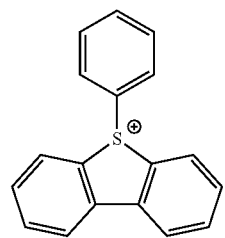

(ca-1-55) 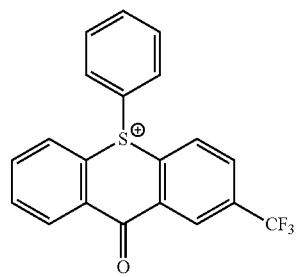
(ca-1-56) 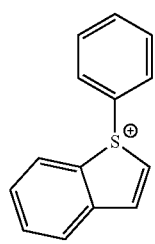
(ca-1-57) 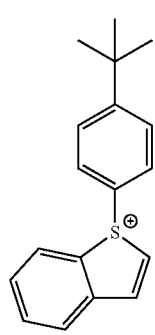
(ca-1-58) 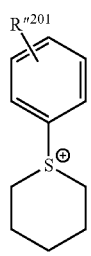
(ca-1-59) 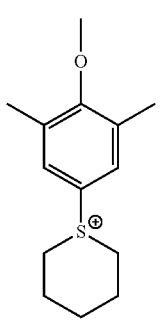
(ca-1-60) 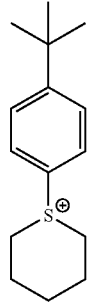
(ca-1-61) 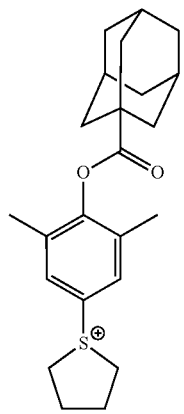
(ca-1-62) 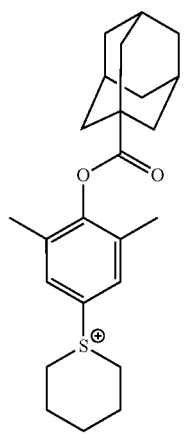
(ca-1-63) 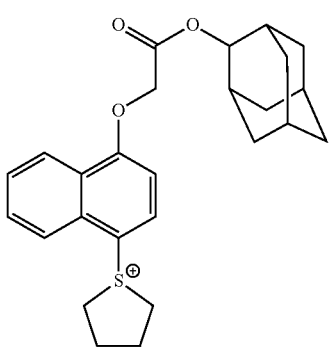
In the formulas, $R''^{201}$ represents a hydrogen atom or a substituent, and as the substituent, the same groups as those described above for substituting the $R^{201}$ to $R^{207}$ and $R^{210}$ to $R^{212}$ can be mentioned.

Specific examples of preferable cations represented by the formula (ca-3) include cations represented by formulae (ca-3-1) to (ca-3-6) shown below.

[Chemical Formula 56]

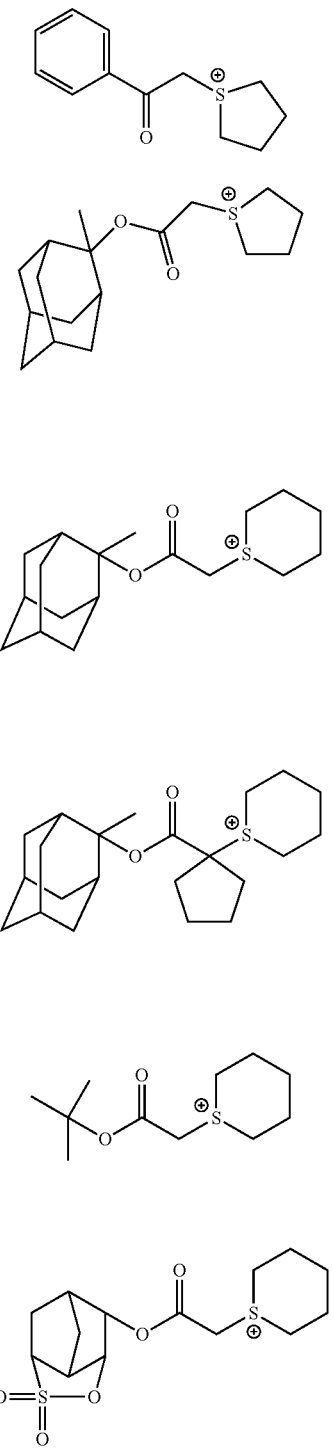

Specific examples of preferable cations represented by formula (ca-4) include cations represented by formulas (ca-4-1) to (ca-4-2) shown below.

[Chemical Formula 57]

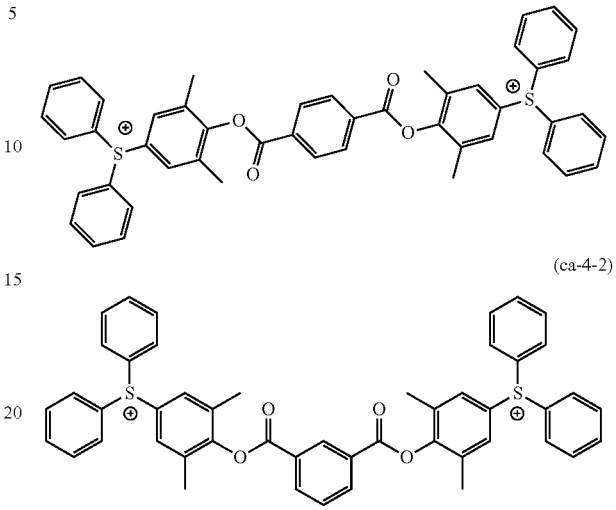

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components is dissolved in an organic solvent, an uniform solution can be obtained and the storage stability becomes satisfactory.

<Basic Compound Component; Component (D)>

Moreover, the resist composition of the present invention may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) function as a quencher.

[Chemical Formula 58]

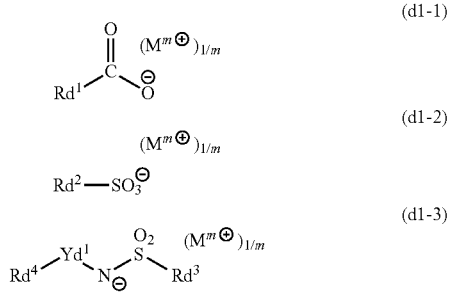

In the formulae, $Rd^1$ to $Rd^4$ represents a cyclic group with or without a substituent, a chain-like alkyl group with or without a substituent or a chain-like alkenyl group with or without a substituent; provided that, in the formula (d1-2), the carbon atom within the $Rd^2$ adjacent to the sulfur atom has no fluorine atom bonded thereto; $Yd^1$ represents a single bond or a divalent linking group; $M^{m+}$ each independently represents an organic cation having a valency of m; and m represents an integer of 1 or more.

{Component (d1-1)}
Anion Moiety

In formula (d1-1), $Rd^1$ represents a cyclic group with or without a substituent, a chain-like alkyl group with or without a substituent or a chain-like alkenyl group with or without a substituent, and is the same groups as those defined above for $R^{101}$.

Among these, as the group for $Rd^1$, an aromatic hydrocarbon group with or without a substituent, an aliphatic cyclic group with or without a substituent and a chain-like hydrocarbon group with or without a substituent are preferable. As the substituents which these groups may have, a hydroxy group, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

When the chain-like alkyl group is a fluorinated alkyl group containing a fluorine atom or a fluorinated alkyl group as a substituent, the fluorinated alkyl group preferably has 1 to 11 carbon atoms, more preferably 1 to 8, and still more preferably 1 to 4. The fluorinated alkyl group may contain an atom other than fluorine. Examples of the atom other than fluorine include an oxygen atom, a carbon atom, a hydrogen atom, a sulfur atom and a nitrogen atom.

As for $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 59]

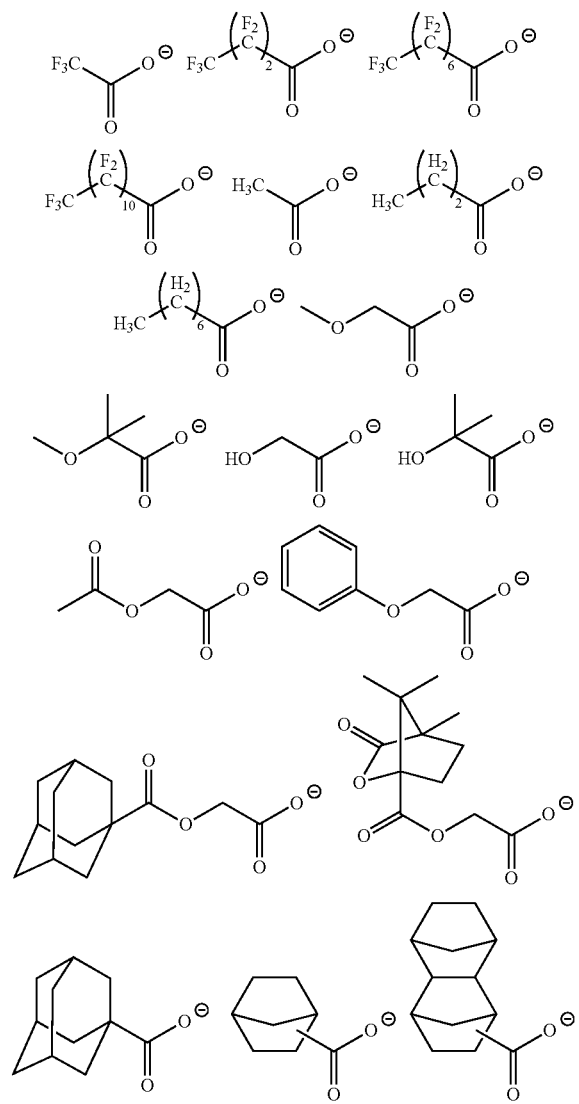

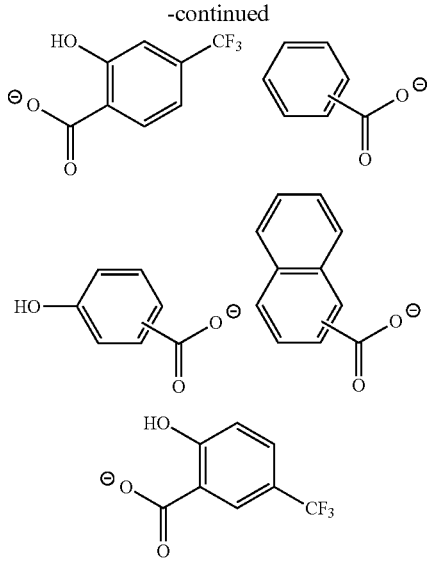

Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{(Component (d1-2)}

Anion Moiety

In formula (d1-2), $Rd^2$ represents a cyclic group with or without a substituent, a chain-like alkyl group with or without a substituent or a chain-like alkenyl group with or without a substituent, and is the same groups as those defined above for $R^{101}$.

provided that, the carbon atom within $Rd^2$ group adjacent to the sulfur atom has no fluorine atom bonded thereto (i.e., the carbon atom within $Rd^2$ group adjacent to the sulfur atom is not substituted with a fluorine atom). As a result, the anion of the component (d1-2) becomes an appropriately weak acid anion, thereby improving the quenching ability of the component (D).

As $Rd^2$, an aliphatic cyclic group with or without a substituent is preferable, and a group in which one or more hydrogen atoms have been removed from adamantane, norbornane, isobornane, tricyclodecane or tetracyclododecane (with or without a substituent); or a group in which one or more hydrogen atoms have been removed from camphor is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for Rd' in the formula (d1-1) can be mentioned.

Specific examples of preferable anion moieties for the component (d1-2) are shown below.

[Chemical Formula 60]

Cation Moiety

In formula (d1-2), $M'^{m+}$ is an organic cation having a valency of m, and is the same as defined for $M'^{m+}$ in the aforementioned formula (d1-1).

As the component (d1-2), one type of compound may be used, or two or more types of compounds may be used in combination.

{(Component (d1-3)}

Anion Moiety

In formula (d1-3), $Rd^3$ represents a cyclic group with or without a substituent, a chain-like alkyl group with or without a substituent or a chain-like alkenyl group with or without a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group with or without a substituent, a chain-like alkyl group with or without a substituent or a chain-like alkenyl group with or without a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are desirable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoadsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) with or without a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these groups is preferable. As the alkylene group, a linear or branched alkylene group is more preferable, and a methylene group or an ethylene group is still more preferable.

Specific examples of preferable anion moieties for the component (d1-3) are shown below.

[Chemical Formula 61]

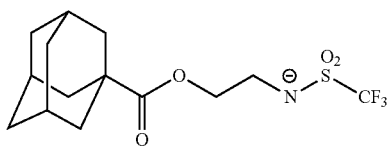

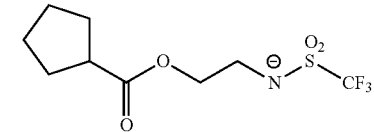

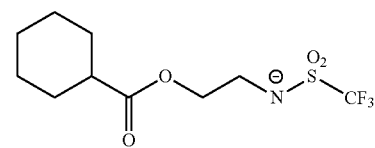

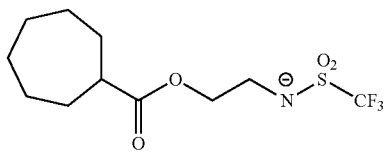

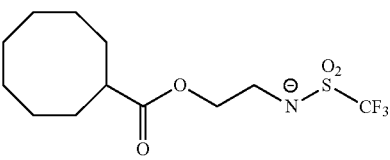

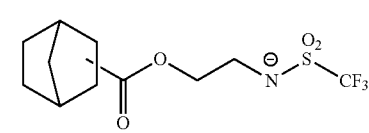

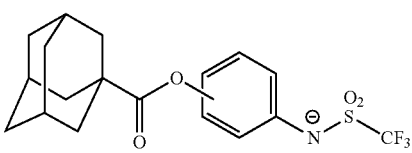

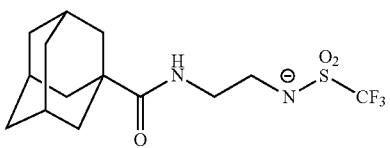

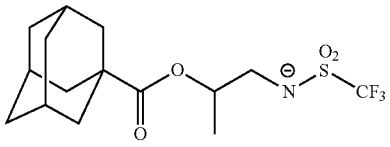

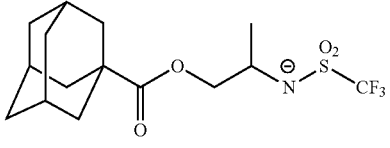

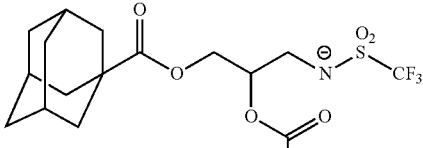

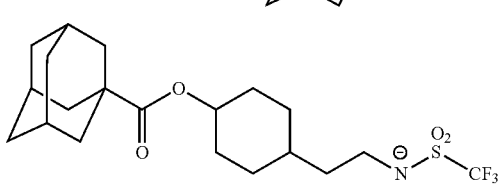

-continued

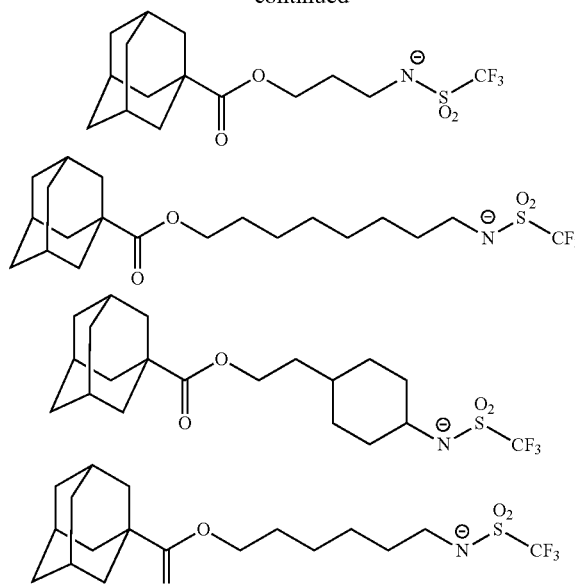

[Chemical Formula 62]

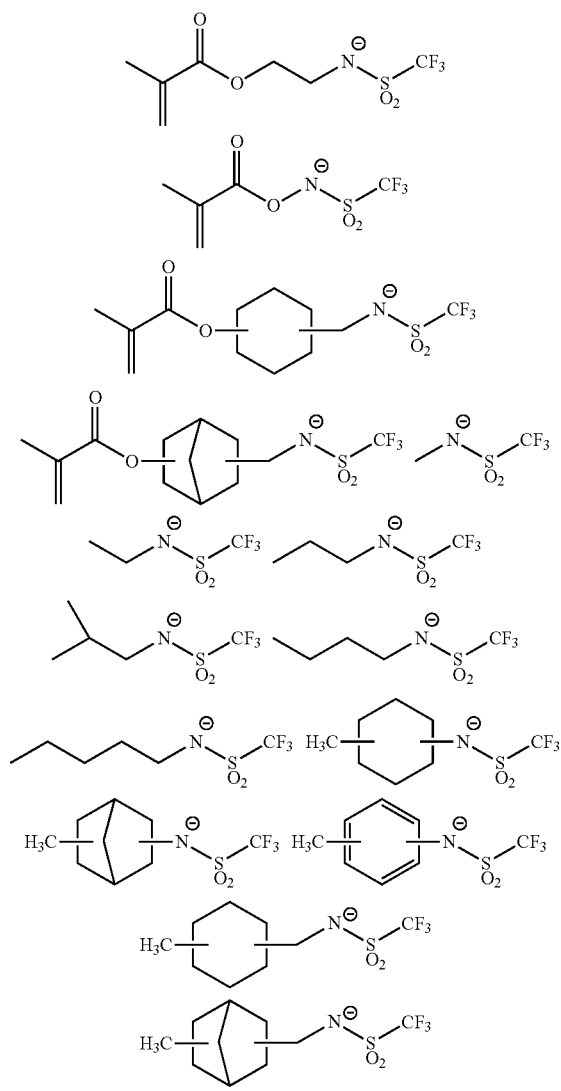

-continued

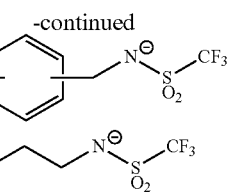

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3) can be used, or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount is at least as large as the lower limit of the above-mentioned range, excellent lithography properties and excellent resist pattern shape can be obtained. On the other hand, when the amount is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxyl)ethyl}amine, tris{2-(2-methoxyethoxymethoxyl)ethyl}amine, tris{2-(1-methoxyethoxyl)ethyl}amine, tris{2-(1-ethoxyethoxyl)ethyl}amine, tris{2-(1-ethoxypropoxyl)ethyl}amine, tris[2-{2-(2-hydroxyethoxyl)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount is no more than the upper limit of the above-mentioned range, sensitivity can be maintained at a satisfactory level, and through-put becomes excellent.

<Optional Components>

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the aforementioned structural unit (a1); and a copolymer of a structural unit (f1) represented by the formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl(meth)acrylate or a structural unit represented by the aforementioned formula (a1-2-01) is preferable.

[Chemical Formula 63]

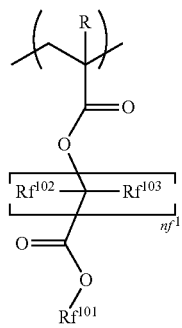

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ and $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, $-CH_2-CF_3$, $-CH_2-CF_2-CF_3$, $-CH(CF_3)_2$, $-CH_2-CH_2-CF_3$, $-CH_2-CH_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

In the present invention, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL weight ratio or PGMEA: cyclohexanone weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a resist solution to a substrate. In general, the organic solvent is used in an amount such that the solid content of the resist composition becomes within the range from 1 to 20% by weight, and preferably from 2 to 15% by weight.

Firstly, a resist composition of the present invention is applied to a neutralization film containing a surface treatment agent using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. In the present invention, bake treatment (post bake) can be conducted following the developing. In this manner, a resist pattern can be obtained. In the present invention, the bake treatment after development is preferably conducted at 180° C. or more, more preferably at 190° C. or more, and particularly preferably 200° C. or more.

In the present invention, when bake treatment after development is conducted at high temperature such as 180° C. or more, in a step in which a layer containing a block copolymer having a plurality of polymers bonded is formed so as to cover a resist pattern or a neutralization film, resistance of the resist pattern against the solvent contained in a layer containing a block copolymer can be imparted.

It is presumed that, by virtue of resistance of the resist pattern against the solvent contained in a layer containing a block copolymer, the block copolymer solution can be applied to the upper surface of the resist pattern, and phase-separation of the block copolymer can be conducted on the resist pattern.

By bake treatment at a high temperature, the resist pattern appropriately flows. As a result, the shape and height of the resist pattern 3 from the surface of the substrate (or from the surface of the neutralization film) becomes excellent, and a phase separation structure of a block copolymer can be formed on a resist pattern 3.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used, which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

As the organic solvent contained in the organic-based solvent used for developing, any of the conventional organic solvents can be used which are capable of dissolving the base component (A) (prior to exposure) can be appropriately selected. Specific examples of the organic solvent include ketone solvents, ester solvents, and nitrile solvents. As an ester solvent, butyl acetate is preferable. As a ketone solvent, methyl amyl ketone (2-heptanone) is preferable.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Examples of nitrile solvents include acetonitrile, propionitrile, valeronitrile, butyronitrile and the like.

If desired, the organic developing solution may have a conventional surfactant blended.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

In the formation of guide pattern, the guide pattern may be formed by nanoimprint lithography. The nanoimprint lithography is a method in which a mold having a predetermined pattern formed thereon is attached to a support having a resin layer formed thereon so as to transfer the mold pattern to the resin layer.

As the method of forming a guide pattern by the nanoimprint lithography, a method disclosed in Japanese Unexamined Patent Application, First Publication No. 2007-072374, Japanese Unexamined Patent Application, First Publication No. 2007-329276, and Japanese Unexamined Patent Application, First Publication No. 2008-246876 can be mentioned.

<<Method of Forming a Pattern>>

A second aspect of the present invention is a method of forming a pattern including: a step in which a phase comprising at least one block is selectively removed from a structure containing a phase-separated structure to form a pattern, the structure containing a phase-separated structure is produced by a method of the first aspect of the present invention.

Specifically, a method can be mentioned, in which after the formation of the phase separation structure, at least a portion of the phase of block $P_B$ is selectively removed from the layer containing the block copolymer formed on the substrate (the molecular weight is decreased) so as to form a pattern. By selectively removing a portion of the block $P_B$ in advance, the solubility in a developing solution can be enhanced. As a result, the phase of the block $P_B$ can be more reliably removed by selective removing than the phase of the block $P_A$.

The selective removal treatment is not particularly limited, as long as it is a treatment capable of decomposing and removing the block $P_B$ without affecting the block $P_A$. The selective removal treatment can be appropriately selected from any methods for removing a resin film, depending on the types of the block $P_A$ and the block $P_B$. Further, when a neutralization film is formed on the surface of the substrate in advance, the neutralization film is removed together with the phase of the block $P_B$. Examples of the removal treatment include an oxygen plasma treatment, an ozone treatment, a UV irradiation treatment, a heat decomposition treatment and a chemical decomposition treatment.

The substrate on which a pattern has been formed by a phase separation of the layer containing the block copolymer in the manner described above can be used without further modification, or may be subjected to an additional heat treatment to alter the shape of the polymer nanostructure on the substrate. The heat treatment is preferably conducted at a temperature at least as high as the glass transition temperature of the block copolymer used and lower than the heat decomposition temperature. Further, the heat treatment is preferably conducted in a low-reactive gas such as nitrogen.

<<Method of Forming a Fine Pattern>>

A third aspect of the present invention is a method of forming a fine pattern including: a step in which a substrate is subjected to etching using a pattern as a mask, the pattern is formed by the method of forming a pattern according to the second aspect.

[Etching Step]

The Etching step is a step in which a substrate is subjected to etching using a pattern formed from the phase-separated structure as a mask.

The method of etching is not particularly limited, and dry etching is preferable. Among dry etching, in terms of efficiency, oxygen ($O_2$)-plasma etching or etching using a $CF_4$ gas, a $CHF_3$ gas or an $Ar/CF_4$ gas is preferable, and oxygen-plasma etching is particularly desirable.

The condition during dry etching is not particularly limited, but can be appropriately determined depending on the type of material constituting the pattern of the phase-separated structure or the height of the pattern from the surface of the substrate. When oxygen plasma treatment is employed, the pressure during the oxygen plazma treatment is preferably 1.33 to 66.5 Pa (10 to 50 mtorr), and more preferably 13.3 to 26.6 Pa (100 to 200 mtorr). The plasma power during oxygen plasma treatment is preferably 5 to 500 W, and more preferably 5 to 50 W. The treatment time of the oxygen plasma treatment is preferably 1 to 100 seconds, and more preferably 2 to 60 seconds. The temperature during the oxygen plasma treatment is preferably −30 to 300° C., more preferably 0 to 100° C., and most preferably a room temperature (5 to 40° C.). The plasma equipment used for oxygen plasma treatment is not particularly limited, and for example, PE-2000 Plasma etcher (product name, manufactured by South Bay Technology, Inc., USA) and the like can be used.

EXAMPLES

As follows is a description of examples of the present invention, although the scope of the present invention is by no way limited by these examples.

Examples 1 to 3

Formation of Guide Pattern 100 parts by weight of a polymeric compound (A) shown below, 10.00 parts by weight of a compound (B) shown below, 1.2 parts by weight of tripentylamine, 2.0 parts by weight of salicylic acid, and 3.0 parts by weight of a fluorine-containing polymeric compound (F) were mixed and dissolved in propylene glycol monomethyl ether acetate (PGMEA) such that the solid content was adjusted to 5% by mass, thereby obtaining a resist composition.

An organic anti-reflection film composition (product name: ARC29, manufactured by Brewer Science Ltd.) was applied onto an 8-inch silicon wafer using a spinner, and the composition was then baked on a hot plate at 205° C. for 60 seconds and dried, thereby forming an organic anti-reflection film having a film thickness of 85 nm.

Next, as an undercoat agent, an undercoat agent composition 1 adjusted to a concentration within the range of 0.5 to 1.0% by weight using PGMEA was applied to the organic anti-reflection film using a spinner, and the composition was then baked and dried at 230° C. for 1 minute, thereby forming a layer composed of the undercoat agent having a thickness of 5 nm on the substrate.

Then, the resist composition obtained above was applied to the undercoat agent using a spinner, and was then pre-baked (PAB) on a hot plate at 85° C. for 60 seconds and dried, thereby forming a resist film having a film thickness of 70 nm.

Subsequently, the resist film was selectively irradiated with an ArF excimer laser (193 nm) through a mask pattern (6% half tone), using an ArF exposure apparatus NSR-5609B (manufactured by Nikon Corporation, NA=0.60, ⅔Ann).

Next, a post exposure bake (PEB) was conducted at 125° C. for 60 seconds, and negative-tone developing treatment was performed at 23° C. for 20 seconds using butyl acetate, followed by drying by shaking. Further, with respect to the pattern, a hard bake was conducted at 200° C. for 60 seconds.

As a result, trench-guide patterns having a width of 130, 140 or 150 nm were formed.

[Chemical Formula 64]

Polymeric compound (A)

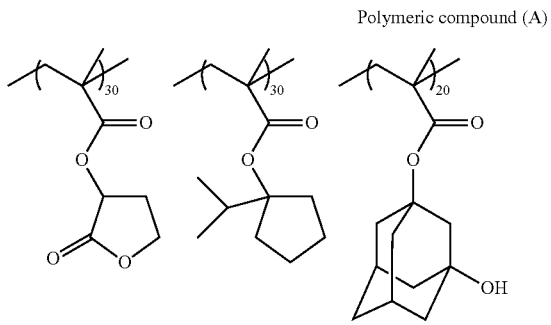

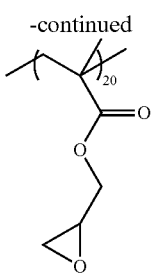

Compound (B)

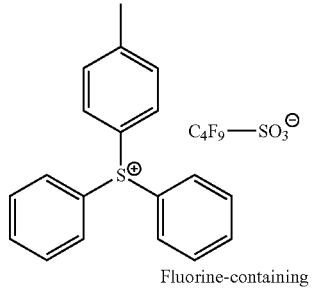

Fluorine-containing polymeric compound (F)

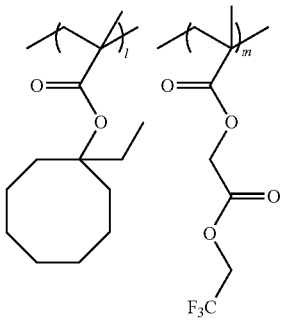

Component (F): l/m = 77/23 (molar ratio),
Mw = 23,100, Mw/Mn = 1.78

[Chemical Formula 65]

Undercoat agent composition 1

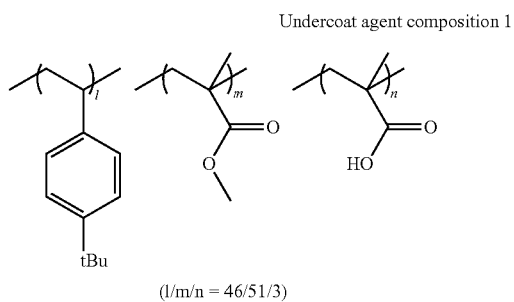

(l/m/n = 46/51/3)

Next, on the substrate having the resist pattern formed, a PGMEA solution containing propylene glycol monomethyl ether acetate (PGMEA) and 1.2% by weight of BCP1 shown below in terms of a solid content was spin-coated (number of revolution: 1,500 rpm, 60 seconds) under conditions in which a film having a thickness of 15 nm can be formed on a silicon substrate, and then bake treatment was conducted at 110° C. for 60 seconds, thereby forming a BCP1 layer having a film thickness of 15 nm. A pattern having a guide width of 130 nm was regarded as Reference Example 1, a pattern having a guide width of 140 nm was regarded as Reference Example 2, and a pattern having a guide width of 150 nm was regarded as Reference Example 3.

To the BCP1 layer, a solution of the TC material (TC-B shown below) dissolved in a mixed solvent (methanol:water=3:1) was applied, thereby forming a top coat film having a film thickness of 50 nm.

Subsequently, the substrate was heated at 210° C. for 3 minutes while flowing nitrogen, thereby forming a phase-separated structure.

Then, a solvent (mixed solvent: aqueous ammonia:methanol=1:3 (weight ratio)) was applied to the top coat film, thereby removing the top coat film.

Thereafter, the substrate on which the phase-separated structure had been formed was subjected to an oxygen plasma treatment (200 mL/minute, 40 Pa, 40° C., 200 W, 20 seconds) using TCA-3822 (manufactured by Tokyo Ohka Kogyo Co., Ltd.) to selectively remove the phase of PMMA. The surface of the obtained substrate was observed using a scanning electron microscope (SEM) SU8000 (manufactured by Hitachi High-Technologies Corporation).

The results are shown in Table 1.

[Chemical Formula 66]

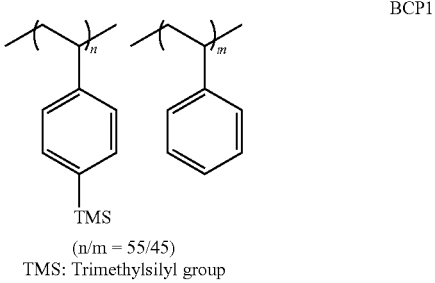

BCP1

(n/m = 55/45)
TMS: Trimethylsilyl group

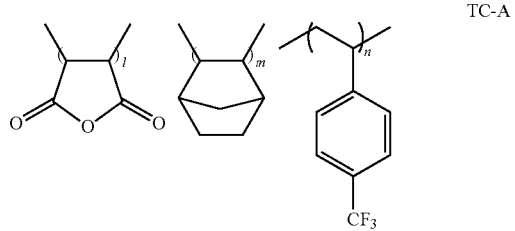

TC-A (l/m/n = 60/16/24)

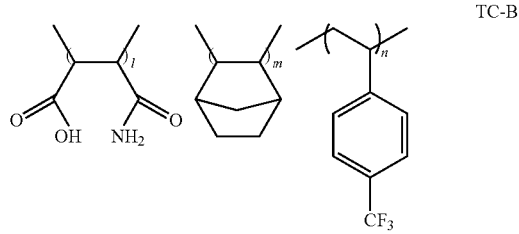

TC-B (l/m/n = 60/16/24)

Comparative Examples 1 to 3

Pattern formation procedure was conducted in the same manner as in Examples 1 to 3, except that a top coat film was not formed. A pattern having a guide width of 130 nm was regarded as Comparative Example 1, a pattern having a guide width of 140 nm was regarded as Comparative Example 2, and a pattern having a guide width of 150 nm was regarded as Comparative Example 3.

TABLE 1

|  | Guide width | Top coat | Pattern formation |
|---|---|---|---|
| Example 1 | 130 nm | Present | Formed |
| Example 2 | 140 nm | Present | Formed |
| Example 3 | 150 nm | Present | Formed |
| Comparative Example 1 | 130 nm | None | Could not be formed |
| Comparative Example 2 | 140 nm | None | Could not be formed |
| Comparative Example 3 | 150 nm | None | Could not be formed |

As shown in Table 1, in Examples 1 to 3 in which a top coat film was formed, a pattern could be formed. In Comparative Examples 1 to 3 in which a top coat film was not formed, a pattern could not be formed.

Examples 4 and 5

Comparative Example 4

An organic anti-reflection film composition (product name: ARC29, manufactured by Brewer Science Ltd.) was applied onto an 8-inch silicon wafer using a spinner, and the composition was then baked on a hot plate at 205° C. for 60 seconds and dried, thereby forming an organic anti-reflection film having a film thickness of 85 nm.

Next, as an undercoat agent, an undercoat agent composition 1 shown above (l/m/n=46/51/3) adjusted to a concentration within the range of 0.5 to 1.0% by weight using PGMEA was applied to the organic anti-reflection film using a spinner, and the composition was then baked and dried at 230° C. for 1 minute, thereby forming a layer composed of the undercoat agent having a film thickness of 4 nm on the substrate.

Then, the resist composition obtained above was applied to the undercoat agent using a spinner, and was then pre-baked (PAB) on a hot plate at 85° C. for 60 seconds and dried, thereby forming a resist film having a film thickness of 70 nm.

Subsequently, the resist film was irradiated with an ArF excimer laser (193 nm) using an ArF exposure apparatus NSR-5308 (manufactured by Nikon Corporation, Dipole).

Next, a post exposure bake (PEB) was conducted at 100° C. for 60 seconds, and negative-tone developing treatment was performed at 23° C. for 13 seconds using butyl acetate, followed by drying by shaking. Further, with respect to the pattern, a hard bake was conducted at 140° C. for 60 seconds and then conducted at 200° C. for 60 seconds.

A solution in which a top coat material indicated in Table 2 was dissolved in a mixed solvent indicated in Table 2 was spin-coated on the guide pattern to form a top coat film, and then, bake was conducted at 210° C. for 60 seconds. After cooling, 2.38% by weight aqueous solution of tetramethylammonium hydroxide (TMAH) (product name: NMD-3; manufactured by Tokyo Ohka Kogyo Co., Ltd.) was applied to the top coat film so as to remove the top coat film, and then the height of the guide pattern was observed using a scanning electron microscope (SEM) SU8000 (manufactured by Hitachi High-Technologies Corporation). The pH value of the top coat solution of the top coat material was determined using a pH test paper. The results are shown in Table 2. In Table 2, "TC" indicates "top coat".

TABLE 2

|  | Height of guide pattern before TC treatment (nm) | Height of guide pattern after TC treatment (nm) (TC material) <TC solvent> | Solution property (pH) |
|---|---|---|---|
| Example 4 | 57 | 54 (TC-B) <methanol:water = 3:1> | 7 |
| Example 5 | 57 | 55 (TC-B) <ethanol:water = 3:1> | 7 |
| Comparative Example 4 | 57 | 37 (TC-A) <28% aqueous ammonia:methanol = 1:3> | >12 |

As seen from the results, it was confirmed that, in Comparative Example 4 in which a top coat solution having a basicity was used, the height of guide was largely reduced, and the guide pattern was damaged by the basic solution. In contrast, it was confirmed that, in Examples 1 and 2 in which a neutral top coat solution was used, the height of the guide pattern was not largely changed before and after application of the top coat solution, and the guide pattern was not damaged by the top coat solution.

DESCRIPTION OF REFERENCE NUMERALS AND CHARACTERS

1: substrate, 2: guide pattern, 3: layer including Si-containing block copolymer, 4: top coat film, 5: neutralization film

What is claimed is:

1. A method of producing a structure containing guide patterns and a phase-separated structure on a substrate, comprising:
    forming the guide patterns on the substrate, wherein the guide patterns are formed of a resin susceptible to degradation by a base;
    forming a layer including an Si-containing block copolymer having a plurality of blocks bonded between the guide patterns on the substrate;
    applying a solution of a top coat material to the layer and the guide patterns to form a top coat film; and
    subjecting the layer including the Si-containing block copolymer and having the top coat film formed thereon to an annealing treatment to conduct a phase separation of the layer, wherein
    a solvent of the solution of the top coat material contains no basic substance.

2. The method according to claim 1, wherein the Si-containing block copolymer contains a trimethylsilyl group.

3. The method according to claim 1, wherein the Si-containing block copolymer comprises a Si-containing block selected from the group consisting of a block of a structural unit represented by general formula (a00-1) or (a00-2) shown below, a block of a structural unit of a siloxane or a derivative thereof and a block of a structural unit containing a polyhedral oligomeric silsesquioxane;

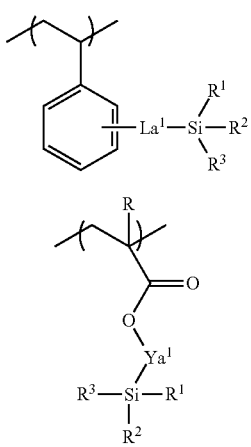

(a00-1)

(a00-2)

wherein $La^1$ represents a single bond or a divalent linking group which may have a hetero atom; $R^1$, $R^2$ and $R^3$ each independently represents a hydrogen atom or an alkyl group of 1 to 5 carbon atoms; R represents an hydrogen atom, an alkyl group of 1 to 5 carbon atoms or a halogenated alkyl group of 1 to 5 carbon atoms; and $Ya^1$ represents a single bond or a divalent linking group.

4. The method according to claim 3, wherein the structural unit represented by general formula (a00-1) or (a00-2) is any one of the structural units shown below:

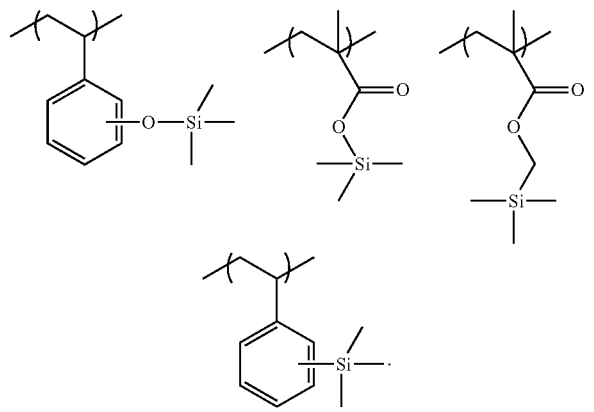

5. The method according to claim 3, wherein the Si-containing block copolymer further comprises a block of a structural unit having an aromatic group.

6. The method according to claim 5, wherein the structural unit having an aromatic group is a structural unit derived from a styrene or a derivative thereof.

7. The method according to claim 5, wherein the molar ratio of the structural unit having an aromatic group and a structural unit containing an Si atom constituting the Si-containing block is 60:40 to 90:10.

8. The method according to claim 1, further comprising forming a neutralization film on the substrate.

9. The method according to claim 8, wherein the neutralization film contains no cross-linking polymer unit.

10. The method according to claim 1, further comprising forming the guide patterns using a resist composition.

11. The method according to claim 1, wherein the guide patterns are trench-guide patterns.

12. The method according to claim 1, wherein the solvent is water or a mixed solvent of water and methanol.

13. The method according to claim 1, wherein a pH value of the solution of the top coat material is 7 or less.

14. A method of forming a pattern, comprising:
producing a structure according to the method of claim 1; and
selectively removing a phase comprising at least one block from the structure containing the phase-separated structure to form a pattern.

15. A method of forming a fine pattern, comprising:
forming a pattern according to the method of claim 14; and
subjecting a substrate to an etching treatment using the pattern as a mask.

16. The method according to claim 1, wherein forming the guide patterns on the substrate comprises:
forming a photosensitive resin film on the substrate;
selectively exposing the photosensitive resin film to form exposed portions and unexposed portions of the photosensitive resin film; and
dissolving either the exposed portions or the unexposed portions of the photosensitive resin film in a developing solution such that the undissolved portions of the photosensitive resin film form the guide patterns on the substrate.

17. The method according to claim 1, wherein forming the guide patterns on the substrate comprises:
forming a resin layer on the substrate; and
transferring a mold pattern of a mold to the resin layer on the substrate.

* * * * *